(12) United States Patent
Tanaka

(10) Patent No.: US 7,390,704 B2
(45) Date of Patent: Jun. 24, 2008

(54) LASER PROCESS APPARATUS, LASER IRRADIATION METHOD, AND METHOD FOR MANUFACTURING SEMICONDUCTOR DEVICE

(75) Inventor: Koichiro Tanaka, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 348 days.

(21) Appl. No.: 11/137,494

(22) Filed: May 26, 2005

(65) Prior Publication Data

US 2006/0023058 A1 Feb. 2, 2006

(30) Foreign Application Priority Data

Jun. 16, 2004 (JP) ............................. 2004-178596

(51) Int. Cl.
*H01L 21/84* (2006.01)
(52) U.S. Cl. ............................. 438/166; 257/E21.561
(58) Field of Classification Search ......... 438/151–166; 257/E21.561
See application file for complete search history.

(56) References Cited

U.S. PATENT DOCUMENTS

| | | | |
|---|---|---|---|
| 4,344,677 A | 8/1982 | Stuermer et al. | |
| 4,894,669 A | 1/1990 | Sugiura et al. | |
| 5,736,431 A | 4/1998 | Shinohara et al. | |
| 5,854,803 A | 12/1998 | Yamazaki et al. | |
| 5,893,990 A | 4/1999 | Tanaka | |
| 6,210,996 B1 | 4/2001 | Yamazaki et al. | |
| 6,399,008 B1 | 6/2002 | Nakazawa et al. | |
| 6,468,842 B2 | 10/2002 | Yamazaki et al. | |
| 6,706,570 B2 | 3/2004 | Yamazaki et al. | |
| 6,784,030 B2 | 8/2004 | Yamazaki et al. | |
| 6,861,364 B1 | 3/2005 | Koide | |
| 6,897,889 B2 * | 5/2005 | Tanaka ........................ 347/244 |
| 2001/0019861 A1 | 9/2001 | Yamazaki et al. | |
| 2003/0003610 A1 | 1/2003 | Yamazaki et al. | |
| 2003/0024905 A1 | 2/2003 | Tanaka | |
| 2003/0089690 A1 | 5/2003 | Yamazaki et al. | |
| 2003/0203518 A1 | 10/2003 | Yamazaki et al. | |
| 2005/0023255 A1 | 2/2005 | Yamazaki et al. | |
| 2007/0099401 A1 | 5/2007 | Tanaka | |

FOREIGN PATENT DOCUMENTS

| | | |
|---|---|---|
| CN | 1256985 | 6/2000 |
| CN | 1405861 | 3/2003 |
| JP | 08-195357 | 7/1996 |
| JP | 08-203843 | 8/1996 |

\* cited by examiner

*Primary Examiner*—Richard A. Booth
(74) *Attorney, Agent, or Firm*—Eric J. Robinson; Robinson Intellectual Property Law Office, P.C.

(57) ABSTRACT

To mass-produce semiconductor devices with high reliability in short time by suppressing the generation of vibration at the laser irradiation and moving a laser beam having homogeneous energy profile in one direction.

A substrate is sucked onto a surface of a cylindrical rotator along the curvature of the rotator, the rotator is rotated, and a semiconductor film formed over the substrate is irradiated with a laser at one time. Moreover, a moving mechanism is provided in a rotational axis direction of the rotator, and an irradiation position is displaced at each rotation of the rotator. Alternatively, the irradiation position can be moved in the rotational axis direction while rotating the rotator.

29 Claims, 30 Drawing Sheets

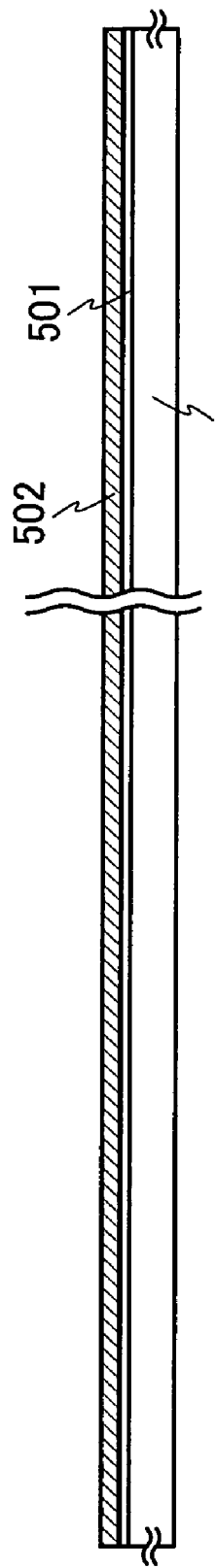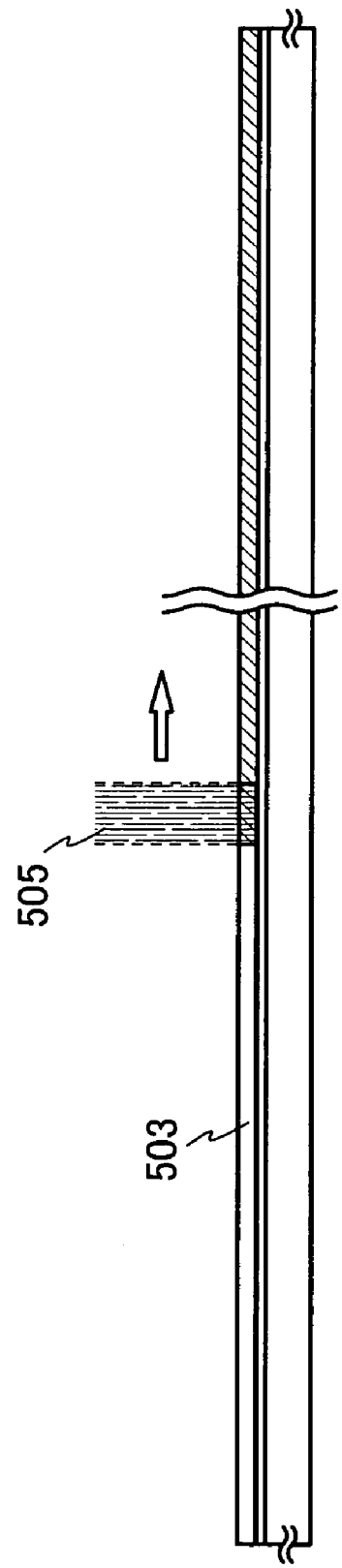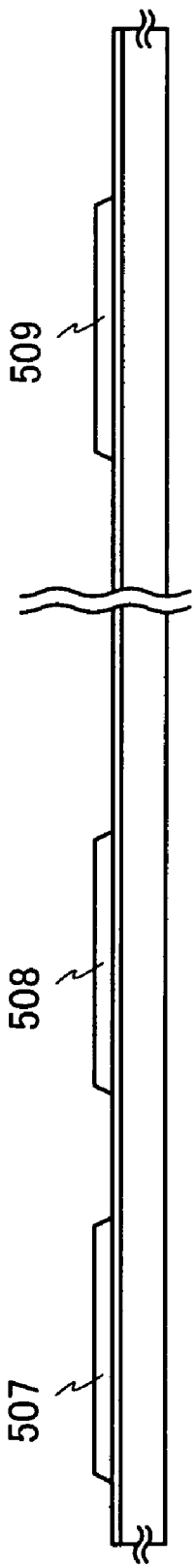

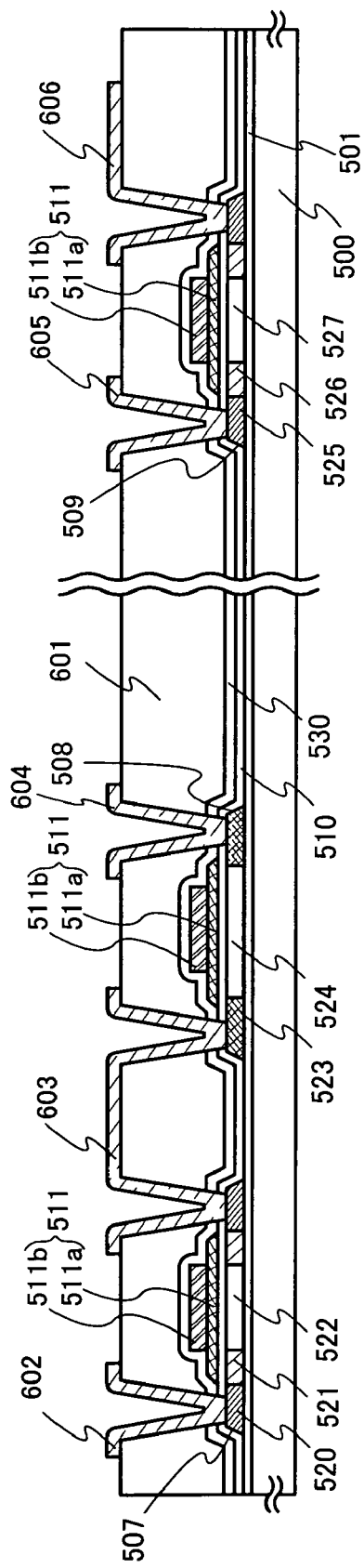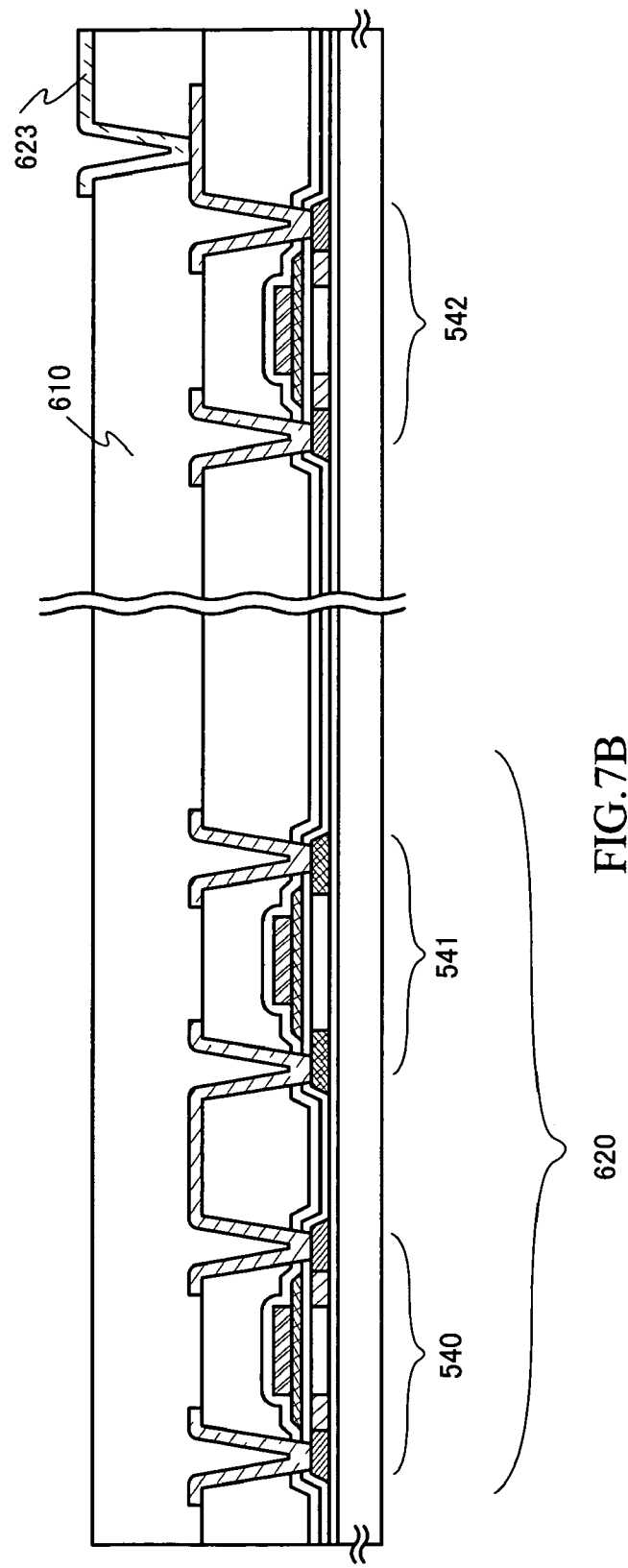
FIG.7A
FIG.7B

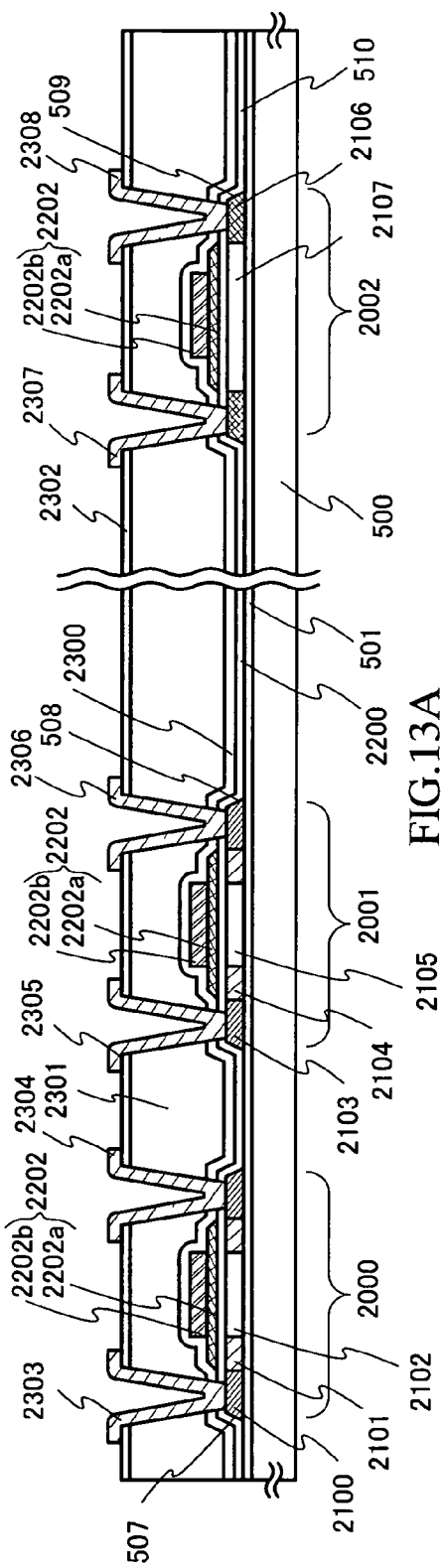
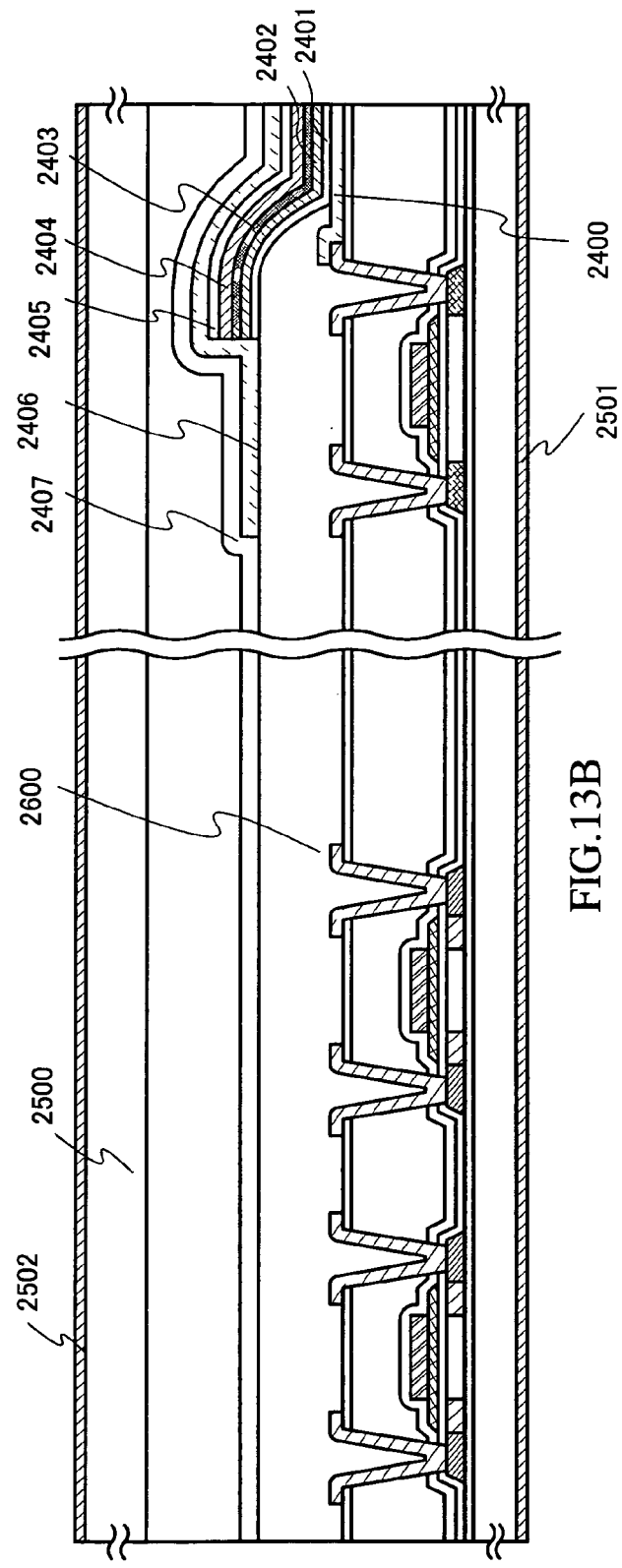
FIG.13A
FIG.13B

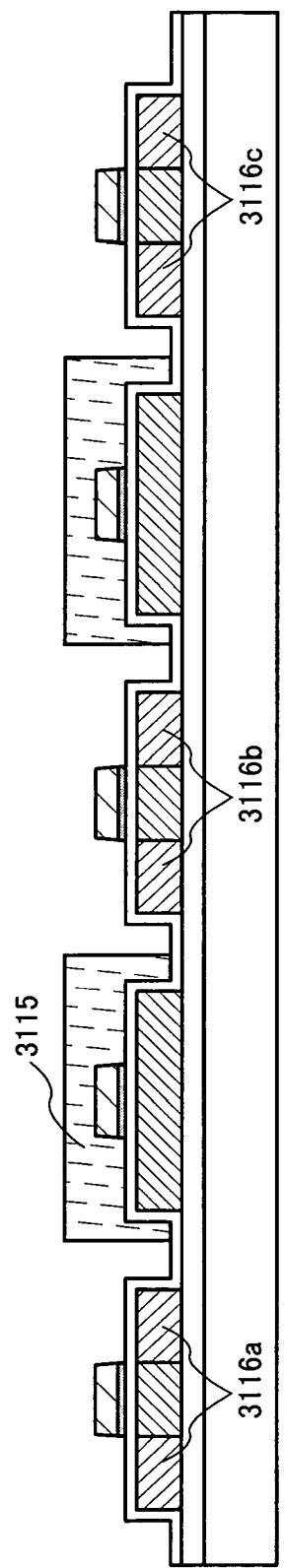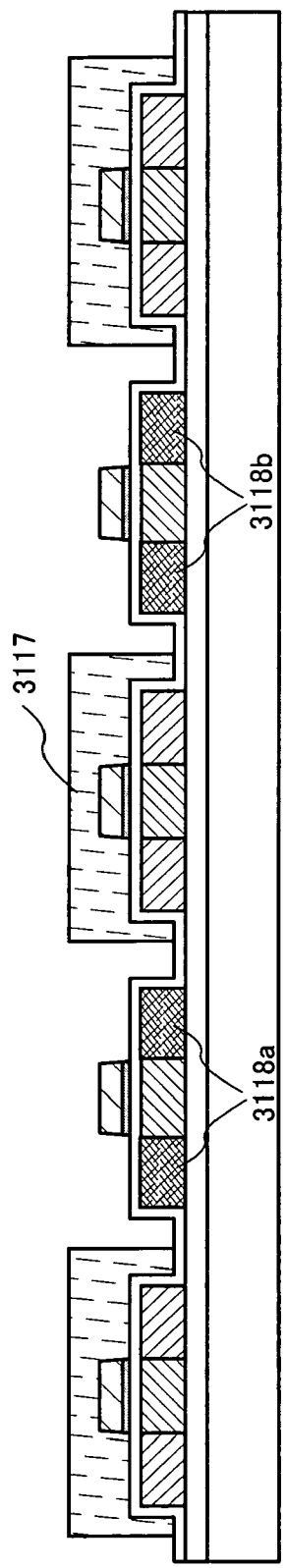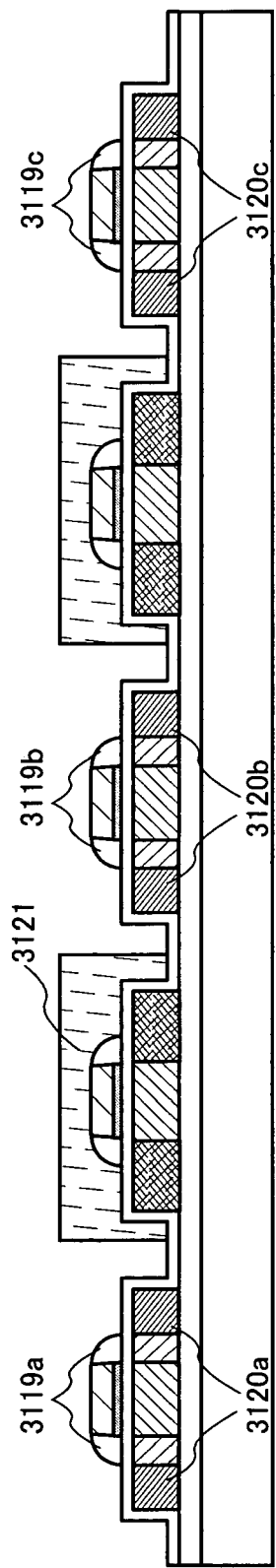

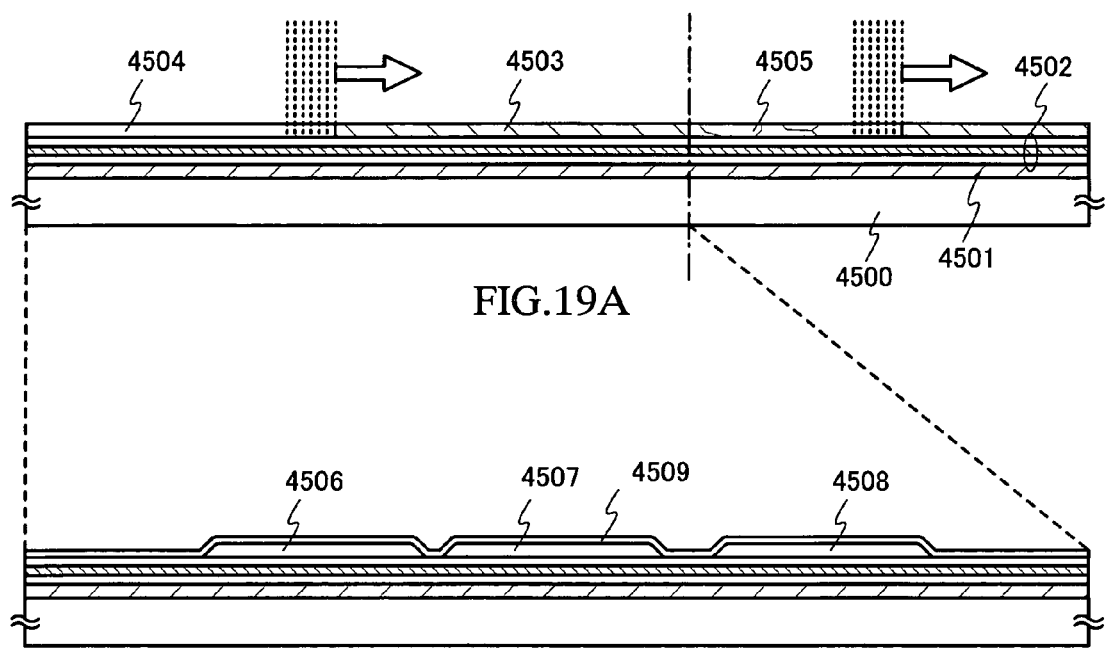
FIG.19A
FIG.19B
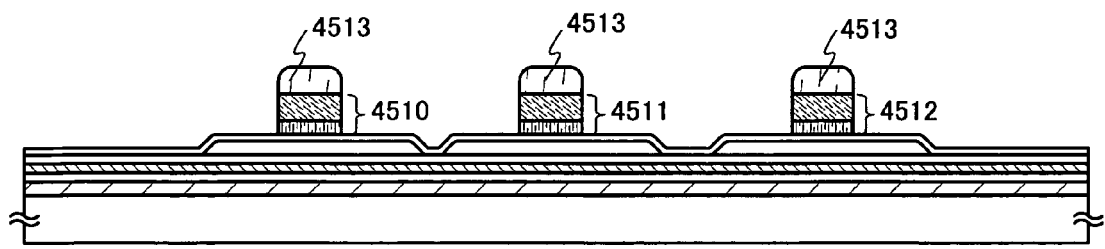
FIG.19C

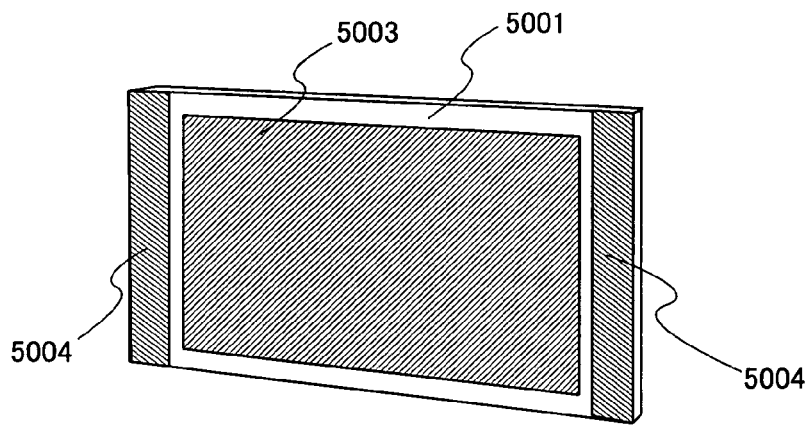
FIG.23A
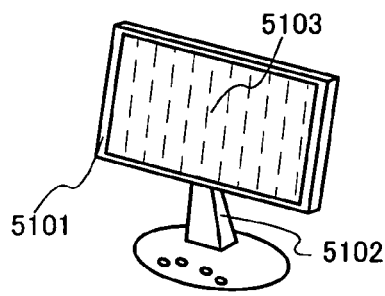
FIG.23B
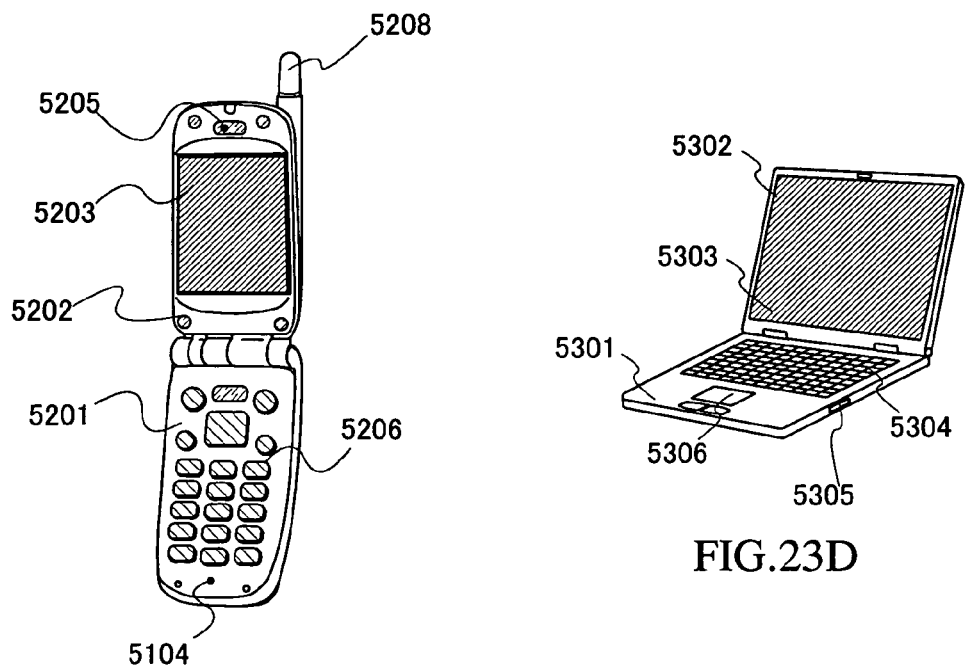
FIG.23C
FIG.23D

LASER PROCESS APPARATUS, LASER IRRADIATION METHOD, AND METHOD FOR MANUFACTURING SEMICONDUCTOR DEVICE

TECHNICAL FIELD

The present invention relates to a laser beam irradiation method and a laser process apparatus for conducting it. Further, the present invention relates to a method for manufacturing a semiconductor device by using the laser beam irradiation.

BACKGROUND ART

In recent years, a technique to manufacture a thin film transistor (Thin Film Transistor, hereinafter referred to as a "TFT") over a substrate has made great progress and application development to, for example, an active matrix display device has been advanced. In particular, a TFT formed using a crystalline semiconductor film is superior in field-effect mobility (also referred to as mobility) to a TFT formed using a conventional amorphous semiconductor film; therefore, high-speed operation is possible. For this reason, it is tried that a pixel, which has been controlled by a driver circuit provided outside a substrate, is controlled by a driver circuit formed over the same substrate as the pixel.

A substrate used in a semiconductor device is expected to be a glass substrate rather than a quartz substrate in terms of cost. The glass substrate is inferior in heat resistance and easy to be deformed due to heat. Therefore, when the TFT using the crystalline semiconductor film is formed over the glass substrate, laser annealing is employed to crystallize a semiconductor film in order to prevent the glass substrate from being deformed due to the heat.

Compared with another annealing method using radiant heat or conductive heat, the laser annealing has characteristics that the processing time can be shortened drastically and a semiconductor substrate or a semiconductor film is heated selectively and locally so that thermal damage is hardly given to the substrate.

The laser annealing method described here indicates a technique to crystallize an amorphous layer or a damaged layer formed in a semiconductor substrate or a semiconductor film, a technique to crystallize an amorphous semiconductor film formed over a substrate, and a technique to heat (anneal) a crystalline semiconductor film which is not single crystal (the above-mentioned semiconductor films which are not single crystal are collectively referred to as a non-single crystal semiconductor film) by a laser beam. Further, a technique applied to flatten or modify a surface of the semiconductor substrate or the semiconductor film is also included.

In the laser annealing, a laser beam (also referred to as a laser beam) oscillated from an excimer laser is often employed. The excimer laser has advantages of high output and capability of repetitive irradiation at high repetition rate, and moreover, a laser beam oscillated from the excimer laser has high absorption coefficient to a silicon film which is often used as a semiconductor film.

At the irradiation of a laser beam, a method in which the laser beam is shaped into linear on an irradiation surface with an optical system and an irradiation position of the laser beam is moved in a short-side direction of the linear beam relative to the irradiation surface is high in productivity and superior industrially (refer to Patent Document 1).

[Patent Document 1] Japanese Published Patent Application Laid-Open No.: Hei8-195357

DISCLOSURE OF THE INVENTION

Problems to be Solved by the Invention

By shaping a continuous wave laser (hereinafter referred to as a "CW laser") into linear and relatively moving an irradiation position of the laser in a minor-axis direction of the linear laser beam (also referred to as a linear laser), a large grain crystal, which is a crystal grain extending long in the moving direction, is formed. In the case of manufacturing a TFT in accordance with a major-axis direction of the large grain crystal, a TFT having higher mobility than a TFT manufactured with a pulsed excimer laser having low repetition rate can be manufactured. Since a circuit can be driven at high speed by using this TFT, a driver, a CPU, or the like can be manufactured.

The shape of the linear laser beam is almost rectangular, and in this specification, a direction of a short side of the rectangle is referred to as the minor-axis direction or a width direction of the linear beam. Meanwhile, a direction of a long side of the rectangle is referred to as a major-axis direction or a long-side direction of the linear beam.

As a problem of a laser process apparatus by a CW or quasi-CW laser, a counter measure against the vibration is given.

It is to be noted that the quasi-CW laser herein described means a laser which has short repetition and which has a repetition rate of 10 MHz or more, preferably 80 MHz or more, so that it can be nearly regarded as a CW laser.

The scanning speed of the laser beam of the CW laser is as high as 200 to 1000 mm/s on a semiconductor film. In particular, when a large substrate with a semiconductor film formed is moved back and forth at this speed, a process defect is concerned due to the generation of vibration.

That is to say, when a semiconductor film is irradiated with a CW laser, a glass substrate below needs to be moved before the substrate is deformed due to heat. Then, when the substrate moving at high speed stops, visible vibration is generated, which affects the substrate and the semiconductor film.

In order to avoid such problems, a method in which a laser beam is scanned without moving the substrate is considered; however, slight displacement of an optical system greatly changes the crystallinity in a method where the optical system is moved. Therefore, the process defect is concerned even in this method.

Moreover, when the laser beam is scanned back and forth, the effect of laser annealing is different in a forward route and a backward route. Therefore, in the process in which homogeneous laser annealing is particularly required, one-way irradiation is necessitated.

In other words, since the laser beam does not have a completely-symmetric energy profile, the laser beam irradiation cannot be conducted in the same state in the case of scanning the laser beam in the forward route and in the backward route. That is to say, the effect of the laser beam is different depending on the scanning direction of the laser beam. For this reason, scanning in one direction is preferable in order to anneal with a homogeneous laser.

However, when an irradiation method in which the laser beam is scanned in one direction and in one way is employed, the throughput decreases to half. This becomes a problem when the mass production is taken into consideration. The present invention is to solve such problems.

Means for Solving the Problems

The generation of vibration when the substrate is moved mainly results from the change of the speed. This is because the force of inertia operates in a direction opposite to a direction of acceleration when a certain thing having weight is moved at certain acceleration.

Therefore, when the laser beam is scanned at high speed, the change of acceleration can be suppressed and the generation of vibration can be suppressed to the minimum by rotating the substrate in one direction, instead of processing the semiconductor film two-dimensionally by moving the substrate back and forth.

According to the present invention, a substrate is fixed to a surface of a rotator having a rotational axis, for example a cylindrical rotator, along the curvature of the rotator; the rotator is rotated; and the semiconductor film formed over the substrate is irradiated with a laser at one time. Moreover, by providing a moving mechanism in a rotational axis direction of the rotator, the irradiation position is displaced at each rotation of the rotator. Alternatively, the irradiation position can be moved in the rotational axis direction while rotating the rotator. This can suppress the generation of vibration at the laser irradiation and mass-produce semiconductor devices with high reliability in short time by moving a laser beam with a homogeneous energy profile in one direction. It is to be noted that a known mechanism such as a linear motor or a ball screw linear motion device can be used as the moving mechanism. Moreover, an air-floating XY planar stage or the like can be used.

An apparatus structure of the present invention is described with reference to FIG. 1.

First, a rotator (also referred to as a rotor) 101 having a rotational axis 111, for example a cylindrical rotator, is prepared. A fixing mechanism is provided on the surface, and one or a plurality of substrates 100 are fixed to the surface of the rotator along the curvature of the rotator 101.

In this state, the rotator 101 is rotated, and a semiconductor film 102 formed over the substrate 100 is irradiated with a laser. The laser beam to be used is emitted from a laser oscillator and shaped by an optical system for forming a linear beam. This makes it possible to irradiate a surface of the semiconductor with the linear beam. In addition, a moving mechanism 104 is provided in a rotational axis direction of the rotator 101, and the relative position between the irradiation position of the linear beam and the rotational axis 111 of the rotator 101 is moved at each rotation of the rotator 101. That is to say, the irradiation position is displaced by the width of the laser beam at each rotation of the rotator 101. Alternatively, the relative position between the irradiation position of the linear beam and the rotational axis 111 of the rotator may be moved while the rotator 101 is rotated. This allows the apparatus to process the whole surface of the semiconductor film.

Thus, by moving the substrate in one direction to the laser beam, the generation of vibration can be suppressed.

The substrate 100 fixed along the curvature of the rotator 101 can be returned to a flat state easily when the substrate 100 is taken off the rotator 101 and set to a flat place.

The present invention relates to a laser process apparatus comprising a laser oscillator, an optical system for forming a linear beam, a rotator having a rotational axis, a fixing mechanism for fixing a substrate to a curved surface of the rotator, and a moving mechanism for moving the rotator in a rotational axis direction, wherein a laser beam is emitted from the laser oscillator, the emitted laser beam passes through the optical system, the laser beam having passed through the optical system is irradiated to the substrate fixed to the rotator while rotating the rotator, and an irradiation position of the laser beam having passed through the optical system is moved by moving the rotator in the rotational axis direction of the rotator by the moving mechanism.

The present invention relates to a laser process apparatus comprising a laser oscillator, an optical system for forming a linear beam, a rotator having a rotational axis, a fixing mechanism for fixing a substrate to a curved surface of the rotator, and a moving mechanism for moving the linear beam in a rotational axis direction of the rotator, wherein a laser beam is emitted from the laser oscillator, the emitted laser beam passes through the optical system, the laser beam having passed through the optical system is irradiated to the substrate fixed to the rotator while rotating the rotator, and the laser beam having passed through the optical system is moved in the rotational axis direction of the rotator by the moving mechanism.

The present invention relates to a laser process apparatus comprising a laser oscillator, a cylindrical lens, a rotator having a rotational axis, a fixing mechanism for fixing a substrate to a curved surface of the rotator, and a moving mechanism for moving the rotator in a rotational axis direction, wherein a laser beam is emitted from the laser oscillator, the emitted laser beam passes through the cylindrical lens, the laser beam having passed through the cylindrical lens is irradiated to the substrate fixed to the rotator while rotating the rotator, and an irradiation position of the laser beam having passed through the cylindrical lens is moved by moving the rotator in the rotational axis direction of the rotator by the moving mechanism.

The present invention relates to a laser process apparatus comprising a laser oscillator, a cylindrical lens, a rotator having a rotational axis, a fixing mechanism for fixing a substrate to a curved surface of the rotator, and a moving mechanism for moving a laser beam in a rotational axis direction of the rotator, wherein the laser beam is emitted from the laser oscillator, the emitted laser beam passes through the cylindrical lens, the laser beam having passed through the cylindrical lens is irradiated to the substrate fixed to the rotator while rotating the rotator, and the laser beam having passed through the cylindrical lens is moved in the rotational axis direction of the rotator by the moving mechanism.

The present invention relates to a laser process apparatus comprising a laser oscillator, a first cylindrical lens, a second cylindrical lens, a rotator having a rotational axis, a fixing mechanism for fixing a substrate to a curved surface of the rotator, and a moving mechanism for moving the rotator in a rotational axis direction, wherein a laser beam is emitted from the laser oscillator, the emitted laser beam is shaped into a linear laser beam by the first cylindrical lens and the second cylindrical lens, the substrate fixed to the rotator is irradiated with the linear laser beam while rotating the rotator, an irradiation position of the linear laser beam is moved by moving the rotator in the rotational axis direction of the rotator by the moving mechanism, and the emitted laser beam is shaped into linear on a surface of the substrate in such a way that the first cylindrical lens acts on a major-axis direction of the linear laser beam and the second cylindrical lens acts on a minor-axis direction of the linear laser beam.

The present invention relates to a laser process apparatus comprising a laser oscillator, a first cylindrical lens, a second cylindrical lens, a rotator having a rotational axis, a fixing mechanism for fixing a substrate to a curved surface of the rotator, and a moving mechanism for moving a linear laser beam in a rotational axis direction of the rotator, wherein a laser beam is emitted from the laser oscillator, the emitted laser beam is shaped into the linear laser beam by the first cylindrical lens and the second cylindrical lens, the substrate fixed to the rotator is irradiated with the linear laser beam while rotating the rotator, the linear laser beam is moved in the rotational axis direction of the rotator by the moving mechanism, and the emitted laser beam is shaped into linear on a surface of the substrate in such a way that the first cylindrical lens acts on a major-axis direction of the linear laser beam and the second cylindrical lens acts on a minor-axis direction of the linear laser beam.

The present invention relates to a laser process apparatus comprising a plurality of laser oscillators, a plurality of optical systems, a rotator having a rotational axis, a fixing mechanism for fixing a substrate to a curved surface of the rotator, and a moving mechanism for moving the rotator in a rotational axis direction, wherein each of the plurality of optical systems includes a first cylindrical lens and a second cylindrical lens, a laser beam is emitted from each of the plurality of laser oscillators, the emitted laser beam is shaped into a linear laser beam by the first cylindrical lens and the second cylindrical lens, the substrate fixed to the rotator is irradiated with the plurality of linear laser beams formed by the plurality of optical systems while rotating the rotator, the rotator is moved in the rotational axis direction of the rotator by the moving mechanism while being irradiated with the linear laser beam, and the emitted laser beam is shaped into linear on a surface of the substrate in such a way that the first cylindrical lens acts on a major-axis direction of the linear laser beam and the second cylindrical lens acts on a minor-axis direction of the linear laser beam.

The present invention relates to a laser process apparatus comprising a plurality of laser oscillators, a plurality of optical systems, a rotator having a rotational axis, a fixing mechanism for fixing a substrate to a curved surface of the rotator, and a moving mechanism for moving a linear laser beam in a rotational axis direction of the rotator, wherein each of the plurality of optical systems includes a first cylindrical lens and a second cylindrical lens, a laser beam is emitted from each of the plurality of laser oscillators, the emitted laser beam is shaped into the linear laser beam by the first cylindrical lens and the second cylindrical lens, the substrate fixed to the rotator is irradiated with the plurality of linear laser beams formed by the plurality of optical systems while rotating the rotator, the linear laser beam is moved in the rotational axis direction of the rotator by the moving mechanism while irradiating rotator, and the emitted laser beam is shaped into linear on a surface of the substrate in such a way that the first cylindrical lens acts on a major-axis direction of the linear laser beam and the second cylindrical lens acts on a minor-axis direction of the linear laser beam.

The present invention relates to a laser irradiation method comprising fixing a substrate onto a curved surface of a rotator having a rotational axis, irradiating a surface of the substrate with a linear laser beam while rotating the rotator with the substrate fixed thereto, and moving a relative position between the rotational axis of the rotator and an irradiation position of the linear laser beam at each rotation of the rotator.

The present invention relates to a laser irradiation method comprising fixing a substrate onto a curved surface of a rotator having a rotational axis, irradiating a surface of the substrate with a linear laser beam while rotating the rotator with the substrate fixed thereto, and moving a relative position between the rotational axis of the rotator and an irradiation position of the linear laser beam while the rotator is rotated.

The present invention relates to a method for manufacturing a semiconductor device comprising forming a semiconductor film over a substrate, fixing the substrate with the semiconductor film formed thereover to a curved surface of a rotator having a rotational axis, and irradiating the semiconductor film with a linear laser beam while rotating the rotator with the substrate fixed thereto.

The present invention relates to a method for manufacturing a semiconductor device comprising forming an amorphous semiconductor film over a substrate, fixing the substrate with the amorphous semiconductor film formed thereover to a curved surface of a rotator having a rotational axis, and irradiating with a linear laser beam while rotating the rotator with the substrate fixed thereto so as to crystallize the amorphous semiconductor film, thereby forming a crystalline semiconductor film.

In the present invention, the crystalline semiconductor film is patterned to form an island-shaped semiconductor film, an impurity imparting one conductivity is introduced into the island-shaped semiconductor film, the substrate is fixed to the rotator after introducing the impurity, and the impurity is activated by being irradiated with a linear laser beam while rotating the rotator with the substrate fixed thereto.

In the present invention, a plurality of the substrates are fixed to the curved surface of the rotator.

In the present invention, the rotating speed of the rotator is 10 to 50°/s.

In the present invention, a continuous wave laser or a pulsed laser with a repetition rate of 10 MHz or more is shaped into the linear laser beam.

In the present invention, a continuous wave laser or a pulsed laser with a repetition rate of 80 MHz or more is shaped into the linear laser beam.

In the present invention, the continuous wave laser is any one of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser a Ti:sapphire laser, and a helium-cadmium laser.

In the present invention, the pulsed laser is any one of an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, and a gold vapor laser.

In the present invention, the substrate is a glass substrate or a substrate made of synthetic resin.

In the present invention, a quartz substrate or a stainless substrate may be used as the substrate.

It is to be noted that the semiconductor device herein described indicates general devices which can function by using semiconductor characteristics, and electro-optic devices, electric devices, semiconductor circuits, and electronic appliances are all semiconductor devices.

The optical system includes a beam expander, a beam homogenizer, a cylindrical lens, and the like. However, since some laser oscillators include a lens, the laser oscillator is included in the optical system in such a case.

EFFECT OF THE INVENTION

According to the present invention, the acceleration of the scanning speed of the substrate at the laser irradiation is kept almost constant, and the generation of vibration can be suppressed to the minimum.

Moreover, since the substrate is scanned in one direction at the laser irradiation, a semiconductor film can be irradiated with a homogeneous laser beam, thereby homogenizing the effect of the laser annealing.

Moreover, according to the present invention, a large substrate can be annealed by a laser at one time, and many substrates can be processed at one time.

Therefore, the present invention can provide a laser process apparatus which can decrease the generation of vibration and which can process many substrates at one time. This makes it possible to mass-produce semiconductor devices with high reliability in short time.

BEST MODE FOR CARRYING OUT THE INVENTION

Embodiment Mode 1

A specific apparatus structure of the present invention is described with reference to FIG. 1. It is to be noted that the same things as what has already been described in "Means for Solving the Problems" are shown with the same reference numerals. However, since the present invention can be carried out with many different modes, it is to be understood by those skilled in the art that the mode and the detail can be changed variously without departing from the spirit and the scope of the present invention. Therefore, the present invention is not construed as being limited to the description of the present embodiment mode.

Since the thickness of the substrate 100, for example a large glass substrate, used in this embodiment mode is as thin as 1 mm or less, the curvature can be given comparatively easily. For example, a curvature of a radius of curvature of 1 m can be easily given to a glass substrate having a size of 600×720 mm and a thickness of 0.7 mm.

Consequently, a rotator (also referred to as a rotor or a drum) 101 having a radius of 1 m, for example a cylindrical rotator, is prepared in this embodiment mode, a fixing mechanism is provided on the surface, and a plurality of large glass substrates 100 are fixed to the surface of the rotator. Since the rotator has a circumference of approximately 6 m, eight of the large substrates can be fixed at the same time.

Here, the fixing mechanism is to suck and paste the substrate to the surface of the rotator by forming a plurality of holes 121 at the surface of the rotator 101 and reducing the pressure inside the rotator 101 with the use of an evacuating apparatus 122 connected to the rotator 101 (refer to FIG. 26(A)). By appropriately adjusting the air pressure inside the rotator 101, homogeneous laser irradiation can be conducted without the substrates falling from the surface of the rotator.

For example, when the rotator 101 is rotated at a speed of approximately 10 to 50°/s in this state, the scanning speed of the substrates which is equal to 200 to 1000 mm/s can be obtained. Then, a semiconductor film formed over the large glass substrate 100 can be irradiated with a laser at one time. Since the same position is irradiated with the laser again at each rotation of the drum, the moving mechanism 104, for example a uniaxial stage for moving the rotator 101 in one direction, is provided in a rotational axis direction of the rotator, and the irradiation position is displaced by the width of the laser beam at each rotation of the drum by the moving mechanism 104. Thus, the whole surface of the semiconductor film 102 can be processed with this apparatus.

At each rotation of the drum, the rotator may be moved continuously along the rotational axis 111 by the moving mechanism 104. In this case, a track 131 of the laser irradiation is oblique to a direction 132 where the rotator is rotated (refer to FIG. 26(B)).

According to this embodiment mode, semiconductor films over many large substrates can be irradiated with the laser at one time. By using such semiconductor films, semiconductor devices with high reliability can be mass-produced in short time.

Embodiment Mode 2

An embodiment mode of the present invention is described with reference to FIG. 2 and FIG. 25. However, since the present invention can be carried out with many different modes, it is to be understood by those skilled in the art that the mode and the detail can be changed variously without departing from the spirit and the scope of the present invention. Therefore, the present invention is not construed as being limited to the description of this embodiment mode.

In this embodiment, a laser process apparatus shown in FIG. 2 has a laser oscillator 201, a beam expander 202, a beam homogenizer 203, and an optical system including cylindrical lenses 204 and 205.

In FIG. 2, a laser beam emitted from the CW laser oscillator 201 having an output of 10 W and a wavelength of 532 nm enters the beam expander 202 so that the beam diameter is expanded, and then enters the beam homogenizer 203. The beam homogenizer 203 has a role for homogenizing the intensity distribution of the linear beam 103 in the major-axis direction on the irradiation surface.

The laser beam emitted from the beam homogenizer 203 enters the two cylindrical lenses 204 and 205. The cylindrical lens 204 acts on only the major-axis direction of the laser beam, and the cylindrical lens 205 acts on only the minor-axis direction. With the cylindrical lenses 204 and 205, the beam can be shaped into linear on the semiconductor film 102 formed over the glass substrate 100.

The size of the linear beam 103 at this time is approximately 300 μm in the major axis and approximately 10 μm in the minor axis.

As the glass substrate, a glass substrate having, for example, a size of 600×720 mm and a thickness of 0.7 mm is used. To such a glass substrate having a thickness of 1 mm or less, a curvature of a radius of curvature of 1 m can be given.

At this time, in order to prevent the effect of reflection light from a rear surface of the glass substrate, an incidence angle θ of the laser beam to the semiconductor film 102 is set so as to satisfy the formula 1. At this time, the incidence angle θ is a tilted angle from a perpendicular direction to the semiconductor film 102, the length of the linear beam 103 in the minor-axis direction is L, and the thickness of the glass substrate 100 over which the semiconductor film 102 is formed is d (refer to FIG. 25).

$$\theta > \tan^{-1}(L/2d)$$ [formula 1]

By setting the incidence angle θ so as to satisfy the formula 1, a portion where the linear beam interferes is not on the semiconductor film but in the substrate. When the interference portion comes on the semiconductor film, an interference fringe due to the laser beam is recorded in the semiconductor film; therefore, a good semiconductor film cannot be obtained.

The semiconductor film 102 formed over the glass substrate 100 is fixed to the cylindrical rotator 101 having a radius of 1 m, and eight glass substrates can be attached to the rotator 101 in the same way. When the rotator 101 is rotated at a speed of approximately 10 to 50°/s, only the semiconductor film 102 can be processed by the laser irradiation without melting the glass substrate.

By irradiating the semiconductor film formed over the glass substrate with the laser at one time, the semiconductor films formed over the eight large substrates can be irradiated with the laser at one time without changing the acceleration. Since the same position is irradiated with the laser again at each rotation of the drum, the moving mechanism, for example a uniaxial stage for moving the rotator 101 in one direction, is provided in the rotational axis direction of the rotator 101, that is, in a direction indicated by an arrow shown with a dotted line in FIG. 2. Then, the irradiation position is displaced by the width of the laser beam at each rotation of the drum. Thus, the whole surface of the semiconductor film can be processed with this apparatus. At this time, instead of the rotator, the laser beam may be moved in one direction.

Further, the rotator may be moved in the rotational axis direction by the moving mechanism 104 while irradiating the semiconductor film with the laser and rotating the drum. In this case, the track of the laser irradiation is oblique to the axis perpendicular to the rotational axis direction of the rotator.

In this embodiment mode, an amorphous silicon film is used as the semiconductor film 102. By irradiating this with the linear beam 103, a crystalline silicon film having a large grain crystal is formed.

By using the laser process apparatus and the laser irradiation method shown in this embodiment mode, a crystalline silicon film having a large grain crystal extending long in the laser scanning direction can be effectively manufactured and the process time can be shortened. When an active layer of a TFT is manufactured in accordance with the direction where the large grain crystal extends long, a TFT having high mobility can be manufactured.

Embodiment Mode 3

This embodiment mode is described with reference to FIG. 3 and FIG. 4. In this embodiment mode, laser irradiation is conducted by a plurality of laser beams. This can process more substrates at one time, which increases the productivity.

In FIG. 3 and FIG. 4, the same things as those in Embodiment Modes 1 and 2 are shown with the same reference numerals.

However, since the present invention can be carried out with many different modes, it is to be understood by those skilled in the art that the mode and the detail can be changed variously without departing from the spirit and the scope of the present invention. Therefore, the present invention is not construed as being limited to the description of this embodiment mode.

In this embodiment mode, a laser process apparatus shown in FIG. 4 has a laser oscillator 201a, a beam expander 202a, a beam homogenizer 203a, an optical system A (210a) including cylindrical lenses 204a and 205a, a laser oscillator 201b, a beam expander 202b, a beam homogenizer 203b, and an optical system B (210b) including cylindrical lenses 204b and 205b.

The laser oscillators 201a and 201b, the beam expanders 202a and 202b, the beam homogenizers 203a and 203b, the cylindrical lenses 204a and 204b, and the cylindrical lenses 205a and 205b have the same functions as the laser oscillator 201, the beam expander 202, the beam homogenizer 203, the cylindrical lens 204, and the cylindrical lens 205 shown in FIG. 2 described in Embodiment Mode 2, respectively.

First, as shown in FIG. 3, the substrate 100 is irradiated while displacing each position of the linear beams 103a and 103b.

At this time, when a shape of the linear beam is assumed to be a rectangle, one short side of the linear beam 103a on the irradiation surface is preferably an extension of the other short side of the linear beam 103b on the irradiation surface. In other words, in FIG. 3, a short side of the linear beam 103a at a left side on the irradiation surface and a short side of the linear beam 103a at a right side on the irradiation surface preferably extend along a dashed line 110. When the linear beams 103a and 103b are arranged in such a state and the rotator is rotated, it is equal to the irradiation in which the linear beams 103a and 103b are adjacent. Therefore, the process can be conducted effectively because the linear beams 103a and 103b can be easily aligned and the surface of the substrate can be irradiated with a laser without any space between.

To form such a plurality of linear beams, a laser process apparatus shown in FIG. 4 that has the optical system A (201a) and the optical system B (201b) may be used.

Although this embodiment mode has shown the example of using two linear beams, more than two linear beams can be irradiated to the substrate at the same time by increasing the optical systems.

Thus, it is to be understood that many large substrates can be processed rapidly and the mass productivity can be increased.

Embodiment 1

A method for manufacturing a semiconductor device according to the present invention is described with reference to FIGS. 5(A) to 5(C) and FIGS. 6(A) to 6(B).

First, as shown in FIG. 5(A), a base film 501 is formed over a substrate 500. As the substrate 500, for example, a glass substrate made of barium borosilicate glass, aluminoborosilicate glass, or the like, a quartz substrate, a stainless substrate, or the like can be used. Moreover, a substrate made of synthetic resin having flexibility such as acrylic or plastic typified by PET, PES, or PEN can also be used.

The base film 501 is provided in order to prevent alkali-earth metal or alkali metal such as Na included in the substrate 500 from diffusing into the semiconductor film to adversely affect characteristics of a semiconductor element. Therefore, an insulating film such as silicon oxide (SiO), silicon nitride (SiN), or silicon oxide containing nitrogen (SiON) which can suppress the diffusion of alkali metal or alkali-earth metal into the semiconductor film is used. In this embodiment, a silicon oxide film containing nitrogen is formed in 10 to 400 nm thick (preferably 50 to 300 nm thick) by a plasma CVD method.

It is to be noted that the base film 501 may be a single layer or a plurality of insulating films which has been stacked. In the case of using the substrate containing even a small amount of alkali metal or alkali-earth metal, such as the glass substrate, the stainless substrate, or the plastic substrate, it is effective to provide the base film in point of preventing the diffusion of the impurity. However, when the diffusion of the impurity does not lead to a significant problem, for example when the quartz substrate is used, the base film is not necessarily provided.

Next, a semiconductor film 502 is formed over the base film 501. The film thickness of the semiconductor film 502 is set to 25 nm to 100 nm (preferably 30 nm to 60 nm). The semiconductor film 502 may be either an amorphous semiconductor or a poly-crystal semiconductor. As the semiconductor, not only silicon but also silicon germanium may be used. In the case of using the silicon germanium, the concentration of germanium is preferably approximately 0.01 to 4.5 atomic %.

Next, as shown in FIG. 5(B), the semiconductor film 502 is crystallized by being irradiated with a laser beam 505 with the use of a laser process apparatus of the present invention.

In the case of conducting the laser crystallization, heat treatment at 500° C. for one hour may be added to the semiconductor film 502 before the laser crystallization in order to increase the resistance of the semiconductor film 502 against the laser.

In the laser crystallization, a continuous wave laser or a pulsed laser having a repetition rate of 10 MHz or more, preferably 80 MHz or more, can be used.

Specifically, as the continuous wave laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, or the like is given.

As long as the pulse oscillation at a repetition rate of 10 MHz or more, preferably 80 MHz or more, if possible, a pulsed laser such as an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, or a gold vapor laser can be used.

For example, in the case of using a solid-state laser capable of continuous wave oscillation, a crystal with a large grain size can be obtained by irradiating with a laser beam of second to fourth harmonics. Typically, it is desirable to use the second harmonic (532 nm) or the third harmonic (355 nm) of a YAG laser (the fundamental wave 1064 nm). For example, a laser beam emitted from a continuous wave YAG laser is converted into a harmonic by a non-linear optical element and irradiated to the semiconductor film 502. The power density may be approximately in the range of 0.01 to 100 $MW/cm^2$ (preferably 0.1 to 10 $MW/cm^2$).

It is to be noted that the irradiation with the laser beam may be conducted in an atmosphere of inert gas such as noble gas or nitrogen. This can suppress the roughness of the surface of the semiconductor caused by the laser beam irradiation and suppress the variation in the threshold voltage due to the variation in the interface state density.

By irradiating the semiconductor film 502 with the laser beam 505 as thus described, a crystalline semiconductor film 503 in which the crystallinity has been enhanced further is formed.

Before the crystallization by the laser beam 505, a crystallization step using a catalyst element may be provided. Nickel (Ni) is used as the catalyst element; however, another element such as germanium (Ge), iron (Fe), palladium (Pd), tin (Sn), lead (Pb), cobalt (Co), platinum (Pt), copper (Cu), or gold (Au) can be used.

It is to be noted that after the catalyst element is added, the heat treatment is performed for the crystallization, and then the irradiation with the laser beam is conducted in order to enhance the crystallinity further. Alternatively, the step of the heat treatment may be omitted. Specifically, after adding the catalyst element, the irradiation with the laser beam may be conducted instead of the heat treatment so as to enhance the crystallinity.

The catalyst element may be introduced into the whole surface of the semiconductor film or into a part of the semiconductor film, and then the crystal growth may be carried out.

Next, the crystalline semiconductor film 503 is patterned as shown in FIG. 5 (C) to form island-shaped semiconductor films 507 to 509. These island-shaped semiconductor films 507 to 509 serve as active layers of TFTs formed in later steps.

Next, an impurity is introduced into the island-shaped semiconductor films in order to control the threshold. In this embodiment, boron (B) is introduced into the island-shaped semiconductor films by doping diborane ($B_2H_6$).

Next, as shown in FIG. 6(A), a gate insulating film 510 is formed so as to cover the island-shaped semiconductor films 507 to 509. As the gate insulating film 510, for example, silicon oxide (SiO), silicon nitride (SiN), silicon oxide containing nitrogen (SiON), or the like can be used. As the film-forming method, a plasma CVD method, a sputtering method, or the like can be used.

Next, a gate electrode 511 is formed by patterning the conductive film after forming a conductive film over the gate insulating film 510.

The gate electrode 511 is formed with a single layer of a conductive film or with a structure in which two or more conductive films are stacked. In the case of stacking the two or more conductive films, the gate electrode 511 may be formed by stacking an element selected from tantalum (Ta), tungsten (W), titanium (Ti), molybdenum (Mo), and aluminum (Al), or an alloy material or a compound material which contains the above element as its main component. Alternatively, the gate electrode 511 may be formed by using a semiconductor film typified by a poly-crystalline silicon film doped with an impurity element such as phosphorus (P).

In this embodiment, the gate electrode 511 is formed by using a multilayer film in which a first gate electrode layer 511a including tantalum nitride (TaN) of 30 nm thick and a second gate electrode layer 511b including tungsten (W) of 370 nm thick are stacked.

The gate electrode 511 may be formed as a part of a gate wiring. Alternatively, a gate wiring may be separately formed and the gate electrode 511 may be connected to the gate wiring.

Then, the island-shaped semiconductor films 507 to 509 are doped with an impurity having one conductivity (n-type or p-type conductivity) using the gate electrode 511 or a patterned resist as a mask, thereby forming a source region, a drain region, a low-concentration impurity region, and the like.

In the case of manufacturing n-channel TFTs in this embodiment, phosphorus (P) is introduced into the island-shaped semiconductor films using phosphine ($PH_3$) at an applied voltage of 40 to 80 keV, for example 50 keV, and with a dose amount of $1.0 \times 10^{15}$ to $2.5 \times 10^{16}$ $cm^{-2}$, for example $3.0 \times 10^{15}$ $cm^{-2}$. According to this step, source regions or drain regions 520 and 525 of the n-channel TFTs are formed. Moreover, to form low-concentration impurity regions 521 and 526, phosphorus (P) is introduced into the island-shaped semiconductor films at an acceleration voltage of 60 to 120 keV and with a dose amount of $1 \times 10^{13}$ to $1 \times 10^{15}$ $cm^{-2}$. At this introduction of the impurity, channel-forming regions 522 and 527 are formed.

In the case of manufacturing a p-channel TFT, boron (B) is introduced into the island-shaped semiconductor films under a condition where diborane ($B_2H_6$) is provided at an applied voltage of 60 to 100 keV, for example 80 keV, and with a dose amount of $1 \times 10^{13}$ to $5 \times 10^{15}$ $cm^{-2}$, for example $3 \times 10^{15}$ $cm^{-2}$. With this step, a source region or a drain region 523 of the p-channel TFT, and a channel-forming region 524 are formed at this introduction of the impurity.

In this embodiment, phosphorus (P) is included in each of the source regions or drain regions 520 and 525 of the n-channel TFTs at a concentration of $1 \times 10^{19}$ to $5 \times 10^{21}$ $cm^{-3}$. Moreover, phosphorus (P) is included in each of the low-concentration impurity regions 521 and 526 of the n-channel TFTs at a concentration of $1 \times 10^{18}$ to $5 \times 10^{19}$ $cm^{-3}$. Further, boron (B) is included in the source or drain region 523 of the p-channel TFT at a concentration of $1 \times 10^{19}$ to $5 \times 10^{21}$ $cm^{-3}$.

Next, as shown in FIG. 6(B), a first interlayer insulating film 530 is formed covering the island-shaped semiconductor films 507 to 509, the gate insulating film 510, and the gate electrode 511.

As the first interlayer insulating film 530, an insulating film containing silicon, for example a silicon oxide film (SiO), a silicon nitride film (SiN), a silicon oxide film containing nitrogen (SiON), or a multilayer film of these by a plasma CVD method or a sputtering method. Of course, the first interlayer insulating film 530 is not limited to a silicon oxide film containing nitrogen, a silicon nitride film, or a multilayer film of these, and another insulating film containing silicon may be formed in a single layer or multilayer structure.

In this embodiment, after introducing the impurity, a silicon oxide film containing nitrogen (SiON film) is formed in 50 nm thick by a plasma CVD method, and then the impurity is activated by the laser irradiation method shown in Embodiment Modes 1 to 3 or another laser irradiation method. Alternatively, after forming the silicon oxide film containing nitrogen, heat treatment may be conducted at 550° C. for four hours in a nitrogen atmosphere to activate the impurity.

Next, a silicon nitride film (SiN film) is formed in 50 nm thick, and then a silicon oxide film containing nitrogen (SiON film) is formed in 600 nm thick by a plasma CVD method. The multilayer film of the silicon oxide film containing nitrogen, the silicon nitride film, and the silicon oxide film containing nitrogen corresponds to the first interlayer insulating film 530.

Subsequently, hydrogenation is conducted by heating the whole at 410° C. for one hour to release hydrogen from the silicon nitride film.

Next, a second interlayer insulating film 531 serving as a flattening film is formed covering the first interlayer insulating film 530.

The second interlayer insulating film 531 can be formed with a photosensitive or non-photosensitive organic material (polyimide, acrylic, polyamide, polyimide-amide, resist, or benzocyclobutene), siloxane resin, or a multilayer structure of those. As the organic material, positive photosensitive organic resin or negative photosensitive organic resin can be used.

It is to be noted that siloxane resin corresponds to resin including a Si—O—Si bond. A skeletal structure of siloxane is constituted by a bond of silicon (Si) and oxygen (O). As the substituent, an organic group containing at least hydrogen (for example, an alkyl group or aromatic hydrocarbon) is used. As the substituent, a fluoro group may also be used. Further, an organic group containing at least hydrogen and a fluoro group may be used as the substituent.

In this embodiment, siloxane is formed as the second interlayer insulating film 531 by a spin coating method.

A third interlayer insulating film 532 is formed over the second interlayer insulating film 531. As the third interlayer insulating film 532, a film which is more difficult to transmit moisture, oxygen, and the like than another insulating film is used. Typically, a silicon nitride film, a silicon oxide film, a silicon nitride film containing oxygen (a SiNO film (composition ratio N>O) or a SiON film (composition ratio N<O)), a thin film mainly containing carbon (for example a DLC film or a CN film), or the like obtained by a sputtering method or a CVD method can be used. When the intrusion of moisture or oxygen does not lead to a problem, the third interlayer insulating film 532 is not necessarily formed.

The first interlayer insulating film 530, the second interlayer insulating film 531, and the third interlayer insulating film 532 are etched to form contact holes that reach the island-shaped semiconductor films 507 to 509 in the first interlayer insulating film 530, the second interlayer insulating film 531, and the third interlayer insulating film 532.

A first conductive film is formed over the third interlayer insulating film 532 through the contact holes, and the first conductive film is patterned to form electrodes or wirings 533.

In this embodiment, a metal film is used as the first conductive film. As the metal film, a film containing aluminum (Al), titanium (Ti), molybdenum (Mo), tungsten (W), or silicon (Si), or an alloy film using these elements may be used. In this embodiment, a titanium film (Ti), a titanium nitride film (TiN), a silicon-aluminum alloy film (Al—Si), and a titanium film (Ti) are formed in thickness of 60 nm, 40 nm, 300 nm, and 100 nm respectively, and patterned and etched into desired shapes to form the electrodes or wirings 533.

These electrodes or wirings 533 may be formed with an aluminum alloy film containing carbon and at least one element of nickel, cobalt, and iron. Such an aluminum alloy film can prevent the interactive diffusion of silicon and aluminum even when the aluminum alloy film contacts silicon. Further, since an oxidation-reduction reaction does not occur even when such an aluminum alloy film contacts a transparent conductive film such as an ITO (Indium Tin Oxide) film, both can be directly contacted. Moreover, such an aluminum alloy film has low specific resistance and high heat resistance, thereby being effective for a wiring material.

The electrodes or wirings 533 may be formed by integrating an electrode and a wiring. Alternatively, the electrodes and the wirings which are formed separately may be connected.

According to a series of the steps, a semiconductor device including the n-channel TFTs 540 and 542 and the p-channel TFT 541 can be formed (FIG. 6(B)). The method for manufacturing a semiconductor device according to the present invention is not limited to the above-mentioned manufacturing steps after forming the island-shaped semiconductor films. By using the island-shaped semiconductor films crystallized by the laser irradiation method of the present invention as an active layer of the TFT, the variation in the mobility, the threshold voltage, and the on-current between elements can be suppressed.

Although this embodiment has shown the example of using a laser irradiation method of the present invention to crystallize the semiconductor film, the laser irradiation method of the present invention may also be applied to activate the impurity element doped in the island-shaped semiconductor films.

Moreover, this embodiment can be freely combined with any description of Embodiment Modes 1 to 3 if necessary.

Embodiment 2

This embodiment shows an example of manufacturing a liquid crystal display device (Liquid Crystal Display (LCD)) using the present invention with reference to FIGS. 7(A) to 7(B), FIG. 8, and FIG. 9.

A method for manufacturing a display device described in this embodiment is a method for simultaneously manufacturing a pixel portion including a pixel TFT and a TFT of a driver circuit portion provided in its periphery. However, in order to simplify the description, a CMOS circuit which is a basic unit concerning a driver circuit is shown.

First, the steps up to forming the first interlayer insulating film 530 in FIG. 6 (B) are conducted based on Embodiment 1. The same things as those in Embodiment 1 are denoted with the same reference numerals.

Next, a second interlayer insulating film 601 serving as a flattening film is formed over the first interlayer insulating film 530 as shown in FIG. 7(A).

As the second interlayer insulating film 601, a photosensitive or non-photosensitive organic material (polyimide, acrylic, polyamide, polyimide-amide, resist, or benzocyclobutene), siloxane resin, or a multilayer structure of those can be used. As the organic material, positive photosensitive organic resin or negative photosensitive organic resin can be used.

Siloxane resin corresponds to resin including a Si—O—Si bond. A skeletal structure of siloxane is constituted by a bond of silicon (Si) and oxygen (O). As the substituent, an organic group containing at least hydrogen (for example, an alkyl group or aromatic hydrocarbon) is used. As the substituent, a fluoro group may be used. Further, an organic group containing at least hydrogen and a fluoro group may be used as the substituent.

In this embodiment, siloxane is formed as the second interlayer insulating film 601 by a spin coating method.

The first interlayer insulating film 530 and the second interlayer insulating film 601 are etched to form contact holes that reach the island-shaped semiconductor films 507 to 509.

Next, a metal film is formed over the second interlayer insulating film 601 through the contact holes, and then the metal film is formed and patterned, thereby forming electrodes or wirings 602 to 606.

As the metal film, a film containing an element of aluminum (Al), titanium (Ti), molybdenum (Mo), tungsten (W), or silicon (Si) or an alloy film containing these elements may be used. In this embodiment, a titanium film (Ti), a titanium nitride film (TiN), a silicon-aluminum alloy film (Al—Si), and a titanium film (Ti) are stacked in thickness of 60 nm, 40 nm, 300 nm, and 100 nm respectively, and patterned and etched into a desired shape, thereby forming the electrodes or wirings 602 to 606.

These electrodes or wirings 602 to 606 may be formed with an aluminum alloy film containing carbon and at least one element of nickel, cobalt, and iron. Such an aluminum alloy film can prevent the interactive diffusion of silicon and aluminum even when the aluminum alloy film contacts silicon. Further, since an oxidation-reduction reaction does not occur even when such an aluminum alloy film contacts a transparent conductive film such as an ITO (Indium Tin Oxide) film, both can be directly contacted. Moreover, such an aluminum alloy film has low specific resistance and high heat resistance, thereby being effective for a wiring material.

The electrodes or wirings 602 to 606 may be formed by integrating an electrode and a wiring. Alternatively, the electrodes and the wirings which are separately formed may be connected.

The electrode or wiring 603 electrically connects the source region or drain region 520 of the n-channel TFT 540 and the source region or drain region 523 of the p-channel TFT 541 (FIG. 7(A)).

Next, a third interlayer insulating film 610 is formed over the second interlayer insulating film 601 and the electrodes or wirings 602 to 606 as shown in FIG. 7(B). The third interlayer insulating film 610 can be formed with the same material as the second interlayer insulating film 601.

Next, a resist mask is formed using a photo mask, and a part of the third interlayer insulating film 610 is removed by dry etching to form an opening (form a contact hole). In forming this contact hole, carbon tetrafluoride ($CF_4$), oxygen ($O_2$), and helium (He) are used as etching gas with the flow rate of $CF_4$, $O_2$, and He for 50 sccm, 50 sccm, and 30 sccm. The bottom portion of the contact hole reaches the electrode or wiring 606.

Next, after removing the resist mask, a second conductive film is formed all over the surface. Then, the second conductive film is patterned using the photo mask, thereby forming a pixel electrode 623 to be electrically connected to the electrode or wiring 606. In this embodiment, since a reflective type liquid crystal display panel is manufactured, the pixel electrode 623 may be formed with a metal material having light-reflectivity such as Ag (silver), Au (gold), Cu (copper), W (tungsten), or Al (aluminum) by a sputtering method.

In the case of manufacturing a transmission-type liquid crystal display panel, the pixel electrode 623 is formed using a transparent conductive film such as indium tin oxide (ITO), indium tin oxide containing silicon oxide, zinc oxide (ZnO), or tin oxide ($SnO_2$).

FIG. 9 is a top view in which a part of the pixel portion is magnified. FIG. 9 shows a pixel electrode which is partway formed. The pixel electrode is formed in a pixel on the left side, while the pixel electrode is not formed in a pixel on the right side. In FIG. 9, the drawing taken along a solid line of A-A' corresponds to a cross section of a pixel portion in FIG. 8 and the parts corresponding to those in FIG. 8 are denoted with the same reference numerals. A capacitor wiring 631 is provided, and a holding capacitor is formed with the pixel electrode 623 and the capacitor wiring 631 overlapping the pixel electrode by using the first interlayer insulating film 530 as a dielectric.

In this embodiment, the second interlayer insulating film 601 and the third interlayer insulating film 610 are etched in the region where the pixel electrode 623 and the capacitor wiring 631 overlap, and the holding capacitor is formed with the pixel electrode 623, the first interlayer insulating film 530, and the capacitor wiring 631. However, if the second interlayer insulating film 601 and the third interlayer insulating film 610 can also be used as the dielectric, the second interlayer insulating film 601 and the third interlayer insulating film 610 do not need to be etched. In this case, the first interlayer insulating film 530, the second interlayer insulating film 601, and the third interlayer insulating film 610 serve as the dielectric. Alternatively, only the third interlayer insulating film 610 may be etched and the first interlayer insulating film 530 and the second interlayer insulating film 601 may be used as the dielectric.

With the above steps, a TFT substrate for a liquid crystal display panel where the pixel electrode 623 and a CMOS circuit 620 including the top-gate pixel TFT 542 and the top-gate TFTs 540 and 541 formed over the substrate 500 is completed. Although the top-gate TFT is formed in this embodiment, a bottom-gate TFT can be appropriately used.

Next, an orientation film 624a is formed so as to cover the pixel electrode 623 as shown in FIG. 8. The orientation film 624a may be formed by a droplet-discharging method, a screen printing method, or an off-set printing method. After that, a rubbing process is conducted to the surface of the orientation film 624a.

Then, a color filter including a colored layer 626a, a light-blocking layer (black matrix) 626b, and an overcoat layer 627 is provided to a counter substrate 625. Moreover, a counter electrode 628 including a transparent electrode or a reflective electrode is formed, and then an orientation film 624b is formed thereover. Next, a seal material which is a closed pattern is formed by a droplet-discharging method so as to surround a region overlapping the pixel portion. Since a liquid crystal is dropped here, an example of drawing the seal material of the closed pattern is shown; however, a dip method (lifting method) may also be employed in which a liquid crystal is injected using a capillary tube phenomenon after providing a seal pattern having an opening portion and pasting the TFT substrate.

Next, a liquid crystal is dropped under low pressure so that a bubble does not enter, and then both substrates are pasted. A liquid crystal is dropped once or plural times within the seal pattern of a closed loop. With this step, a liquid crystal layer 629 is formed between the TFT substrate 500 and the counter substrate 625. As an orientation mode of the liquid crystal, a TN mode in which an arrangement of liquid crystal molecules is twisted for 90° from the incidence of light toward the emission of light is often employed. In the case of manufacturing a liquid crystal display device of the TN mode, the substrates are pasted so that the rubbing directions of the substrates intersect.

The distance between a pair of substrates may be kept by dispersing spherical spacers or cylindrical spacers containing an organic resin material or an inorganic material by including a filler in the seal material. The cylindrical spacer is characterized by being formed with an organic resin material containing at least one of acrylic, polyimide, polyimide-amide, and epoxy as its main component, a material of any one of silicon oxide, silicon nitride, and silicon oxide containing nitrogen, or an inorganic material including a multi-layer film of these.

Next, the substrate is divided. In the case of taking out many panels, the respective panels are divided. In the case of taking out one panel, the step of dividing can be omitted by pasting the counter substrate which has been cut in advance.

Then, an FPC (Flexible Printed Circuit) is pasted through an anisotropic conductive layer by a known technique. With these steps, a liquid crystal module is completed. Further, an optical film is pasted if necessary. In the case of a transmission-type liquid crystal display device, a polarizing plate is pasted to both of the active matrix substrate and the counter substrate.

As thus shown, a liquid crystal display device can be manufactured using a TFT having a reliable transistor characteristic in this embodiment. The liquid crystal display device manufactured in this embodiment can be used as a display portion of various electronic appliances.

Although the TFT is the top-gate TFT in this embodiment, the structure of the TFT is not limited to this. A bottom-gate (reversely-staggered) TFT or a staggered TFT can also be employed appropriately. Further, not only the TFT having a single gate structure but also a multi-gate structure TFT having a plurality of channel-forming regions, for example a double-gate structure TFT, is applicable.

This embodiment can be freely combined with any description of Embodiment Modes 1 to 3 and Embodiment 1 if necessary.

Embodiment 3

This embodiment shows an example of using a droplet-discharging method to drop a liquid crystal. In this embodiment, an example of using a large substrate 1110 to manufacture four panels is shown in FIGS. 10(A) to 10(D), FIGS. 11(A) to 11(D), and FIGS. 12(A) to 12(B).

FIG. 10(A) is a cross-sectional view in which a liquid crystal layer is partway formed through a discharging step by a dispenser (or ink jet). A liquid crystal material 1114 is discharged, sprayed, or dropped from a nozzle 1118 of a droplet-discharging apparatus 1116 so as to cover a pixel portion 1111 surrounded by a seal material 1112. The droplet-discharging apparatus 1116 is moved in a direction of an arrow in FIG. 10 (A). Although an example of moving the nozzle 1118 is shown here, the liquid crystal layer may be formed by moving the substrate with the nozzle fixed.

FIG. 10(B) is a perspective view, which shows that the liquid crystal material 1114 is discharged, sprayed, or dropped selectively only in a region surrounded by the seal material 1112 and that a dropping plane 1115 is moved in accordance with a nozzle scanning direction 1113.

FIGS. 10(C) and 10(D) are cross-sectional views in which a part 1119 surrounded by a dotted line in FIG. 10(A) is magnified. If the liquid crystal material has high viscosity, the liquid crystal material is discharged continuously and adhered while being connected as shown in FIG. 10(C) (continuous discharging). Meanwhile, if the liquid crystal material has low viscosity, the liquid crystal material is discharged intermittently, and the droplet is discharged as shown in FIG. 10(D) (dot discharging).

In FIG. 10(C), 1120 denotes a top-gate TFT, and 1121 denotes a pixel electrode. The pixel portion 1111 includes pixel electrodes arranged in a matrix pattern, switching elements connected to the pixel electrodes, here top-gate TFTs, and holding capacitors.

Although the top-gate TFT is used in this embodiment, a bottom-gate TFT may also be used.

Here, a flow of manufacturing a panel is hereinafter described with reference to FIGS. 11(A) to 11(D).

First, a first substrate 1035 having an insulating surface over which a pixel portion 1034 is formed is prepared. To the first substrate 1035, formation of an orientation film, a rubbing process, dispersion of spherical spacers, formation of cylindrical spacer, formation of a color filter, and so on are conducted in advance. Subsequently, a seal material 1032 is formed at a predetermined location (a pattern surrounding the pixel portion 1034) over the first substrate 1035 by a dispenser apparatus or an ink-jet apparatus under an inert gas atmosphere or under low pressure as shown in FIG. 11(A). As the seal material 1032 which is semi-transparent, what includes a filler (diameter of 6 μm to 24 μm) and has a viscosity of 40 to 400 Pa·s is used. It is preferable to select a seal material which is insoluble in a liquid crystal to be in contact later. As the seal material, acrylic photo-curable resin or acrylic thermosetting resin may be used. The seal material 1032 can also be formed by a printing method because the seal pattern is simple.

Next, a liquid crystal 1033 is dropped in a region surrounded by the seal material 1032 by an inkjet method (FIG. 11(B)). As the liquid crystal 1033, a known liquid crystal material having enough viscosity to be discharged by an ink-jet method may be used. Since the viscosity of the liquid crystal material can be set by adjusting the temperature, the liquid crystal material is suitable for an ink-jet method. According to an ink-jet method, only a necessary amount of liquid crystal 1033 can be held in the region surrounded by the seal material 1032 without any waste.

Next, the first substrate 1035 with the pixel portion 1034 provided and a second substrate 1031 with the counter electrode or the orientation film provided are pasted under low pressure so that a bubble does not enter (FIG. 11(C)). Here, the seal material 1032 is cured by conducting ultraviolet light irradiation or heat treatment at the same time as the pasting. The heat treatment may be conducted in addition to the ultraviolet light irradiation.

FIGS. 12(A) and 12(B) show an example of a pasting apparatus which can conduct ultraviolet light irradiation or heat treatment at the pasting or after the pasting.

In FIGS. 12(A) and 12(B), a reference numeral 1041 denotes a first substrate supporting stand; 1042, a second substrate supporting stand; 1044, a window; 1048, a lower stool; and 1049, a light source. In FIG. 12, the parts corresponding to those in FIG. 11 are denoted with the same reference numerals.

The lower stool 1048 incorporates a heater to cure the seal material. The window 1044 is provided to the second substrate supporting stand so that ultraviolet light from the light source 1049 and the like pass therethrough. Here, although not illustrated, the position alignment of the substrate is conducted through the window 1044. The second substrate 1031 to be the counter substrate is cut into a desired size and fixed to the second substrate supporting stand 1042 by a vacuum chuck or the like in advance. FIG. 12(A) shows a state before the pasting.

At the pasting, after lowering the first substrate supporting stand and the second substrate supporting stand, the first substrate 1035 and the second substrate 1031 are pasted while applying pressure thereto, and then ultraviolet light is irradiated to cure. FIG. 12(B) shows a state after the pasting.

Subsequently, the first substrate 1035 is cut (divided) using a cutting apparatus such as a scriber apparatus, a breaker apparatus, or a roll cutter. (FIG. 11(D)) Thus, four panels can be manufactured from one substrate. Then, an FPC is pasted by a known technique.

As the first substrate 1035 and the second substrate 1031, a glass substrate or a plastic substrate can be used.

This embodiment can be freely combined with any description of Embodiment Modes 1 to 3 and Embodiments 1 and 2 if necessary.

Embodiment 4

This embodiment shows an example of manufacturing a dual-emission type display device using the present invention with reference to FIGS. 13(A) to 13(B).

First, the island-shaped semiconductor films 507 to 509 shown in FIG. 5(C) are formed based on Embodiment 1. It is to be noted that the same things as those in Embodiment 1 are denoted with the same reference numerals.

Next, an impurity is introduced into the island-shaped semiconductor films 507 to 509 to control the threshold. In this embodiment, boron (B) is introduced into the island-shaped semiconductor films by doping diborane ($B_2H_6$).

Next, a gate insulating film 2200 is formed so as to cover the island-shaped semiconductor films 507 to 509. As the gate insulating film 2200, for example, silicon oxide (SiO), silicon nitride (SiN), silicon oxide containing nitrogen (SiON), or the like can be used. As the film-forming method, a plasma CVD method, a sputtering method, or the like can be used.

Next, after forming a conductive film over the gate insulating film 2200, the conductive film is patterned to form a gate electrode 2202.

The gate electrode 2202 is formed with a single layer of a conductive film or with a structure in which two or more conductive films are stacked. In the case of stacking two or more conductive films, the gate electrode 2202 may be formed by stacking an element selected from tantalum (Ta), tungsten (W), titanium (Ti), molybdenum (Mo), and aluminum (Al), or an alloy material or a compound material containing the above element as its main component. Further, the gate electrode may be formed with a semiconductor film typified by a poly-crystalline silicon film doped with an impurity element such as phosphorus (P).

In this embodiment, the gate electrode 2202 is formed by using a multilayer film in which a first electrode layer 2202a is formed with tantalum nitride (TaN) in 30 nm thick and a second electrode layer 2202b is formed with tungsten (W) in 370 nm thick.

The gate electrode 2202 may be formed as a part of the gate wiring. Alternatively, the gate electrode 2202 may be connected to a gate wiring formed separately.

Then, an impurity imparting n-type or p-type conductivity is added to the island-shaped semiconductor films 507 to 509 using the gate electrode 2202 or a patterned resist as a mask, thereby forming a source region, a drain region, a low-concentration impurity region, and the like.

In the case of manufacturing an n-channel TFT in this embodiment, phosphorus (P) is introduced into the island-shaped semiconductor films using phosphine ($PH_3$) at an applied voltage of 40 to 80 keV, for example 50 keV, and with a dose amount of $1.0 \times 10^{15}$ to $2.5 \times 10^{16}$ $cm^{-2}$, for example $3.0 \times 10^{15}$ $cm^{-2}$. With this step, source regions or drain regions 2100 and 2103 of n-channel TFTs 2000 and 2001 are formed. Moreover, in order to form the low-concentration impurity regions 2101 and 2104, phosphorus (P) is introduced into the island-shaped semiconductor films at an acceleration voltage of 60 to 120 keV and with a dose amount of $1 \times 10^{13}$ to $1 \times 10^{15}$ $cm^{-2}$. By this introduction of the impurity, channel-forming regions 2102 and 2105 are formed.

In the case of manufacturing a p-channel TFT, boron (B) is introduced into the island-shaped semiconductor films under a condition where diborane ($B_2H_6$) is used at an applied voltage of 60 to 100 keV, for example 80 keV, and with a dose amount of $1 \times 10^{13}$ to $5 \times 10^{15}$ $cm^{-2}$, for example $3 \times 10^{15}$ $cm^{-2}$. With this step, a source region or drain region 2106 of a p-channel TFT 2002 is formed, and a channel-forming region 2107 is formed by this introduction of the impurity.

In this embodiment, phosphorus (P) is included in each of the source regions or drain regions 2100 and 2103 of the n-channel TFTs 2000 and 2001 at a concentration of $1 \times 10^{19}$ to $5 \times 10^{21}$ $cm^{-3}$. Moreover, phosphorus (P) is included in each of the low-concentration impurity regions 2101 and 2104 of the n-channel TFT at a concentration of $1 \times 10^{18}$ to $5 \times 10^{19}$ $cm^{-3}$. Further, boron (B) is included in the source region or drain region 2106 of the p-channel TFT 2002 at a concentration of $1 \times 10^{19}$ to $5 \times 10^{21}$ $cm^{-3}$.

In this embodiment, the p-channel TFT 2002 is used as a pixel TFT of this dual-emission type display device. The n-channel TFTs 2000 and 2001 are used as TFTs of a driver circuit for driving the pixel TFT 2002. However, the pixel TFT is not necessarily a p-channel TFT, and an n-channel TFT may also be used. Moreover, the driver circuit is not necessarily a circuit in which a plurality of n-channel TFTs are combined, and a circuit in which an n-channel TFT and a p-channel TFT are complementarily combined or a circuit in which a plurality of p-channel TFTs are combined is also applicable.

Subsequently, after forming an insulating film containing hydrogen, the impurity element added in the semiconductor layer is activated. The activation of the impurity element may be conducted by the laser process method described in Embodiment Modes 1 to 3 and Embodiment 1. Alternatively, after forming the insulating film containing hydrogen, heat treatment may be conducted at 550° C. for four hours in a nitrogen atmosphere to activate the impurity.

As the insulating film containing hydrogen, a silicon oxide film containing nitrogen (SiON film) obtained by a PCVD method is used. Alternatively, a silicon nitride film containing oxygen (SiNO film) may also be used. In the case of crystallizing a semiconductor film with a crystallization-inducing metal element typified by nickel, gettering to decrease nickel in the channel-forming region can also be conducted at the same time as the activation. The insulating film containing hydrogen is a first interlayer insulating film 2300 and an insulating film which contains silicon oxide and which has light-transmitting properties.

After that, the semiconductor layer is hydrogenated by heating the whole at 410° C. for one hour.

Next, a flattening film to be a second interlayer insulating film 2301 is formed. As the flattening film, an inorganic material having light-transmitting properties (silicon oxide, silicon nitride, silicon nitride containing oxygen, or the like), a photosensitive or non-photosensitive organic material (such as polyimide, acrylic, polyamide, polyimide-amide, resist, or benzocyclobutene), or multilayer of these is used. As another film having light-transmitting properties used as the flattening film, an insulating film including a $SiO_x$ film containing an alkyl group obtained by a coating method, for example, an insulating film formed by using silica glass, alkyl siloxane polymer, alkyl silsesquioxane polymer, silsesquioxane hydride polymer, alkyl silsesquioxane hydride polymer, or the like can be used. As an example of the siloxane polymer, PSB-K1 or PSB-K31 which are coating insulating materials manufactured by Toray Industries, Inc. or ZRS-5PH which is a coating insulating material manufactured by CATALYSTS & CHEMICALS IND. CO., LTD. is given.

Next, a third interlayer insulating film 2302 having light-transmitting properties is formed. The third interlayer insulating film 2302 is provided as an etching stopper film to protect the flattening film, which is the second interlayer insulating film 2301, in a later step for patterning a transparent electrode 2400. However, if the second interlayer insulating film 2301 serves as an etching stopper film when patterning the transparent electrode 2400, the third interlayer insulating film 2302 is not necessary.

Next, contact holes are formed in the first interlayer insulating film 2300, the second interlayer insulating film 2301, and the third interlayer insulating film 2302 using a new mask. Next, after removing the mask and forming a conductive film (a multilayer film of TiN, Al, and TiN), etching (dry etching using mixed gas of $BCl_3$ and $Cl_2$) is conducted using another mask to form electrodes or wirings 2303 to 2308 (source electrodes or drain electrodes of TFTs, source wirings and drain wirings, current-supplying wirings, or the like) (FIG. 13(A)). TiN is one of materials having high adhesiveness to a high heat-resistant flattening film. In addition, the content of N in TiN is preferably less than 44% in order to have a good ohmic contact with the source region or the drain region of the TFT.

Next, the transparent electrode 2400, that is, an anode of an organic light-emitting element is formed in thicknesses from 10 nm to 800 nm using a new mask. As the transparent electrode 2400, besides indium tin oxide (ITO), for example, a transparent conductive material having high work function (work function of 4.0 eV or more) such as indium tin oxide containing a Si element or IZO (Indium Zinc Oxide) in which zinc oxide (ZnO) is mixed into indium oxide for 2 to 20%.

Subsequently, an insulator 2600 (referred to as a bank, a partition wall, a barrier, an embankment, or the like) covering an end portion of the transparent electrode 2400 is formed using a new mask. As the insulator 2600, a photosensitive or non-photosensitive organic material (polyimide, acrylic, polyamide, polyimide-amide, resist, or benzocyclobutene) or an SOG film (for example a $SiO_x$ film containing an alkyl group) is formed in thicknesses from 0.8 µm to 1 µm by a coating method.

Next, layers 2401, 2402, 2403, 2404, and 2405 each containing an organic compound are formed by an evaporation method or a coating method. In order to improve the reliability of the light-emitting element, deaeration is preferably conducted by vacuum heating before forming the first layer 2401 containing the organic compound. For example, it is desirable to conduct heat treatment at 200° C. to 300° C. in a low-pressure atmosphere or an inert atmosphere to remove the gas included in the substrate before evaporating the organic compound material. In the case of forming the interlayer insulating films and the partition wall with a $SiO_x$ film having high heat resistance, higher heat treatment (410° C.) can also be added.

Next, the first layer (hole-injecting layer) 2401 containing the organic compound is formed selectively over the transparent electrode 2400 by co-evaporating molybdenum oxide ($MoO_x$), 4,4'-bis[N-(1-naphtyl)-N-phenyl-amino]-biphenyl (α-NPD), and rubrene using an evaporation mask.

In addition to $MoO_x$, a material having high hole-injecting properties such as copper phthalocyanine (CuPC), vanadium oxide ($VO_x$), ruthenium oxide ($RuO_x$), or tungsten oxide ($WO_x$) can be used. Moreover, the first layer 2401 containing the organic compound may be formed with a polymer material having high hole-injecting properties such as poly(ethylene oxythiophene)/poly(styrene sulfonate) solution (PEDOT/PSS) by a coating method.

Next, α-NPD is evaporated selectively using an evaporation mask, and the second layer (hole-transporting layer) 2402 containing the organic compound is formed over the first layer 2401 containing the organic compound. Besides α-NPD, the following material having high hole-transporting properties typified by an aromatic amine compound can be used: 4,4'-bis [N-(3-methylphenyl)-N-phenyl-amino]-biphenyl (abbreviated to TPD), 4,4',4"-tris(N, N-diphenyl-amino)-triphenyl amine (abbreviated to TDATA), 4,4',4"-tris[N-(3-methylphenyl)-N-phenyl-amino]-triphenylamine (abbreviated to MTDATA), or the like.

Next, the third layer (light-emitting layer) 2403 containing the organic compound is formed selectively. To obtain a full color display device, the evaporation is conducted selectively by aligning the evaporation mask for each of the emission colors (R, G and B).

FIG. 27 shows an example of changing the light-emitting layer 2403 for each of the emission colors (red (R), green (G), and blue (B)). In FIG. 27, the same things as those in FIGS. 13(A) to 13(B) are denoted with the same reference numerals. The pixel TFTs 2002 (2002R, 2002C; and 2002B) corresponding to RGB are formed over the base film 501 over the substrate 500. The electrodes or wirings 2307 (2007R, 2007G, and 2007B) and 2308 (2008R, 2008C, and 2008B) are connected to the pixel TFTs 2002.

Moreover, the transparent electrodes 2400R, 2400G, and 2400B are connected to the pixel TFTs 2002R, 2002G, and 2002B, respectively. The first layer (hole-injecting layer) 2401 (2401R, 2401G, and 2401B) containing the organic compound, the second layer (hole-transporting layer) 2402 (2402R, 2402G, and 2402B) containing the organic compound, the third layer (light-emitting layer) 2403 (2403R, 2403G; and 2403B) containing the organic compound, the fourth layer (electron-transporting layer) 2404 (2404R, 2404G and 2404B) containing the organic compound, and the fifth layer (electron-injecting layer) 2405 (2405R, 2405G, and 2405B) containing the organic compound are formed over the transparent electrodes.

The material of the light-emitting layer 2403 may be changed to change the emission color, and the light-emitting layer 2403R showing red light emission, the light-emitting layer 2403G showing green light emission, and the light-emitting layer 2403B showing blue light emission which are used in this embodiment are hereinafter shown. Another layer containing the organic compound, the TFT, the anode, the cathode, and the like may use the same material and have the same structure in each of the colors.

As a material of the light-emitting layer 2403R showing red light emission, $Alq_3$:DCM, $Alq_3$:rubrene:BisDCJTM, or the like is used. As a material of the light-emitting layer 2403G showing green light emission, $Alq_3$:DMQD (N,N'-dimethylquinacridone), $Alq_3$:coumarin 6, or the like is used.

As a material of the light-emitting layer 2403B showing blue light emission, α-NPD, tBu-DNA, or the like is used.

Next, Alq$_3$ (tris (8-quinolinolato) aluminum) is evaporated selectively using an evaporation mask to form the fourth layer (electron-transporting layer) 2404 containing the organic compound over the light-emitting layer 2403. Besides Alq$_3$, a material having high electron-transporting properties typified by a metal complex having a quinoline skeleton or a benzoquinoline skeleton such as tris(5-methyl-8-quinolinolate)aluminum (abbreviated to Almq$_3$), bis(10-hydroxybenzo[h]-quinolinato)beryllium (abbreviated to BeBq$_2$), or bis(2-methyl-8-quinolinolate)-4-phenylphenolate-aluminum (abbreviated to BAlq) can be used. Further, a metal complex having an oxazole-based or thiazole-based ligand such as bis[2-(2-hydroxyphenyl)benzoxazolate]zinc (abbreviated to Zn(BOX)$_2$) or bis[2-(2-hydroxyphenyl)-benzothiazolate]zinc (abbreviated to Zn(BTZ)$_2$) can be used. In addition to the metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used as the electron-transporting layer 2404 because of high electron-transporting properties.

Next, 4,4-bis(5-metylbenzoxazole-2-yl)stilbene (abbreviated to BzOs) and lithium (Li) are co-evaporated to form the fifth layer (electron-injecting layer) 2405 containing the organic compound over the whole surface covering the electron-transporting layer 2404 and the insulator 2600. By using a benzoxazole derivative (BzOs), the damage due to a sputtering method in a later step for forming the transparent electrode 2406 is suppressed. Besides BzOs:Li, a material having high electron-injecting properties such as a compound of alkali metal or alkali-earth metal, for example CaF$_2$, lithium fluoride (LiF), or cesium fluoride (CsF) can be used. In addition to these, a mixture of Alq$_3$ and magnesium (Mg) can be used.

Next, the transparent electrode 2406, that is, a cathode of the organic light-emitting element is formed in thicknesses from 10 nm to 800 nm over the fifth layer 2405 containing the organic compound. As the transparent electrode 2406, besides indium tin oxide (ITO), for example indium tin oxide containing a Si element or IZO (indium zinc oxide) in which zinc oxide (ZnO) is mixed into indium oxide for 2 to 20% can be used.

In this way, the light-emitting element is manufactured. The materials of an anode, the first to fifth layers containing the organic compound, and the cathode which constitute the light-emitting element are selected appropriately, and each film thickness is also adjusted. It is desirable that the anode and the cathode be formed with the same material and have the thickness of the same degree, preferably as thin as 100 nm.

A transparent protective layer 2407 to prevent the intrusion of moisture is formed covering the light-emitting element if necessary. As the transparent protective layer 2407, a silicon nitride film, a silicon oxide film, a silicon nitride film containing oxygen (SiNO film (composition ratio (N>O)), a silicon oxide film containing nitrogen (SiON film (composition ratio (N<O)), a thin film containing carbon as its main component (such as a DLC film or a CN film), or the like obtained by a sputtering method or a CVD method can be used.

Next, a second substrate 2500 and the substrate 500 are pasted with a seal material containing a gap material for securing the distance between the substrates. As the second substrate 2500, a glass substrate or a quartz substrate having light-transmitting properties may be used. A drying agent may be arranged as an air gap (inert gas) between a pair of substrates. Alternatively, a transparent seal material (ultraviolet curable or thermosetting epoxy resin or the like) may fill a space between the pair of substrates.

The transparent electrodes 2400 and 2407 of the light-emitting element is formed with a light-transmitting material, and light can be extracted from one light-emitting element in two directions, that is, from the opposite sides.

With the panel structure shown above, light emission from the top surface and light emission from the bottom surface can be made almost the same.

Finally, contrast is improved by providing optical films (a polarizing plate or a circular polarizing plate) 2501 and 2502.

Although the TFT is a top-gate TFT in this embodiment, the structure is not limited to this. A bottom-gate (reversely-staggered) TFT or a staggered TFT can be used appropriately. Moreover, not only the TFT having a single gate structure but also a multi-gate TFT having a plurality of channel-forming regions, for example a double-gate TFT, is applicable.

This embodiment can be freely combined with any description in Embodiment Modes 1 to 3 and Embodiment 1 if necessary.

Embodiment 5

This embodiment describes an example of manufacturing a CPU (Central Processing Unit) using the present invention with reference to FIGS. 14(A) to 14(C), FIGS. 15(A) to 15(C), FIGS. 16(A) to 16(C), FIGS. 17(A) to 17(B), and FIG. 18.

As shown in FIG. 14(A), a base film 3101 is formed over a substrate 3100 having an insulating surface. As the substrate 3100, a glass substrate made of barium borosilicate glass, alumonoborosilicate glass, or the like, a quartz substrate, a stainless substrate, or the like can be used. Further, although a substrate made of synthetic resin having flexibility such as acrylic or plastic typified by PET, PES, or PEN tends to have lower heat resistance than another substrate, such a substrate can be used as long as the substrate can resist the treatment temperature in the manufacturing steps.

The base film 3101 is provided to prevent alkali-earth metal or alkali metal such as Na included in the substrate 3100 from diffusing into the semiconductor film to adversely affect the characteristic of a semiconductor element. Therefore, the base film 3101 is formed with an insulating film such as silicon oxide, silicon nitride, or silicon oxide containing nitrogen which can suppress the diffusion of alkali metal or alkali-earth metal into the semiconductor film. In this embodiment, a silicon nitride film containing oxygen (SiNO) formed in thicknesses from 10 to 200 nm (50 nm in this embodiment) by using SiH$_4$, NH$_3$, N$_2$O, and H$_2$ as reactive gas by a plasma CVD method and a silicon nitride film containing oxygen (SiON) formed in thicknesses from 50 to 200 nm (100 nm in this embodiment) by using SiH$_4$ and N$_2$O as reactive gas are stacked in order. The base film 3101 may have a single-layer structure, and for example, a silicon oxide film containing nitrogen can be formed in thicknesses from 10 to 400 nm (preferably from 50 to 300 nm thick).

In the case of using a substrate containing even a small amount of alkali metal or alkali-earth metal such as a glass substrate, a stainless substrate or a plastic substrate, it is effective to provide the base film to prevent the diffusion of the impurity. However, when the diffusion of the impurity does not lead to a significant problem, for example when using the quartz substrate, the base film is not necessarily provided.

An amorphous semiconductor film 3102 is formed over the base film 3101. The thickness of the amorphous semiconductor film 3101 is set to 25 to 100 nm (preferably 30 to 60 nm). As the amorphous semiconductor, not only silicon but also silicon germanium can be used. In the case of using silicon germanium, the concentration of germanium is preferably approximately 0.01 to 4.5 atomic %. In this embodiment, a 66-nm-thick semiconductor film containing silicon as its main component (also referred to as an amorphous silicon film or amorphous silicon) is used.

Next, a metal element is added to the amorphous semiconductor film 3102. Here, to add means to form a metal element on the surface of the amorphous semiconductor film 3102 so as to induce the crystallization of at least the amorphous semiconductor film. The formation of the metal element is preferable because the amorphous semiconductor film can be crystallized at low temperature.

For example, Ni solution (including water solution or acetate solution) is applied onto the amorphous semiconductor film 3102 by a coating method such as a spin coating method or a dip method to form a film 3103 containing Ni (however, this film sometimes cannot be observed because of its extreme thinness). At this time, in order to improve the wettability of the surface of the amorphous semiconductor film 3102 and to spread the solution all over the surface of the amorphous semiconductor film, an oxide film (not shown) is desirably formed in thicknesses from 1 nm to 5 nm by ultraviolet light irradiation in an oxygen atmosphere, a heat oxidation method, a process by hydrogen peroxide or ozone water containing hydroxy radical, or the like. Ni ions may be implanted into the amorphous semiconductor film by an ion implantation method, the amorphous semiconductor film may be heated in a water vapor atmosphere containing Ni, or sputtering may be conducted with Ar plasma using a Ni material as a target. In this embodiment, water solution containing Ni acetate for 10 ppm is applied by a spin coating method.

After that, the amorphous semiconductor film 3102 is irradiated with a laser beam (laser beam) 3105 (refer to FIG. 14(B)) as described in Embodiment Modes 1 to 3 and Embodiment 1. As the laser, one or a plurality of kinds selected from an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, and a gold vapor laser can be used. As the laser, a continuous wave laser (CW laser) or a pulsed laser (pulse laser) having a repetition rate of 10 MHz or more, preferably 80 MHz or more, can be used. The length of the major axis of the linear laser beam may be set in the range of 200 to 350 μm.

At such laser irradiation, a marker can be formed in order to control an irradiation start position and an irradiation end position or to overlap with high accuracy. The marker may be formed on the substrate at the same time as the amorphous semiconductor film.

By this laser irradiation, the amorphous semiconductor film 3102 is crystallized, and a crystalline semiconductor film is formed.

After that, a gettering step is conducted to decrease or remove the metal element. In this embodiment, a method for gettering the metal element by using an amorphous semiconductor film as a gettering sink is described. First, an oxide film is formed over the crystalline semiconductor film by ultraviolet light irradiation in an oxygen atmosphere, a heat oxidation method, a process by hydrogen peroxide or ozone water including hydroxy radical, or the like. Next, an amorphous semiconductor film is formed in 150 nm thick by a plasma CVD method using $SiH_4$ and Ar as material gas at a pressure of 0.3 Pa, with an RF power of 3 kW, and at a substrate temperature of 150° C.

After that, heat treatment is conducted at 550° C. for four hours in a nitrogen atmosphere to decrease or remove the metal element. Then, the amorphous semiconductor film serving as the gettering sink and the oxide film are removed by fluorinated acid or the like, and thus, a crystalline semiconductor film in which the metal element is decreased or removed can be obtained.

As shown in FIG. 14(C), the crystalline semiconductor film is patterned into a predetermined shape, thereby obtaining island-shaped semiconductor films 3106a to 3106e. At the patterning, a photoresist is applied onto the crystalline semiconductor film and a predetermined mask shape is light-exposed and baked, and thus, a mask is formed over the crystalline semiconductor film. With this mask, the crystalline semiconductor film is patterned by a dry etching method. As the gas in the dry etching method, $CF_4$ and $O_2$ can be used.

After that, an impurity is added into the crystalline semiconductor film as necessary. For example, boron (B) is added by a doping method. Then, the threshold, which is the electric characteristic of the thin film transistor, can be made closer to zero. That is to say, the crystalline semiconductor film can be made more intrinsic state.

After that, an insulating film to cover the island-shaped semiconductor films 3106a to 3106e, which is a so-called gate insulating film 3108, is formed. Before forming the gate insulating film 3108, the surface of the island-shaped semiconductor film is washed with fluorinated acid or the like. The gate insulating film 3108 is formed with an insulating film containing silicon in thicknesses from 10 to 150 nm, preferably 20 to 40 nm, by a plasma CVD method or a sputtering method. In this embodiment, a silicon oxide film containing nitrogen is formed in 20 nm thick at a temperature of 400° C. in the film-forming chamber by a plasma CVD method using $SiH_4$ and $N_2O$ as material gas. At this time, since the gate insulating film has been thinned, the film-forming rate is decreased. As a result, a part of the film where the film quality is not high at an initial stage of the film-formation can be decreased. Of course, the gate insulating film is not limited to the silicon oxide film containing nitrogen, and another insulating film containing silicon may be formed in a single layer or multilayer structure.

After that, conductive films 3109a and 3109b to be a gate electrode 3109 are formed over the crystalline semiconductor film through the gate insulating film 3108. Of course, the gate electrode 3109 may be a single layer or multilayer. The conductive films 3109a and 3109b may be formed with an element selected from Ta, W, Ti, Mo, Al, and Cu, or an alloy material or a compound material containing the above element as its main component. In this embodiment, a tantalum nitride film having thicknesses from 10 to 50 nm, for example 30 nm, as the first conductive film 3109a and a tungsten film having thicknesses from 200 to 400 nm, for example 370 nm thick, as the second conductive film 3109b are stacked so as to cover the gate insulating film 3108.

After that, the first conductive film 3109a and the second conductive film 3109b are etched by using the mask as shown in FIG. 15(A). First, a photoresist is applied onto the conductive film by a spin coating method or the like. The photoresist may be either a positive type or a negative type. At this time, a resist mask to which a light-absorption agent is added may also be used. In this embodiment, a positive novolac type in which a light-absorption agent is added is used.

Then, heat treatment, which is so-called prebake, is conducted to the applied photoresist. The heat temperature of the prebake is set to 50 to 120° C., which is lower than postbake conducted later. In this embodiment, the prebake is conducted at a heat temperature of 90° C. for a heat time of 90 sec.

In the case of conducting the light-exposure, the light-exposure is conducted using a stepper subsequently to transfer the mask to the photoresist. In this embodiment, a stepper is used for a light-exposure machine. The light-exposure time needs to be 150 to 350 msec, and in this embodiment the light-exposure time is 205 msec because the gate length is required to be 0.8 μm. Besides, the light-exposure time is 320 msec when the gate length is 0.6 μm and the light-exposure time is 175 msec when the gate length is 1.0 μm. In other words, the light-exposure time can be decided by the desired gate length.

After that, a developing solution is dropped to the photoresist or sprayed from a spray nozzle to develop the light-exposed photoresist, and then heat treatment is conducted. In this embodiment, NMD-3 is used as the developing solution, and the developing time is set to 60 sec.

After that, in this embodiment, heat treatment, which is so-called postbake, is conducted to the developed photoresist at 125° C. for 180 sec. As a result, moisture and the like remaining in the resist mask can be removed and the stability against heat can be enhanced at the same time. Then, a resist mask 3110 having a tapered shape at its end portion is formed over the conductive film. The end portion of the resist mask only needs to have a tapered shape, and the shape of the resist mask may be a sector or a trapezoid.

In addition, the resist mask having a tapered shape at its end portion can also be formed by controlling the resist shape in such a way that a pattern of a light-exposure resolution limit or less is formed to the mask itself. When the resist mask has a tapered shape at its end portion, the formation of a reactive product attached to the side surface of the resist mask can be prevented in the subsequent etching process.

As shown in FIG. 15(B), the second conductive film 3109b is etched using the resist mask 3110. In this embodiment, the second conductive film 3109b is etched by a dry etching method using $CF_4$, $Cl_2$, and $O_2$ as gas. In the same way as the tapered shape of the resist mask 3110, at this time, the second conductive film 3109b has a tapered shape at its end portion. The first conductive film 3109a also serves as an etching stopper so that the gate insulating film and the semiconductor film are not etched.

The second conductive film 3109b having been etched has a gate length 3113 in the range of 0.2 μm to 1.0 μm. At this time, sometimes the resist mask 3110 also recedes by several μm. In this embodiment, the resist mask 3110 is made to recede 0.4 μm and the second conductive film having a gate length of 0.8 μm is formed.

As shown in FIG. 15(C), the first conductive film 3109a is etched with the resist mask 3110 provided. At this time, the first conductive film 3109a is etched under a condition where the selective ratio between the gate insulating film 3108 and the first conductive film 3109a is high. In this embodiment, the first conductive film 3109a is etched using $Cl_2$ as gas. Then, the gate insulating film 3108 can be kept to be a thin state, and the first conductive film 3109a can be etched. With this step, the resist mask 3110 and the second conductive film 3109b may be somewhat etched and be narrower. In this way, the gate electrode 3109, which is very small, having a gate length of 1.0 μm or less is formed.

After that, the resist mask 3110 is removed by $O_2$ ashing or resist stripping solution, and a resist mask 3115 for adding an impurity is formed. As shown in FIG. 16(A), the resist mask 3115 is formed in a region to be a p-channel TFT. Since the above description may be referred to for the manufacturing method of the resist mask, the detailed description is omitted.

Next, phosphorus (P), which is an impurity element, is added in a self-aligning manner into a region to become an n-channel TFT by using the gate electrode 319 as a mask. In this embodiment, phosphine ($PH_3$) is doped at 60 to 80 keV. Then, impurity regions 3116a to 3116c are formed in the region to be the n-channel TFT. At this time, phosphorus (P) is added to the semiconductor film so as to be homogeneous in a direction of the depth. However, because the impurity element wraps around at the time of the addition, an impurity region may be formed so as to overlap the gate electrode 3109. However, the length of the channel-length direction of the impurity region overlapping the gate electrode 3109 is set to 0.1 to 0.3 μm.

As shown in FIG. 16(B), a resist mask 3117 is formed in the region to be the n-channel TFT. After that, boron (B), which is an impurity element, is added in a region to be a p-channel TFT in a self-aligning manner using the gate electrode 3109 as a mask. In this embodiment, $B_2H_6$ is doped at 30 to 45 keV. Then, impurity regions 3118a to 3118b are formed in the region to be the p-channel TFT. After that, the resist mask 3117 is removed by $O_2$ ashing or resist stripping solution.

After that, an insulating film, which is so-called sidewalls 3119a to 3119c, is formed so as to cover the side surface of the gate electrode in FIG. 16(C). The side walls can be formed with an insulating film containing silicon by a plasma CVD method or a low-pressure CVD (LPCVD) method. In this embodiment, a silicon oxide film containing nitrogen (SiON) film is formed by a low-pressure CVD (LPCVD) method using $SiH_4$ and $N_2O$ as material gas at a pressure of 266 Pa and a temperature of 400° C. In the case of forming the sidewalls by a plasma CVD method, a silicon oxide film containing nitrogen (SiON) film can be formed using $SiH_4$ and $N_2O$ as material gas at a pressure of 133 Pa. After that, by etching the silicon oxide film containing nitrogen (SiON), a sidewall having a tapered shape is formed.

An etching condition in the case of forming the sidewall by a low-pressure CVD method is as follows. As a first etching condition, plasma is generated over several sec, for example 3 sec, by using $CHF_3$ and He as material gas. At this time, an electrode on the side opposing to the substrate disposed in the film-forming apparatus is set to 475 W, and an electrode where the substrate is disposed is set to 300 W. By the voltage applied to the electrode where the substrate is disposed, ions of the etching gas can be accelerated. As a second etching condition, voltage is applied by using $CHF_3$ and He as material gas for several tens sec, for example 60 sec. The etching time can be decided so as to end when the height of the film to be an etching object becomes a predetermined value (100 nm in this embodiment). At this time, the electrode on the side opposing to the substrate disposed in the film-forming apparatus is set to 475 W, and the electrode where the substrate is disposed is set to 300 W. As a third etching condition, voltage is applied by using $CHF_3$ and He as material gas for several tens sec, for example 31 sec, from the time when the film on the surface of the etching object is considered to disappear. At this time, the electrode on the side opposing to the substrate disposed in the film-forming apparatus is set to 50 W, and the electrode where the substrate is disposed is set to 450 W.

Moreover, the etching condition when the sidewall is formed by a plasma CVD. method is as follows. As a first etching condition, plasma is generated over several sec, for example 3 sec, by using CHF$_3$ and He as material gas. At this time, an electrode on the side opposing to the substrate disposed in the film-forming apparatus is set to 475 W, and an electrode where the substrate is disposed is set to 300 W. As a second etching condition, voltage is applied by using CHF$_3$ and He as material gas for several tens sec, for example 50 sec. The etching time can be decided so as to end when the height of the film to be an etching object becomes 100 nm. At this time, the electrode on the side opposing to the substrate disposed in the film-forming apparatus is set to 900 W, and the electrode where the substrate is disposed is set to 150 W. As a third etching condition, voltage is applied by using CHF$_3$ and He as material gas for several tens sec, for example 30 sec, from the time when the film on the surface of the etching object is considered to disappear. At this time, the electrode on the side opposing to the substrate disposed in the film-forming apparatus is set to 50 W, and the electrode where the substrate is disposed is set to 300 W.

The sidewall formed thus does not need to have a tapered shape at its end portion, and preferably has a rectangular shape. Because when the end portion of the sidewall is rectangular, it is possible to prevent the concentration of an impurity to be added next from having concentration gradation under the sidewall.

With these sidewalls 3119a to 3119c, high-concentration impurity regions 3120a to 3120c are formed in the impurity regions of the n-channel TFTs. In other words, the high-concentration impurity regions 3120a to 3120c are formed in a self-aligning manner using the gate electrode 3109 and the sidewalls 3119a to 3119c as a mask. At this time, a resist mask 3121 is formed over the p-channel TFT. In this embodiment, phosphine (PH$_3$) is doped at 15 to 25 keV and high-concentration impurity regions, which are so-called source region and drain region, are formed. After that, the resist mask 3121 is removed by O$_2$ ashing or resist stripping solution.

After that, the heat treatment is conducted to activate the impurity regions. In this embodiment, laser irradiation is conducted by the laser irradiation method described in Embodiment Modes 1 to 3 and Embodiment 1 or another laser irradiation method, thereby activating the impurity regions. Alternatively, the impurity region may be activated by heating the substrate at 550° C. in a nitrogen atmosphere.

As shown in FIG. 17(A), a first insulating film 3122 is formed covering the gate insulating film 3108 and the gate electrode 3109. The first insulating film only needs to be an insulating film containing nitrogen, and silicon nitride is formed in 100 nm thick by a plasma CVD method in this embodiment.

After that, heat treatment is conducted for hydrogenation. In this embodiment, the heat treatment is conducted at 410° C. for one hour in a nitrogen atmosphere. As a result, dangling bonds in the silicon oxide film or the silicon film are terminated with hydrogen released from silicon nitride.

Then, a second insulating film 3123 is formed so as to cover the first insulating film 3122. The second insulating film 3123 can be formed with an inorganic material (such as silicon oxide, silicon nitride, or silicon nitride containing oxygen), a photosensitive or non-photosensitive organic material (polyimide, acrylic, polyamide, polyimide-amide, resist, or benzocyclobutene), siloxane resin, or a multilayer structure of those. As the organic material, positive photosensitive organic resin or negative photosensitive organic resin can be used. For example, in the case of using the positive photosensitive acrylic as the organic material, an opening portion having curvature at its upper end portion can be formed by etching the photosensitive organic resin through light-exposure treatment by a photolithography process.

Siloxane resin corresponds to resin including a Si—O—Si bond. A skeletal structure of siloxane is constituted by a bond of silicon (Si) and oxygen (O). As the substituent, an organic group containing at least hydrogen (for example, an alkyl group or aromatic hydrocarbon) is used. As the substituent, a fluoro group may also be used. Alternatively, an organic group containing at least hydrogen and a fluoro group may be used as the substituent.

In this embodiment, a silicon oxide film containing nitrogen is formed as the second insulating film 3123 in 600 nm thick by a plasma CVD method using SiH$_4$ and N$_2$O as material gas. At this time, the substrate is heated at 300 to 450° C., and the substrate is heated at 400° C. in this embodiment.

As shown in FIG. 17(B), opening portions, which are so-called contact holes, are formed in the gate insulating film 3108, the first insulating film 3122, and the second insulating film 3123, and wirings 3125a to 3125e to connect with the impurity regions are formed. At the same time, a wiring to connect with the gate electrode is formed. At this time, in order to make the opening portion have a diameter of approximately 1.0 μm, the opening portion is preferably opened perpendicularly. For this reason, the end portion of the resist is intentionally formed so as not to be tapered. If the selective ratio between the resist and the insulating film where the contact hole is to be formed is high, the end portion of the resist may be tapered. In this embodiment, since the silicon oxide film containing nitrogen is used for the second insulating film 3123, the opening portions are formed by a dry etching method using a resist mask formed so that the end portion becomes perpendicular, in other words, formed intentionally so as not to be tapered. At this time, actually, the end portion of the resist may be tapered. Etching is conducted in such a way that CHF$_3$ and He are used as the etching gas, first etching time is set to several sec, for example 3 sec, second etching time is set in the range of 100 to 130 sec, for example 117 sec, and third etching time is set in the range of 200 to 270 sec, for example 256 sec. At this time, the flow rate of the etching gas can be determined in accordance with the etching status of the opening portion.

In the case of using an organic material or siloxane for the second insulating film 3123, a mask having higher hardness than the resist mask, for example a hard mask formed with an inorganic material such as a silicon oxide film, is preferably used in order to make the side surfaces of the opening portions perpendicular.

After that, the resist mask is removed by O$_2$ ashing or resist stripping solution.

Then, the wirings 3125a to 3125e are formed in the opening portions. As the wirings, a film formed with an element selected from aluminum (Al), titanium (Ti), molybdenum (Mo), tungsten (W), and silicon (Si), or an alloy film using these elements may be used. In this embodiment, a titanium film (Ti) of 60 nm thick, a titanium nitride film (TiN) of 40 nm thick, a titanium-aluminum alloy film (Al—Si) of 300 nm thick, and a titanium film (Ti) of 100 nm thick are stacked. After that, the films are patterned and etched into a desired shape, thereby forming wirings, which are a source electrode and a drain electrode.

Alternatively, these wirings 3125a to 3125e may be formed with an aluminum alloy film containing carbon and at least one element of nickel, cobalt, and iron. Such an aluminum alloy film can prevent the interactive diffusion of silicon and aluminum even when the aluminum alloy film contacts silicon. Further, since an oxidation-reduction reaction does not occur even when such an aluminum alloy film contacts a transparent conductive film, for example an ITO (Indium Tin Oxide) film, both can be directly contacted. Furthermore, such an aluminum alloy film has low specific resistance and high heat resistance, thereby being effective for a wiring material.

In this way, an n-channel thin film transistor having a gate length of 1.0 µm or less and an LDD structure formed so as to have a low-concentration impurity region can be formed. Moreover, a p-channel thin film transistor having a gate length of 1.0 µm or less and a single-drain structure formed so as not to have a low-concentration impurity region is completed. A TFT having a gate length of 1.0 µm or less can be referred to as a submicron TFT. Since the deterioration due to the hot carrier and the short-channel effect are difficult to occur in the p-channel thin film transistor, the single-drain structure can be employed.

In the present invention, the p-channel thin film transistor can have the LDD structure. Further, both of the n-channel thin film transistor and the p-channel thin film transistor may have, instead of the LDD structure, a GOLD structure in which the low-concentration impurity region overlaps the gate electrode.

A semiconductor device having the thin film transistor formed thus, which is a CPU in this embodiment, can be manufactured and high-speed operation at a drive voltage of 5 V and an operating frequency of 30 MHz becomes possible.

Next, an example of constituting various circuits with the above-mentioned thin film transistors is described with reference to FIG. 18.

A CPU shown in FIG. 18 mainly includes an arithmetic circuit (ALU:arithmetic logic unit) 3601, an arithmetic circuit controlling portion (ALU controller) 3602, an instruction decoding portion (Instruction Decoder) 3603, an interrupt controlling portion (Interrupt Controller) 3604, a timing controlling portion (Timing Controller) 3605, a register (Register) 3606, a register controller (Register Controller) 3607, a bus interface (Bus I/F) 3608, a rewritable ROM 3609, and a ROM interface (ROM I/F) 3620 over a substrate 3600. The ROM 3609 and the ROM I/F 3620 may be provided to another chip.

Of course, the CPU shown in FIG. 18 is just an example in which the structure is simplified, and actual CPUs have various structures according to their intended purposes.

An instruction inputted into the CPU through the bus interface 3608 is inputted into the instruction decoding portion 3603 and decoded, and then inputted into the arithmetic circuit controlling portion 3602, the interrupt controlling portion 3604, the register controlling portion 3607, and the timing controlling portion 3605.

The arithmetic circuit controlling portion 3602, the interrupt controlling portion 3604, the register controlling portion 3607, and the timing controlling portion 3605 conduct various controls based on the decoded instructions. Specifically, the arithmetic circuit controlling portion 3602 generates signals for controlling the operation of the arithmetic circuit 3601. Further, the interrupt controlling portion 3604 processes an interrupt request from the peripheral circuit or an external input/output device during the execution of a program of the CPU by judging from the priority or the mask condition. The register controlling portion 3607 generates an address of the register 3606 and reads out or writes in the register 3606 in accordance with the state of the CPU.

The timing controlling portion 3605 generates signals for controlling the timing of the operation of the arithmetic circuit 3601, the arithmetic circuit controlling portion 3602, the instruction decoding portion 3603, the interrupt controlling portion 3604, and the register controlling portion 3607. For example, the timing controlling portion 3605 is equipped with an internal clock generator that generates an internal clock signal CLK2 (3622) based on a standard clock signal CLK1 (3621) and supplies the clock signal CLK2 to the above various circuits.

Since a large substrate can be processed at one time according to the present invention, a CPU or another semiconductor device can be manufactured at low cost.

In addition, this embodiment can be freely combined with any description of Embodiment Modes 1 to 3 and Embodiment 1 if necessary.

Embodiment 6

This embodiment shows an example of manufacturing an ID chip by applying the present invention with reference to FIGS. 19(A) to 19(C), FIGS. 20(A) to 20(B), FIGS. 21(A) to 21(C), FIGS. 22(A) to 22(B), FIGS. 28(A) to 28(C), and FIGS. 29(A) to 29(B).

Although this embodiment shows an example of an isolated and insulated TFT as a semiconductor element, the semiconductor element used for an integrated circuit is not limited to this, and any circuit element can be used. For example, besides the TFT, a storage element, a diode, a photoelectric conversion element, a resistance element, a coil, a capacitor element, an inductor, and the like are typically given.

First, as shown in FIG. 19(A), a peeling layer 4501 is formed over a heat-resistant substrate (a first substrate) 4500 by a sputtering method. As the first substrate 4500, a glass substrate made of barium borosilicate glass, aluminoborosilicate glass, or the like, a quartz substrate, a ceramic substrate, or the like can be used. Although a substrate made of synthetic resin such as plastic having flexibility tends to have lower heat resistance than the above substrates, such a substrate can be used as long as the substrate can resist the treatment temperature in the manufacturing process.

As the peeling layer 4501, a layer containing silicon as its main component such as amorphous silicon, poly-crystalline silicon, single-crystal silicon, or microcrystal silicon (including semi-amorphous silicon) can be used. The peeling layer 4501 can be formed by a sputtering method, a low-pressure CVD method, a plasma CVD method, or the like. In this embodiment, amorphous silicon is formed in approximately 50 nm thick by a low-pressure CVD method and used as the peeling layer 4501. The peeling layer 4501 is not limited to silicon and may be formed with a material which can be selectively etched away. The film thickness of the peeling layer 4501 is desirably in the range of 50 to 60 nm. The thickness of the semi-amorphous silicon may be in the range of 30 to 50 nm.

A semi-amorphous semiconductor typified by semi-amorphous silicon has an intermediate characteristic between the amorphous semiconductor and the semiconductor having a crystal structure (including a single crystal and poly-crystal) and has a third state that is stable in free energy. Moreover, the semi-amorphous semiconductor is crystalline having a short-range order and lattice distortion. The semi-amorphous semiconductor can have crystal grains each having a diameter in the range of 0.5 to 20 nm that are diffused in the non-single crystal semiconductor. The semi-amorphous semiconductor have the raman spectrum shifts to the side of lower wavenumber than 520 cm$^{-1}$. According to X-ray diffraction, diffraction peaks at (111) and (220) which are assumed to result from a silicon crystal lattice are observed. In addition, in order to terminate an unbinding bond (dangling bond), hydrogen or halogen is included for at least 1 atomic % or more. The semiconductor like this is herein referred to as a semi-amorphous semiconductor (SAS) for convenience. Moreover, a fine semi-amorphous semiconductor with higher stability can be obtained by promoting the lattice distortion in such a way that a noble gas element such as helium, argon, krypton, or neon is included.

The SAS can be obtained by glow-discharging to decompose silicon source gas. As the typical silicon source gas, $SiH_4$ is given. Besides, $Si_2H_6$, $SiH_2Cl_2$, $SiHCl_3$, $SiC_4$, $SiF_4$, or the like can be used. Furthermore, when the silicon source gas is diluted with hydrogen or with gas in which hydrogen is mixed with one or a plurality of noble gas elements selected from helium, argon, krypton, and neon, the SAS can be easily formed. The silicon source gas is preferably diluted at a dilution ratio of 2 to 1000 times.

Next, a base film 4502 is formed over the peeling layer 4501. The base film 4502 is formed to prevent alkali-earth metal or alkali metal such as Na contained in the first substrate 4500 from diffusing into the semiconductor film to adversely affect the characteristic of a semiconductor element such as a TFT. The base film 4502 also has a role to protect the semiconductor element in a later step of peeling the semiconductor element. The base film 4502 may be a single layer or may have plural insulating films which have been stacked. Therefore, an insulating film that can prevent the diffusion of alkali metal or alkali-earth metal, such as silicon oxide, silicon nitride, silicon oxide containing nitrogen (SiON), or silicon nitride containing oxygen (SiNO) is used.

In this embodiment, the base film 4502 is formed by stacking a 100-nm-thick SiON film, a 50-nm-thick SiNO film, and a 100-nm-thick SiON film in order. However, the material, the film thickness, and the number of layers to be stacked of the respective films are not limited to these. For example, instead of the SiON film serving as the lower layer, siloxane resin of 0.5 to 3 μm thick may be formed by a spin coating method, a slit coater method, a droplet-discharging method, or the like. Instead of the SiNO film serving as the middle layer, a silicon nitride film ($SiN_x$, $Si_3N_4$, or the like) may be used. Instead of the SiON film serving as the upper layer, $SiO_2$ film may be used. Each film thickness is desirably set 0.05 to 3 μm, and can be freely selected from the range.

Alternatively, the lower layer of the base film 4502, which is closest to the peeling layer 4501, may be formed with a SiON film or a $SiO_2$ film, the middle layer may be formed with siloxane resin, and the upper layer may be formed with a $SiO_2$ film.

Here, the silicon oxide film can be formed by a method such as thermal CVD, plasma CVD, normal-pressure CVD, or bias ECRCVD using mixed gas of $SiH_4$ and $O_2$, or TEOS (tetra-ethoxy-silane) and $O_2$, or the like. The silicon nitride film can be formed by plasma CVD using mixed gas of typically $SiH_4$ and $NH_3$. Moreover, the silicon oxide film containing nitrogen (SiON:O>N) and the silicon nitride film containing oxygen (SiNO:N>O) can be formed by plasma CVD using mixed gas of typically $SiH_4$ and $N_2O$.

Next, a semiconductor film is formed over the base film 4502. The semiconductor film 4503 is desirably formed without being exposed to the air after forming the base film 4502. The film thickness of the semiconductor film is set to 20 to 200 nm (desirably 40 to 170 nm, preferably 50 to 150 nm). It is to be noted that the semiconductor film 4503 may be an amorphous semiconductor, a semi-amorphous semiconductor, or a poly-crystalline semiconductor. As the semiconductor, not only silicon but also silicon germanium can be used. In the case of using silicon germanium, the concentration of germanium is preferably in the range of approximately 0.01 to 4.5 atomic %.

The amorphous semiconductor can be obtained by glow-discharging to decompose silicon source gas. As the typical silicon source gas, $SiH_4$ and $Si_2H_6$ are given. This silicon source gas may be diluted with hydrogen or mixed gas of hydrogen and helium.

As thus described, the semi-amorphous semiconductor can be obtained by glow-discharging to decompose the silicon source gas. Moreover, carbide gas such as $CH_4$ or $C_2H_6$, germanium gas such as $GeH_4$ or $GeF_4$, $F_2$, or the like may be mixed into the silicon source gas so as to adjust the energy band width in the range of 1.5 to 2.4 eV or 0.9 to 1.1 eV.

For example, when a TFT is manufactured using a semi-amorphous semiconductor formed in the case of using $SiH_4$ gas with $H_2$ added or $SiH_4$ gas with $F_2$ added, the TFT can have a subthreshold coefficient (S value) of 0.35 V/sec or less, typically in the range of 0.09 to 0.25 V/sec, and a mobility of 10 $cm^2$/Vsec. When this TFT formed with the semi-amorphous semiconductor is used to form a 19-stage ring oscillator, it is possible to obtain the characteristic of a repetition rate of 1 MHz or more, preferably 100 MHz or more, at a power supply voltage from 3 to 5 V. Moreover, at a power supply voltage from 3 to 5 V, the delay time can be made 26 ns, preferably 0.26 ns or less, per one inverter.

Then, as shown in Embodiment Modes 1 to 3 and Embodiment 1, the semiconductor film 4503 is crystallized by using the laser. Alternatively, the crystallization method using the laser may be combined with a crystallization method using a catalyst element.

Before the laser crystallization, thermal annealing may be conducted for one hour at 500° C. in order to increase the resistance of the semiconductor film against the laser. Then, the semiconductor film is irradiated with the laser beam having any one of second to fourth harmonics of the fundamental wave by using a solid-state laser capable of continuous wave oscillation. Thus, a crystal having a large grain size can be obtained. For example, typically, it is desirable to use the second harmonic (532 nm) or the third harmonic (355 nm) of a Nd:$YVO_4$ laser (fundamental wave 1064 nm). Specifically, the laser beam emitted from the continuous wave $YVO_4$ laser is converted into the harmonic having an output of 10 W by a non-linear optical element. Then, the laser beam is shaped into a rectangular or elliptical laser beam on an irradiation surface through an optical system. The laser beam needs to have the power density from approximately 0.01 to 100 $MW/cm^2$ (preferably from 0.1 to 10 $MW/cm^2$).

As the laser, a continuous wave gas laser or solid-state laser can be used. As the gas laser, an Ar laser and a Kr laser are given. As the solid-state laser, a YAG laser, a $YVO_4$ laser, a YLF laser, a $YAlO_3$ laser, a $Y_2O_3$ laser, a $GdVO_4$ laser, a glass laser, a ruby laser, an alexandrite laser, a Ti:sapphire laser, and the like are given.

Moreover, the laser crystallization may be conducted by setting the repetition rate of a pulsed laser beam to 10 MHz or more, preferably 80 MHz or more, which is extremely higher than a repetition rate from several tens Hz to several hundred Hz of a pulsed laser used usually. It is said that it takes several tens nsec to several hundred nsec to solidify the semiconductor film completely after the semiconductor film is irradiated with a pulsed laser beam. Therefore, when a pulsed laser beam has the repetition rate of the above range, it is possible to irradiate the next pulsed laser beam after the semiconductor film is melted by the laser beam and before the semiconductor film is solidified. Therefore, the interface between the solid phase and the liquid phase can be moved continuously in the semiconductor film, and the semiconductor film having a crystal grain grown continuously toward the scanning direction is formed. Specifically, it is possible to form an aggregation of crystal grains each of which has a width from 10 to 30 µm in the scanning direction and a width from approximately 1 to 5 µm in a direction perpendicular to the scanning direction. It is also possible to form a semiconductor film having almost no crystal grain boundaries at least in the channel direction of the TFT by forming a crystal grain of a single crystal extending long in the scanning direction.

A semiconductor film with higher crystallinity is formed by the above laser irradiation to the semiconductor film. The semiconductor film includes a first region 4504 and a second region 4505 having different crystallinity which are formed by a center and an edge of the beam spot. The first region 4504 includes a crystal grain having a width from 10 to 30 µm in the scanning direction and a width from approximately 1 to 5 µm in a direction perpendicular to the scanning direction. On the other hand, in the second region 4505, only a microcrystal which is comparatively small and has a diameter from approximately 0.2 µm to several µm whose position and size are random tends to be formed.

Next, the first region 4504 in the crystallized semiconductor film is patterned and the second region 4505 is etched away, thereby forming island-shaped semiconductor films 4506, 4507, and 4508 from the first region 4504 as shown in FIG. 19(B).

Then, a gate insulating film 4509 is formed so as to cover the island-shaped semiconductor films 4506 to 4508. The gate insulating film 4509 can be formed with a single layer or multilayer of a film containing silicon nitride, silicon oxide, silicon oxide containing nitrogen, or silicon nitride containing oxygen by a plasma CVD method, a sputtering method, or the like. In the case of the multilayer, for example, a three-layer structure of a silicon oxide film, a silicon nitride film, and a silicon oxide film from the substrate side is preferable.

After forming the gate insulating film 4509, heat treatment may be performed under an atmosphere including hydrogen for 3 to 100% at 300 to 450° C. for 1 to 12 hours in order to hydrogenate the island-shaped semiconductor films 4506 to 4508. As another means for the hydrogenation, plasma hydrogenation (using hydrogen excited by plasma) may be performed. In the hydrogenation process, a dangling bond can be terminated by using the thermally-excited hydrogen. After pasting the semiconductor element to a second substrate having flexibility in a later step, a defect may be formed in the semiconductor film by bending the second substrate. However, in this case, the defect can be terminated by the hydrogen in the semiconductor film when the concentration of hydrogen in the semiconductor film ranges from $1\times10^{19}$ to $1\times10^{22}$ atoms/cm$^3$, preferably $1\times10^{19}$ to $5\times10^{20}$ atoms/cm$^3$, by the hydrogenation. Moreover, in order to terminate the defect, halogen may be contained in the semiconductor film.

Next, as shown in FIG. 19(C), gate electrodes 4510 to 4512 are formed. In this embodiment, the gate electrodes 4510 to 4512 are formed by stacking Si and W by a sputtering method and then etching them with the use of a resist 4513 as a mask. Of course, the materials, the structures, and the manufacturing method of these gate electrodes 4510 to 4512 are not limited to these, and they can be selected appropriately. For example, the gate electrodes 4510 to 4512 may have a multilayer structure of NiSi (nickel silicide) and Si doped with an impurity imparting n-type conductivity or a multilayer structure of TaN (tantalum nitride) and W (tungsten). Moreover, each of the gate electrodes 4510 to 4512 may be a single layer formed with various kinds of conductive materials.

A mask of SiO$_x$ or the like may be used instead of the resist mask. In this case, a step of forming a mask of SiO$_x$ or SiON (referred to as a hard mask) by patterning is added. However, since the film decrease of the mask at the etching is less than the resist, the gate electrodes 4510 to 4512 having the desired widths can be formed. Alternatively, the gate electrodes 4510 to 4512 may be formed selectively by a droplet-discharging method without using the resist 4513.

The conductive material can be selected from various materials in accordance with the function of the conductive film. When the gate electrode is formed simultaneously with an antenna, the materials may be selected in consideration of their functions.

Although mixed gas of CF$_4$, Cl$_2$, and O$_2$ or gas of Cl$_2$ is used as etching gas for forming the gate electrodes, the gas is not limited to this.

Next, as shown in FIG. 20(A), the island-shaped semiconductor film 4507 to become a p-channel TFT is covered by a resist 4515, and then the island-shaped semiconductor films 4506 and 4508 are doped at low concentration with an impurity element imparting n-type (typically, P (phosphorus) or As (arsenic)) by using the gate electrodes 4510 and 4512 as the mask (a first doping step). The first doping step is performed under a condition where the dosage ranges from $1\times10^{13}$ to $6\times10^{13}$/cm$^2$ and the accelerating voltage ranges from 50 to 70 keV. However, the condition is not limited to this. In this first doping step, the doping is performed through the gate insulating film 4509, and a pair of low-concentration impurity regions 4516 and 4517 is formed in the island-shaped semiconductor films 4506 and 4508. It is to be noted that the first doping step may be performed without covering the island-shaped semiconductor film 4507 to be the p-channel TFT by the resist.

Next, as shown in FIG. 20(B), after removing the resist 4515 by ashing or the like, a resist 4518 is newly formed so as to cover the island-shaped semiconductor films 4506 and 4508 to be n-channel TFTs. Then, the island-shaped semiconductor film 4507 is doped with an, impurity element imparting p-type (typically B (boron)) at high concentration by using the gate electrode 4511 as a mask (a second doping step). The second doping step is performed under a condition where the dosage ranges from $1\times10^{16}$ to $3\times10^{16}$/cm$^2$ and the accelerating voltage ranges from 20 to 40 keV. In the second doping step, the doping is performed through the gate insulating film 4509, and a pair of p-type high-concentration impurity regions 4520 is formed in the island-shaped semiconductor film 4507.

Next, as shown in FIG. 28(A), after removing the resist 4518 by ashing or the like, an insulating film 4521 is formed so as to cover the gate insulating film 4509 and the gate electrodes 4510 to 4512. In this embodiment, a SiO$_2$ film is formed in 100 nm thick by a plasma CVD method. After that, the insulating film 4521 and the gate insulating film 4509 are partially etched by an etch-back method to form sidewalls 4522 to 4524 in contact with the side walls of the gate electrodes 4510 to 4512 in a self-aligning manner (self align) as shown in FIG. 28(B). Mixed gas of CHF$_3$ and He is used as the etching gas. It is noted that the step for forming the sidewall is not limited to this.

In the case where the insulating film is also formed over a rear surface of the substrate when the insulating film 4521 is formed, the insulating film formed over the rear surface of the substrate may be selectively etched away using the resist. In this case, the resist to be used may be etched away together with the insulating film 4521 and the gate insulating film 4509 when the sidewall is formed by the etch-back method.

Next, as shown in FIG. 28(C), a resist 4526 is newly formed so as to cover the island-shaped semiconductor film 4507 to be the p-channel TFT. Then, an impurity element imparting n-type (typically P or As) is doped at high concentration by using the gate electrodes 4510 and 4512 and the sidewalls 4522 and 4524 as the mask (a third doping step). The third doping step is performed under a condition where the dosage ranges from $1 \times 10^{13}$ to $5 \times 10^{15}/cm^2$ and the accelerating voltage ranges from 60 to 100 keV. In the third doping step, the doping is performed through the gate insulating film 4509, and a pair of n-type high-concentration impurity regions 4527 and 4528 is formed in the island-shaped semiconductor films 4506 and 4508.

It is to be noted that the sidewalls 4522 and 4524 will serve as the mask when a low-concentration impurity region or a non-doped off-set region is formed under the sidewalls 4522 and 4524 by doping an impurity imparting n-type at high concentration. Therefore, in order to control the width of the low-concentration impurity region or the off-set region, the size of the sidewalls may be adjusted by appropriately changing the condition of the etch-back method and the condition for forming the sidewall.

After removing the resist 4526 by ashing or the like, thermal activation of the impurity region may be performed. For example, after forming a SiON film having a thickness of 50 nm, heat treatment may be performed for four hours under a nitrogen atmosphere at 550° C. When a $SiN_x$ film containing hydrogen is formed in 100 nm thick and then heat treatment is performed thereto for one hour under a nitrogen atmosphere at 410° C., a defect in the poly-crystalline semiconductor film can be improved. This is for the purpose of terminating the dangling bond existing in, for example, the poly-crystalline semiconductor film and is called a hydrogenation treatment step or the like.

According to a series of the above-mentioned steps, an n-channel TFT 4530, a p-channel TFT 4531, and an n-channel TFT 4532 are formed. When the size of the sidewall is adjusted by changing the condition of the etch-back method appropriately in these manufacturing steps, a TFT having a channel length of 0.2 μm to 2 μm can be formed. Although the TFTs 4530 to 4532 have a top-gate structure in this embodiment, a bottom-gate structure (reversely-staggered structure) is also applicable.

After that, a passivation film may be formed to protect the TFTs 4530 to 4532. It is desirable that the passivation film be formed with silicon nitride, silicon oxide containing nitrogen, aluminum nitride, aluminum oxide, silicon oxide, or the like which can prevent the intrusion of alkali metal or alkali-earth metal into the TFTs 4530 to 4532. Specifically, for example, a SiON film having a thickness of approximately 600 nm can be used as the passivation film. In this case, the hydrogenation treatment step may be performed after forming the SiON film. In this way, three layers of SiON, $SiN_x$, and SiON are formed over the TFTs 4530 to 4532. However, the structure and the materials of these films are not limited to these. With the above structure, since the TFTs 4530 to 4532 are covered by the base film 4502 and the passivation film, it is possible to further prevent alkali-earth metal or alkali metal such as Na from diffusing into the semiconductor film to be used for the semiconductor element to have an adverse effect on the characteristic of the semiconductor element.

Next, a first interlayer insulating film 4533 is formed so as to cover the TFTs 4530 to 4532. The first interlayer insulating film 4533 can be formed with organic resin having heat resistance such as polyimide, acrylic, or polyamide. In addition to the above organic resin, a low dielectric-constant material (low-k material), siloxane resin, or the like can be used.

Siloxane resin corresponds to resin including a Si—O—Si bond. A skeletal structure of siloxane is constituted by a bond of silicon (Si) and oxygen (O). As the substituent, an organic group containing at least hydrogen (for example, an alkyl group or aromatic hydrocarbon) is used. As the substituent, a fluoro group may be used. Moreover, an organic group containing at least hydrogen and a fluoro group may be used as the substituent.

The first interlayer insulating film 4533 can be formed by spin coating, dipping, spray coating, a droplet-discharging method (an ink-jet method, screen printing, offset printing, or the like), a doctor's knife, a roll coater, a curtain coater, a knife coater, or the like in accordance with the material. An inorganic material may also be employed. In such a case, silicon oxide, silicon nitride, silicon oxynitride, PSG (phosphosilicate glass), BPSG (borophosphosilicate glass), an alumina film, or the like can be used. Moreover, the first interlayer insulating film 4533 may be formed by stacking these insulating films.

In this embodiment, a second interlayer insulating film 4534 is formed over the first interlayer insulating film 4533. The second interlayer insulating film 4534 can be formed with a film containing carbon such as DLC (diamond-like carbon) or CN (carbon nitride), a silicon oxide film, a silicon nitride film, a silicon oxide film containing nitrogen, or the like by a plasma CVD method, atmospheric-pressure plasma, or the like. Alternatively, the second interlayer insulating film 4534 may be formed with siloxane resin, a photosensitive or non-photosensitive organic material such as polyimide, acrylic, polyamide, resist, or benzocyclobutene, or the like.

A filler may be mixed into the first interlayer insulating film 4533 or the second interlayer insulating film 4534 in order to prevent the first interlayer insulating film 4533 or the second interlayer insulating film 4534 from peeling and being damaged due to the stress caused by the difference of the coefficient of thermal expansion between the conductive material for constituting the wiring to be formed afterward and the first interlayer insulating film 4533 or the second interlayer insulating film 4534.

Next, as shown in FIG. 29(A), contact holes are formed in the first interlayer insulating film 4533, the second interlayer insulating film 4534, and the gate insulating film 4509, and wirings 4535 to 4539 to connect with the TFTs 4530 to 4532 are formed. Although mixed gas of $CHF_3$ and He is used as the etching gas for forming the contact holes, the gas is not limited to this. In this embodiment, each of the wirings 4535 to 4539 has a five-layer structure formed by stacking Ti, TiN, Al—Si, Ti, and TiN according to a sputtering method and then patterning them.

By mixing Si into Al, it is possible to prevent the generation of hillocks when baking the resist to pattern the wirings. Cu may be mixed for approximately 0.5% instead of Si. When an Al—Si layer is sandwiched by Ti or TiN, the resistance against the hillock is improved further. It is desirable to use the hard mask formed with SiON or the like at the patterning. The material and the manufacturing process of the wirings are not limited to the above, and the above-mentioned material used as the gate electrode may be employed.

These wirings 4535 to 4539 may be formed with an aluminum alloy film containing carbon and at least one element of nickel, cobalt, and iron. Such an aluminum alloy film can prevent the interactive diffusion of silicon and aluminum even when the aluminum alloy film contacts silicon. Since an oxidation-reduction reaction does not occur even when such an aluminum alloy film contacts a transparent conductive film, for example an ITO (Indium Tin Oxide) film, both can be directly contacted. Further, such an aluminum alloy film has low specific resistance and high heat resistance, thereby being effective for a wiring material.

It is to be noted that the wirings 4535 and 4536 are connected to the high-concentration impurity region 4527 of the n-channel TFT 4530, the wirings 4536 and 4537 are connected to the high-concentration impurity region 4520 of the p-channel TFT 4531, and the wirings 4538 and 4539 are connected to the high-concentration impurity region 4528 of the n-channel TFT 4532, respectively. Moreover, the wiring 4539 is also connected to the gate electrode 4512 of the n-channel TFT 4532. The n-channel TFT 4532 can be used as a memory element of a random ROM.

Next, as shown in FIG. 29(B), a third interlayer insulating film 4541 is formed over the second interlayer insulating film 4534 so as to cover the wirings 4535 to 4539. The third interlayer insulating film 4541 is formed so as to have an opening portion at the location for partially exposing the wiring 4535. The third interlayer insulating film 4541 can be formed with the same material as the first interlayer insulating film 4533.

Next, an antenna 4542 is formed over the third interlayer insulating film 4541. The antenna 4542 can be formed with a conductive material having one or a plurality of metal such as Ag, Au, Cu, Pd, Cr, Mo, Ti, Ta, W, Al, Fe, Co, Zn, Sn, or Ni or metal compounds. The antenna 4542 is connected to the wiring 4535. Although the antenna 4542 is directly connected to the wiring 4535 in FIG. 29(B), the ID chip of the present invention is not limited to this structure. For example, the antenna 4542 may be electrically connected with the wiring 4535 by using wirings separately formed.

The antenna 4542 can be formed by a printing method, a photolithography method, an evaporation method, a droplet-discharging method, or the like. In this embodiment, the antenna 4542 is formed with a single layer of a conductive film. However, the antenna 4542 can be formed by stacking a plurality of conductive films. For example, the antenna 4542 may be formed with a Ni wiring coated with Cu by electroless plating.

The droplet-discharging method is a method for forming a predetermined pattern by discharging a droplet including a predetermined composition from a small nozzle. An ink-jet method and the like are included in its category. On the other hand, the printing method includes a screen printing method, an offset printing method, and the like. When the printing method or the droplet-discharging method is employed, the antenna 4542 can be formed without using the mask for the light exposure. Moreover, when the printing method or the droplet-discharging method is employed, unlike the photolithography method, the material that will be etched away can be saved. Moreover, since the expensive mask for the light exposure is not necessary, the cost for manufacturing an ID chip can be reduced.

In the case of employing the droplet-discharging method or various kinds of printing methods, for example, a conductive particle of Cu coated with Ag can also be used. When the antenna 4542 is formed by the droplet-discharging method, it is desirable to perform a process for improving the adhesiveness of the antenna 4542 to a surface of the third interlayer insulating film 4541.

As methods to improve the adhesiveness, specifically, a method in which metal or a metal compound that can improve the adhesiveness of the conductive film or the insulating film due to the catalyst action is attached to the surface of the third interlayer insulting film 4541, a method in which an organic insulating film, metal, or a metal compound having high adhesiveness to the conductive film or the insulating film to be formed is attached to the surface of the third interlayer insulating film 4541, a method in which a plasma process is performed to the surface of the third interlayer insulating film 4541 under atmospheric pressure or low pressure so that the surface thereof is modified, or the like is given. As the metal having high adhesiveness to the conductive film or the insulating film, titanium; titanium oxide; a 3d transition element such as Sc, Ti, V, Cr, Mn, Fe, Co, Ni, Cu, or Zn; or the like is given. As the metal compound, an oxide, a nitride, an oxynitride, or the like of the above-mentioned metal is given. As the organic insulating film, for example, polyimide, siloxane resin, or the like is given.

When the metal or the metal compound attached to the third interlayer insulating film 4541 is conductive, the sheet resistance is controlled so that the normal operation of the antenna is not interrupted. Specifically, the average thickness of the conductive metal or metal compound may be controlled so as to range from 1 to 10 nm, for example. Moreover, the metal or the metal compound may be insulated partially or totally by oxidization. Alternatively, the metal or the metal compound attached to the region in which the adhesiveness is not necessary may be etched away selectively. The metal or the metal compound may be attached selectively only to a particular region by a droplet-discharging method, a printing method, or a sol-gel method instead of attaching the metal or the metal compound all over the substrate. The metal or the metal compound is not necessarily a totally continuous film over the surface of the third interlayer insulating film 4541 but may be dispersed to some extent.

Then, as shown in FIG. 21(A), after forming the antenna 4542, a protective layer 4545 is formed over the third interlayer insulating film 4541 so as to cover the antenna 4542. The protective layer 4545 is formed with a material capable of protecting the antenna 4542 when the peeling layer 4501 is etched away afterward. For example, the protective layer 4545 can be formed by applying epoxy resin, acrylate resin, or silicon resin which can dissolve in water or alcohols all over the substrate.

In this embodiment, the protective layer 4545 is formed in such a way that water-soluble resin (VL-WSHL10 manufactured by Toagosei Co., Ltd.) is applied in 30 μm thick by a spin coating method, light exposure is made for 2 minutes in order to cure the resin tentatively, and then the resin is irradiated with UV light from the backside of the substrate for 2.5 minutes and from the topside of the substrate for 10 minutes, that is 12.5 minutes in total, in order to cure the resin completely. In the case where a plurality of organic resin is stacked, the adhesiveness may become too high or the organic resin may melt partially when being applied or baked, depending on the solvent to be used. Therefore, when the third interlayer insulating film 4541 and the protective layer 4545 are formed with the organic resin which can be dissolved in the same solvent, it is preferable to form an inorganic insulating film (a $SiN_x$ film, a $SiN_xO_y$ film, an $AlN_x$ film, or an $AlN_xO_y$ film) over the third interlayer insulating film 4541 so that the protective layer 4545 can be removed smoothly in the later step.

Next, as shown in FIG. 21(B), a groove 4546 is formed in order to divide the ID chips. The groove 4546 may have the depth of such a degree that the peeling layer 4501 is exposed. The groove 4546 can be formed by dicing or scribing. It is to be noted that the groove 4546 is not necessarily formed when it is not required to divide the ID chips formed over the first substrate 4500.

Next, as shown in FIG. 21(C), the peeling layer 4501 is etched away. In this embodiment, halide, for example halogen fluoride as etching gas is introduced from the groove 4546. In this embodiment, for example, $ClF_3$ (chlorine trifluoride) is used under a condition where the temperature is 350° C., the flow rate is 300 sccm, the air-pressure is 798 Pa, and the time is 3 h (3 hours). Moreover, gas in which nitrogen is mixed into $ClF_3$ gas may be used. The peeling layer 4501 can be selectively etched by using the halogen fluoride such as $ClF_3$ so that the TFTs 4530 to 4532 can be peeled from the first substrate 4500. The halogen fluoride may be either gas or liquid.

Next, as shown in FIG. 22(A), the peeled TFTs 4530 to 4532 and the antenna 4542 are pasted to a second substrate 4551 by using an adhesive agent 4550. The adhesive agent 4550 is formed with a material which can paste the second substrate 4551 and the base film 4502. As the adhesive agent 4550, various kinds of curable adhesive agents can be employed: for example, a reactive-curable type adhesive agent, a thermal-curable type adhesive agent, a photo-curable type adhesive agent such as a UV-curable type adhesive agent, or an anaerobic type adhesive agent.

The second substrate 4551 can be formed with a flexible organic material such as paper or plastic. Moreover, a flexible inorganic material may be used as the second substrate 4551. The plastic substrate may be formed with ARTON (manufactured by JSR) containing polynorbornene having a polar group. Moreover, polyester typified by polyethylene terephthalate (PET), polyether sulfone (PES), polyethylene naphthalate (PEN), poly carbonate (PC), nylon, polyetheretherketone (PEEK), polysulfone (PSF), polyetherimide (PEI), polyarylate (PAR), polybutylene terephthalate (PBT), polyimide, acrylnitrile-butadiene-styrene resin, polyvinyl chloride, polypropylene, polyvinyl acetate, acrylic resin, or the like can be given. It is desirable that the second substrate 4551 has heat conductivity as high as approximately 2 to 30 W/mK in order to diffuse the heat generated in the integrated circuit.

As shown in FIG. 22(B), after removing the protective layer 4545, an adhesive agent 4552 is applied onto the third interlayer insulating film 4541 so as to cover the antenna 4542, and then a cover member 4553 is pasted. As the cover member 4553, a flexible organic material such as paper or plastic can be used like the second substrate 4551. The thickness of the adhesive agent 4552 may be set, for example, in the range of 10 to 200 μm.

The adhesive agent 4552 is formed with a material which can paste the cover member 4553 with the third interlayer insulating film 4541 and the antenna 4542. As the adhesive agent 4552, various kinds of curable adhesive agents can be used: for example, a reactive-curable type adhesive agent, a thermal-curable type adhesive agent, a photo-curable type adhesive agent such as a UV-curable type adhesive agent, or an anaerobic type adhesive agent.

According to the above-mentioned steps, the ID chip is completed. Through the above manufacturing method, an extremely thin integrated circuit having the total thickness in the range of 0.3 to 3 μm, typically about 2 μm, can be formed between the second substrate 4551 and the cover member 4553. The thickness of the integrated circuit includes not only the thickness of the semiconductor element itself but also the thickness of various insulating films and interlayer insulating films formed between the adhesive agent 4550 and the adhesive agent 4552. The integrated circuit in the ID chip can be made to have a length of 5 mm or less on a side (25 mm² or less), more preferably in the range of approximately 0.3 mm (0.09 mm²) to 4 mm (16 mm²) on a side.

The mechanical strength of the ID chip can be increased by providing the integrated circuit closer to the center between the second substrate 4551 and the cover member 4553. Specifically, it is desirable to control the thicknesses of the adhesive agents 4550 and 4552 so that the distance between the second substrate 4551 and the center in the direction of the thickness of the integrated circuit satisfies the following formula 2 where d is the distance between the second substrate 4551 and the cover member 4553.

$$\frac{1}{2}d - 30 \ \mu m > x > \frac{1}{2}d + 30 \ \mu m \qquad \text{[formula 2]}$$

It is preferable to control the thicknesses of the adhesive agents 4550 and 4552 so as to satisfy the following formula 3.

$$\frac{1}{2}d - 10 \ \mu m > x > \frac{1}{2}d + 10 \ \mu m \qquad \text{[formula 3]}$$

Although FIG. 22(B) shows an example of using the cover member 4553, the present invention is not limited to this structure. For example, the step shown in FIG. 22(A) may be the end.

Although this embodiment has described the example in which the first substrate 4500 having high heat resistance and the integrated circuit are peeled by etching away the peeling layer provided between the substrate and the integrated circuit, a method for manufacturing the ID chip of the present invention is not limited to this structure. For example, a metal oxide film may be provided between the integrated circuit and the substrate having high heat resistance, and the metal oxide film may be weakened by crystallization so that the integrated circuit is peeled. Alternatively, the peeling layer formed with an amorphous semiconductor film containing hydrogen may be provided between the integrated circuit and the substrate having high heat resistance, and the peeling layer may be removed by the laser beam irradiation. Alternatively, the integrated circuit may be separated from the substrate by mechanically removing the substrate having high heat resistance over which the integrated circuit is formed or by etching away the substrate using solution or gas.

When the adhesive agent 4550 in contact with the base film 4502 is formed with organic resin in order to secure the flexibility of the ID chip, the diffusion of alkali-earth metal or alkali metal such as Na from the organic resin into the semiconductor film can be prevented by using a silicon nitride film or a silicon oxide film containing nitrogen as the base film 4502.

When an object has a curved surface and the second substrate 4551 of the ID chip pasted to the curved surface bends so as to have a curved surface drawn by moving a generatrix line of a conical surface, a cylindrical surface, or the like, it is desirable to conform the direction of the generatrix line to the direction in which the carrier of the TFTs 4530 to 4532 moves. With the above structure, it is possible to prevent the bending of the second substrate 4551 from affecting the characteristics of the TFTs 4530 to 4532. When the proportion of the area of the island-shaped semiconductor films in the integrated circuit is 1 to 30%, it is possible to further suppress the effect on the characteristics of the TFTs 4530 to 4532 due to the bending of the second substrate 4551.

Although this embodiment has described the example for forming the antenna over the same substrate as the integrated circuit, the present invention is not limited to this structure. The antenna and the integrated circuit each of which is formed over a different substrate may be pasted to each other afterward so that they are connected electrically.

The frequency of the electric wave usually used in the ID chip is 13.56 MHz or 2.45 GHz, and it is very important to form the ID chip so that these frequencies of the electric wave can be detected in order to enhance the versatility.

The ID chip of this embodiment has advantages in that the electric wave is hard to be blocked compared to the ID chip formed on a semiconductor substrate and that attenuation of signals due to the block of the electric wave can be prevented. Since the semiconductor substrate is not necessary, the cost for manufacturing the ID chip can be reduced drastically. For example, a silicon substrate having a diameter of 12 inch is compared with a glass substrate having a size of 730×920 mm$^2$. The former silicon substrate has an area of approximately 73000 mm$^2$ while the latter glass substrate has an area of approximately 672000 mm$^2$. Therefore, the glass substrate is approximately 9.2 times larger than the silicon substrate. From the glass substrate having an area of approximately 672000 mm$^2$, approximately 672000 number of ID chips each of which has a length of 1 mm on a side can be obtained when the area consumed by dividing the substrate is ignored. The number of ID chips is approximately 9.2 times larger than that formed on the silicon substrate. Moreover, the business investment for the mass production of the ID chip in the case of using the glass substrate having an area of 730×920 mm$^2$ can be decreased to be ⅓ of that for manufacturing the ID chip on the silicon substrate having a diameter of 12 inch because the number of steps can be decreased. Moreover, according to the present invention, after peeling the integrated circuit, the glass substrate can be reused. Even after considering all the costs for compensating a damaged glass substrate and washing the surface of the glass substrate, the cost can be decreased drastically compared with the case of using the silicon substrate. Although the glass substrate is disposed without being reused, the cost of the glass substrate having a size of 730×920 mm$^2$ is about a half of that of the silicon substrate having a diameter of 12 inch. Therefore, it is understood that the cost for the ID chip can be reduced drastically.

As a result, when the glass substrate having an area of 730×920 mm$^2$ is used, the price of the ID chip can be made approximately ⅟30 of that formed on the silicon substrate having a diameter of 12 inch. Since the ID chip is expected to be used as a disposable chip, an ID chip of the present invention in which the cost can be drastically decreased is very advantageous in the above application.

Although this embodiment has described the example in which the peeled integrated circuit is pasted to the flexible substrate, the present invention is not limited to this structure. For example, when a substrate having allowable temperature limit which can resist heat treatment in the manufacturing steps for the integrated circuit, such as a glass substrate, is used, the integrated circuit is not necessarily peeled.

This embodiment can be freely combined with any description of Embodiment Modes 1 to 3 and Embodiment 1.

Embodiment 7

As electric appliances to which the present invention is applicable, a video camera, a digital camera, a goggle-type display, a navigation system, a sound reproduction device (a car audio composition or the like), a computer, a game machine, a mobile information terminal (a mobile computer, a mobile phone, a mobile game machine, an electronic book, or the like), an image reproduction device equipped with a recording medium (specifically, a device which can reproduce a recording medium such as Digital Versatile Disk (DVD) and has a display for displaying the image), and the like are given. Specific examples of these electric appliance are shown in FIGS. 23(A) to 23(D) and FIGS. 24(A) to 24(D).

FIG. 23(A) shows a light-emitting display device, which corresponds to a television receiving device or the like. A case 5001, a display portion 5003, speaker portions 5004, and the like are included. The present invention can be applied to the display portion 5003, a control circuit portion, and the like. In a pixel portion, a polarizing plate or a circular polarizing plate is preferably provided in order to enhance the contrast. For example, films are preferably provided in order of a quarter-waveplate, a half-waveplate, and a polarizing plate to a seal substrate. An anti-reflection film may be provided over the polarizing plate. By employing the present invention, the reliability and the display quality are increased. When the ID chip manufactured according to Embodiment 6 is pasted to this light-emitting display device, a circulation route and the like can be clarified.

FIG. 23(B) shows a liquid crystal display or an OLED display, including a case 5101, a supporting stand 5102, a display portion 5103, and the like. The present invention is applicable to the display portion 5103, a control circuit portion, and the like. The reliability and the display quality are increased by employing the present invention. Further, when the ID chip manufactured according to Embodiment 6 is pasted to this light-emitting display device, a circulation route and the like can be clarified.

FIG. 23(C) shows a mobile phone including a main body 5201, a case 5202, a display portion 5203, an audio input portion 5204, an audio output portion 5205, operation keys 5206, an antenna 5208, and the like. The present invention can be applied to the display portion 5203, a control circuit portion, and the like. The reliability and the display quality are increased by employing the present invention. Further, when the ID chip manufactured according to Embodiment 6 is pasted to this light-emitting display device, a circulation route and the like can be clarified.

FIG. 23(D) shows a note-type personal computer including a main body 5301, a case 5302, a display portion 5303, a keyboard 5304, an external connection port 5305, a pointing mouse 5306, and the like. The present invention can be applied to the display portion 5303, a circuit portion, and the like. The reliability and the display quality are increased by employing the present invention. Further, when the ID chip manufactured according to Embodiment 6 is pasted to this light-emitting display device, a circulation route and the like can be clarified.

FIG. 24(A) shows a mobile computer including a main body 6001, a display portion 6002, a switch 6003, operation keys 6004, an infrared port 6005, and the like. The present invention can be applied to the display portion 6002, a control circuit portion, and the like. The reliability and the display quality are increased by employing the present invention. Further, when the ID chip manufactured according to Embodiment 6 is pasted to this light-emitting display device, a circulation route and the like can be clarified.

FIG. 24(B) shows a mobile game machine including a case 6101, a display portion 6102, a speaker portion 6103, operation keys 6104, a recording medium inserting portion 6105, and the like. The present invention can be applied to the display portion 6102, a control circuit portion, and the like. The reliability and the display quality are increased by employing the present invention. Further, when the ID chip manufactured according to Embodiment 6 is pasted to this light-emitting display device, a circulation route and the like can be clarified.

FIG. 24(C) shows a mobile image reproduction device (specifically a DVD reproduction device) equipped with a recording medium, including a main body 6201, a case 6202, a display portion A 6203, a display portion B 6204, a recording medium (DVD or the like) reader 6205, operation keys 6206, speaker portions 6207, and the like. The display portion A 6203 mainly displays image information, while the display portion B 6204 mainly displays letter information. The present invention can be applied to the display portion A 6203, the display portion B 6204, a control circuit portion, and the like. The image reproduction device equipped with a recording medium includes a home-use game machine. The reliability and the display quality are increased by employing the present invention. Further, when the ID chip manufactured according to Embodiment 6 is pasted to this light-emitting display device, a circulation route and the like can be clarified.

FIG. 24(D) shows a TV in which only a display is portable wirelessly. A battery and a signal receiver are built in a case 6302. With the battery, a display portion 6303 and speaker portions 6307 are driven. The battery can be charged repeatedly by a battery charger 6300. Moreover, the battery charger 6300 can send and receive an image signal, and can send the image signal to the signal receiver of the display. The case 6302 is controlled by the operation keys 6306. The device shown in FIG. 24(D) is also referred to as an image-audio two-way communication device because the signal can also be sent from the case 6302 to the battery charger 6300 by operating the operation keys 6306. Moreover, the communication control of another electric appliance is also possible by sending the signal from the case 6302 to the battery charger 6300 and having another electric appliance receive the signal which the battery charger 6300 can send, by operating the operation keys 6306; therefore, it is also referred as a multipurpose remote control device. The present invention can be applied to the display portion 6303, a control circuit portion, and the like. The reliability and the display quality are increased by employing the present invention. Further, when the ID chip manufactured according to Embodiment 6 is pasted to this light-emitting display device, a circulation route and the like can be clarified.

The display devices used in these electric appliances can use not only a glass substrate but also a heat-resistant plastic substrate in accordance with the size, the strength, and the intended purpose. This can achieve further lightness in weight.

The example shown in this embodiment is just an example, and it is not limited to these applications.

This embodiment can be freely combined with any description of Embodiment Modes 1 to 3 and Embodiments 1 to 6.

Embodiment 8

With reference to FIGS. 30(A) and 30(B), this embodiment shows an example of using a polygon rotator instead of the cylindrical rotator 101 shown in FIG. 1. In FIGS. 30(A) to 30(B), the same things as those in FIG. 1 are denoted with the same reference numerals.

In FIG. 30(A), the rotator is hexagonal. The substrate 100 is fixed onto a rotator 801 having a rotational axis 802, and the semiconductor film 102 formed over the substrate 100 is irradiated with a linear laser beam. Further, FIG. 30(B) shows an octagonal rotator 803 having a rotational axis 804.

In each of FIGS. 30(A) and 30(B), the plane of the rotator on which the substrate is provided has corners (projected sides) 811 and 812. The laser irradiation can be conducted without any problems unless the substrate is fixed onto the corners.

The present embodiment can be freely combined with any description of Embodiment Modes 1 to 3 and Embodiments 1 to 7 if necessary.

INDUSTRIAL APPLICABILITY

According to the present invention, a laser process apparatus which generates little vibration and which can process many substrates at one time can be provided. By using a laser process apparatus of the present invention, the reliability and the quality of a semiconductor device can be increased. Furthermore, such a semiconductor device can be mass-produced in short time.

BRIEF DESCRIPTION OF THE DRAWINGS

FIG. 5 Drawings for showing steps of manufacturing a semiconductor device according to the present invention.

FIG. 7 Drawing for showing steps of manufacturing a liquid crystal display device according to the present invention.

FIG. 13 Drawings for showing steps of manufacturing an EL display device according to the present invention.

FIG. 16 Drawings for showing steps of manufacturing a CPU according to the present invention.

FIG. 19 Drawing for showing steps of manufacturing an ID chip according to the present invention.

FIG. 23 Drawings for showing examples of electric appliances to which the present invention is applied.

Figure 1:
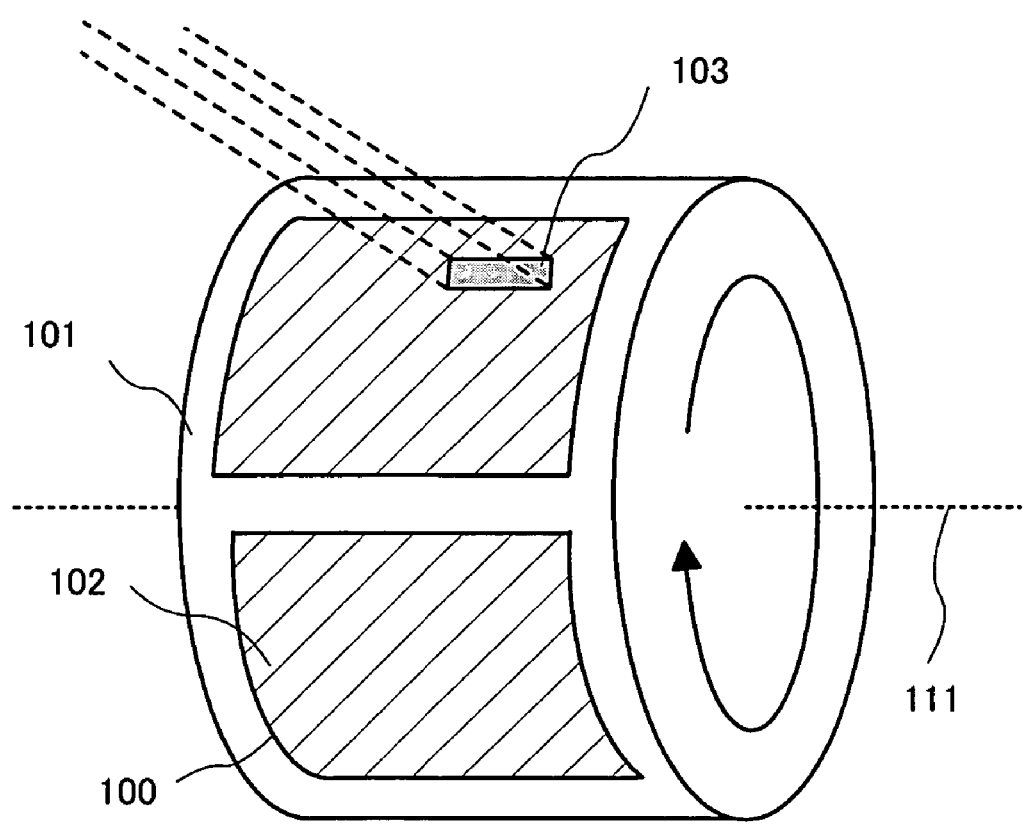
FIG. 1 A drawing for showing a laser process apparatus according to the present invention.
Figure 2:
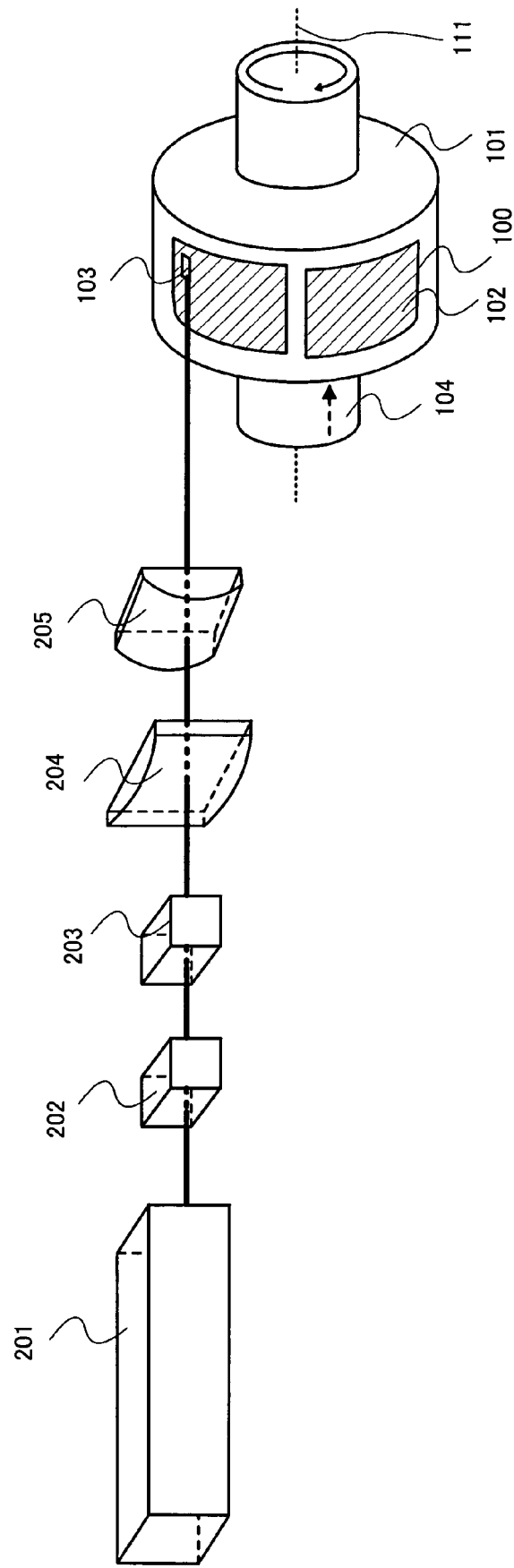
FIG. 2 A drawing for showing a laser process apparatus according to the present invention.
Figure 3:
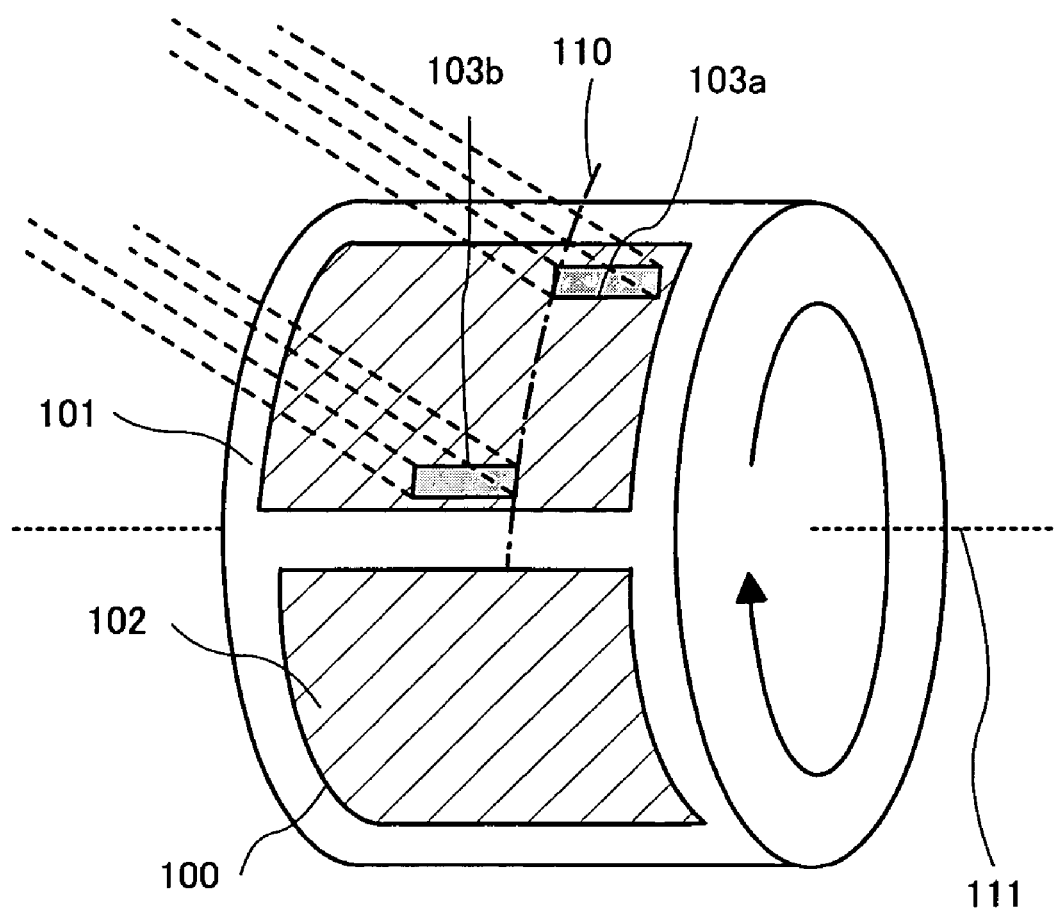
FIG. 3 A drawing for showing a laser process apparatus according to the present invention.
Figure 4:
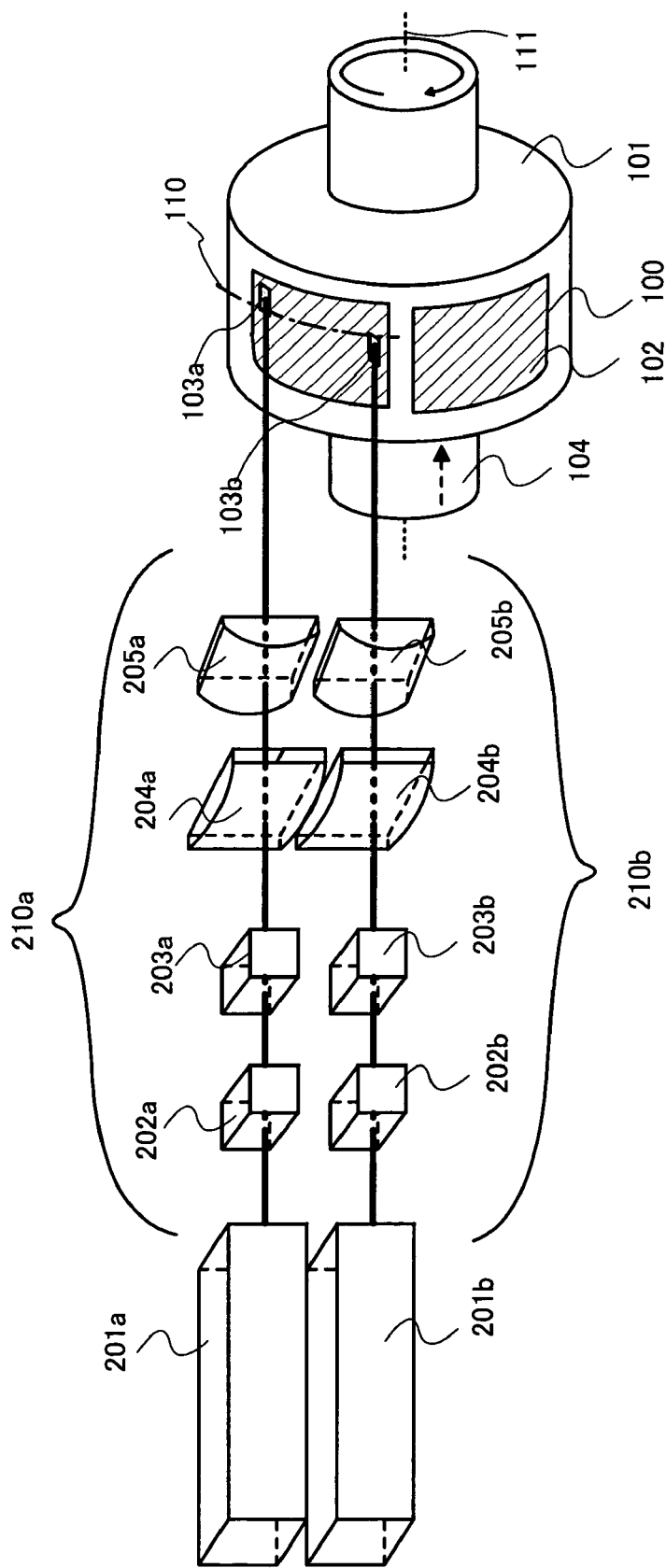
FIG. 4 A drawing for showing a laser process apparatus according to the present invention.
Figure 6A:
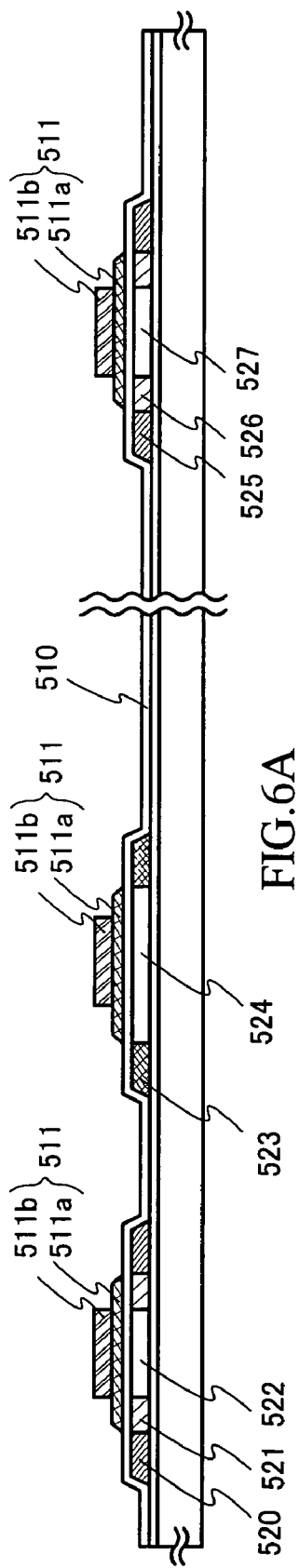
FIG. 6 Drawings for showing steps of manufacturing a semiconductor device according to the present invention.
Figure 6B:
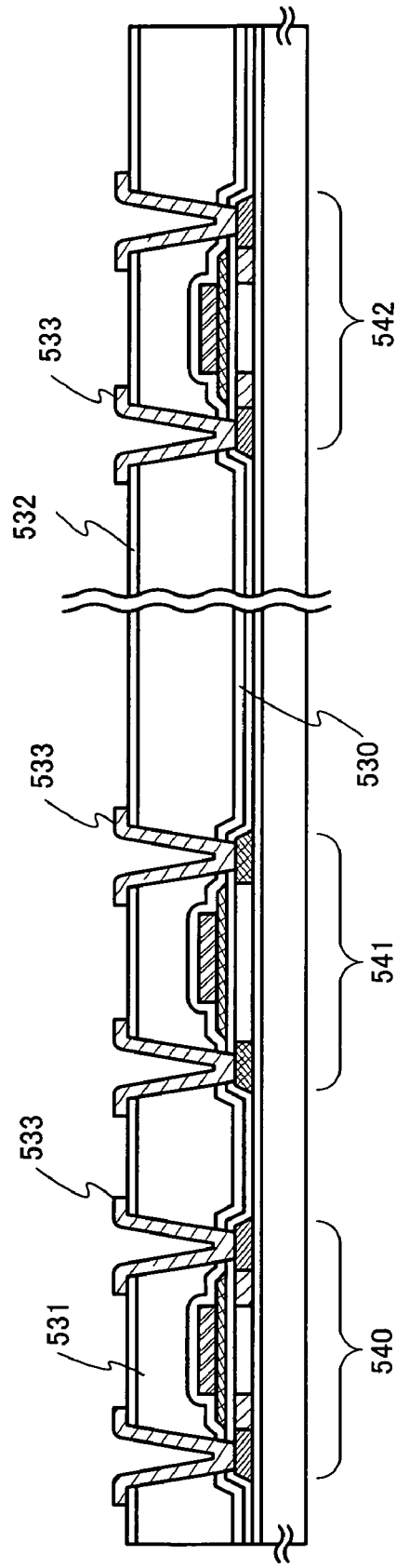
Figure 8:
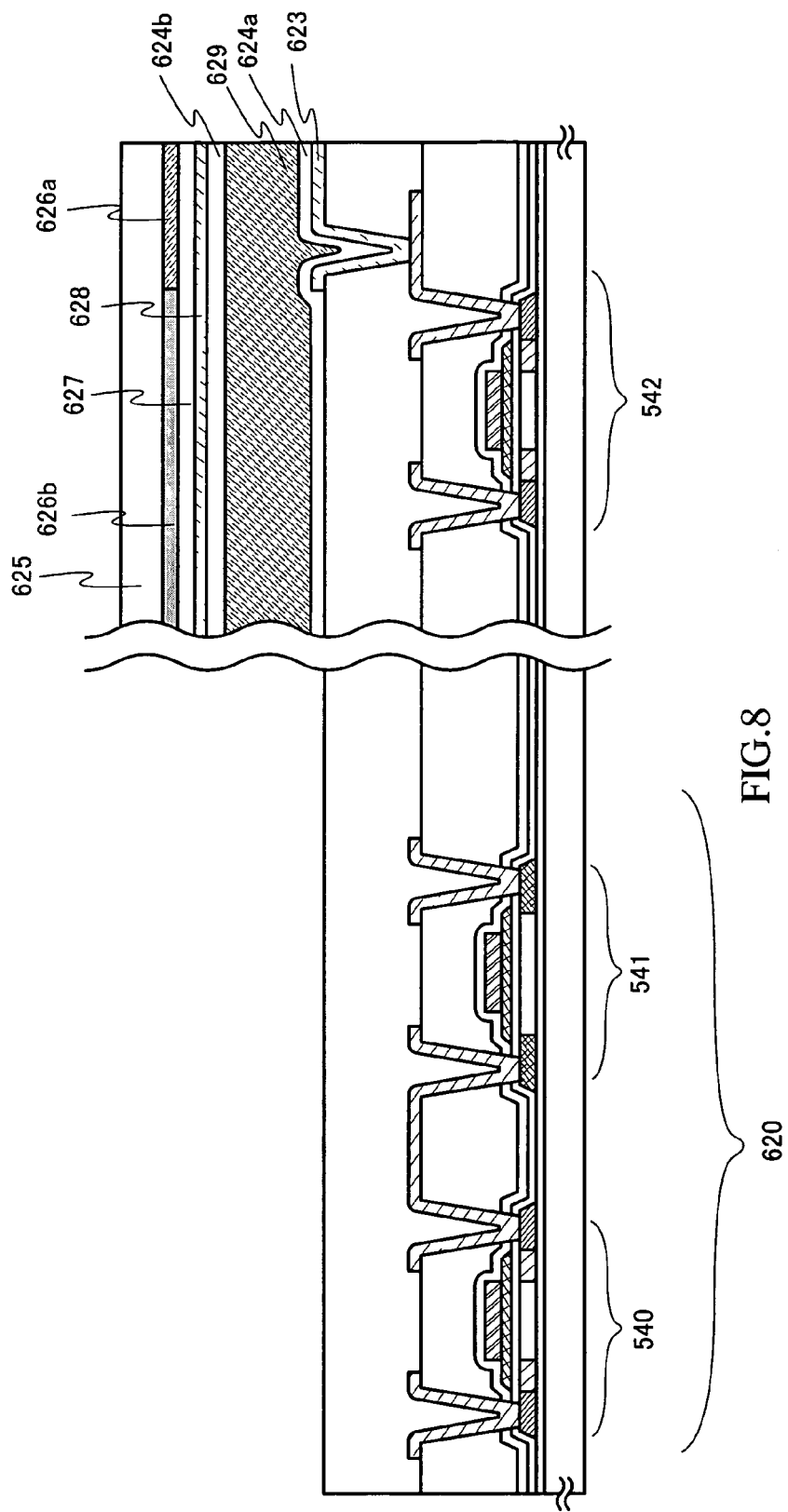
FIG. 8 A drawing for showing a step of manufacturing a liquid crystal display device according to the present invention.
Figure 9:
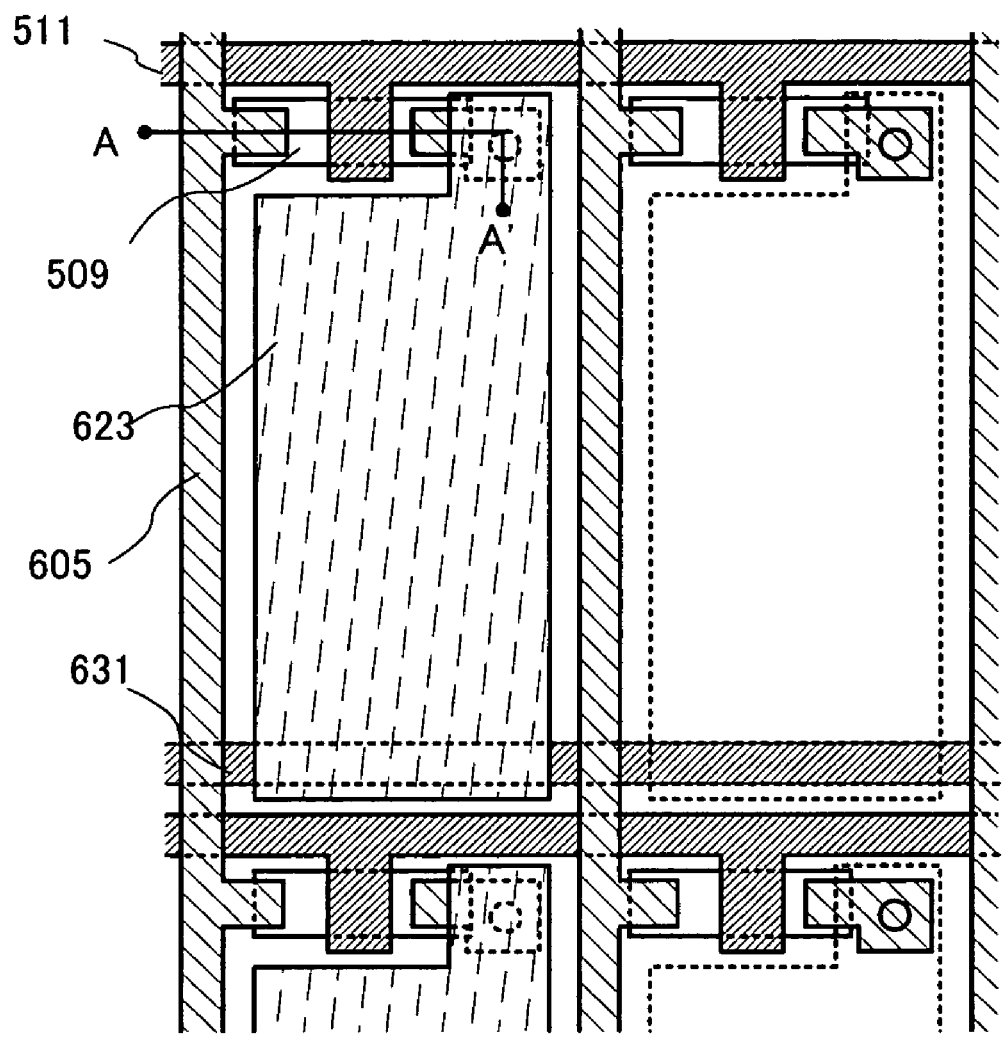
FIG. 9 A drawing for showing a pixel in a liquid crystal display device according to the present invention.
Figure 10A:
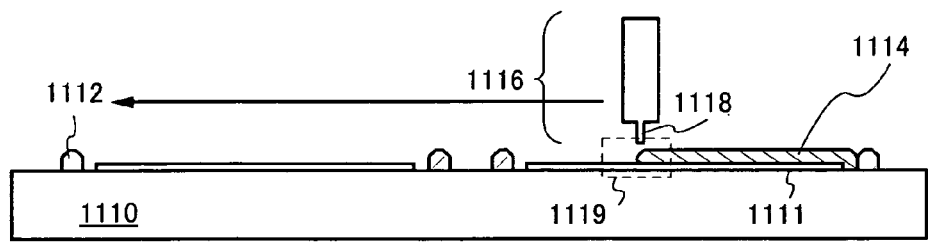
FIG. 10 Drawings for showing steps of manufacturing a liquid crystal display device by a liquid crystal dropping method according to the present invention.
Figure 10B:
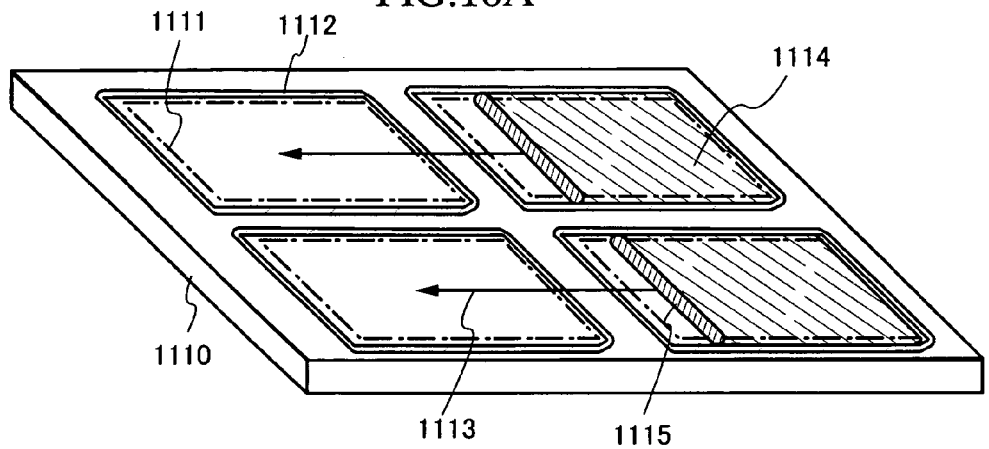
Figures 10C, 10D:
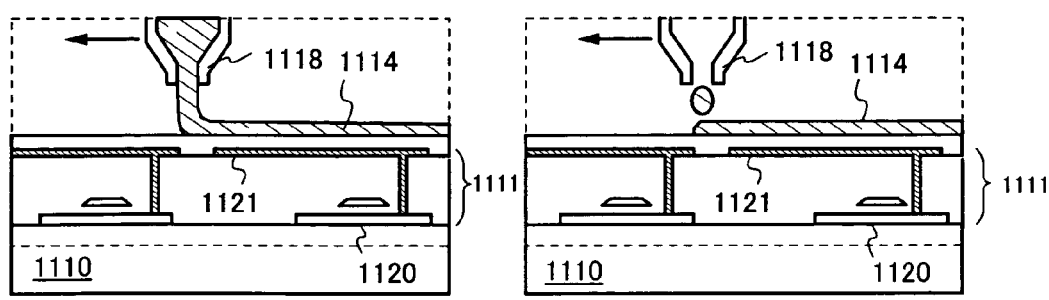
Figure 11A:
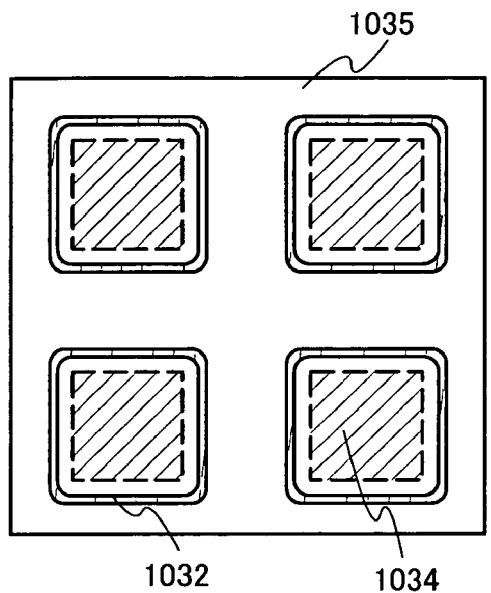
FIG. 11 Drawings for showing steps of manufacturing a liquid crystal display device by a liquid crystal dropping method according to the present invention.
Figure 11B:
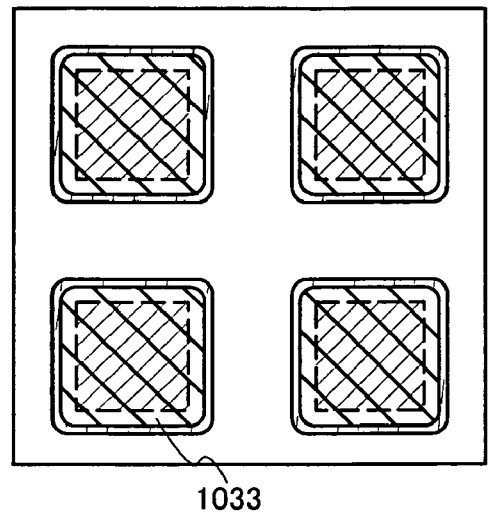
Figure 11C:
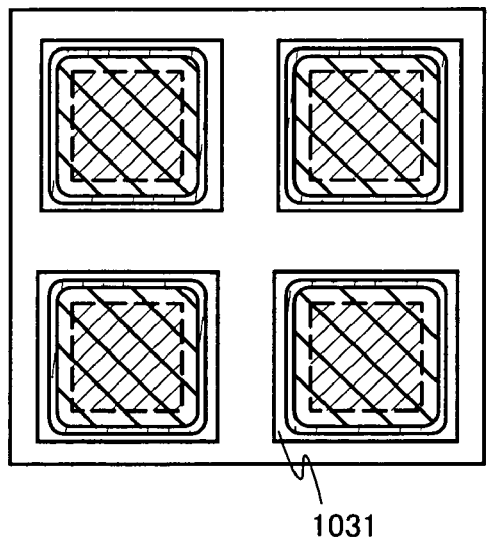
Figure 11D:
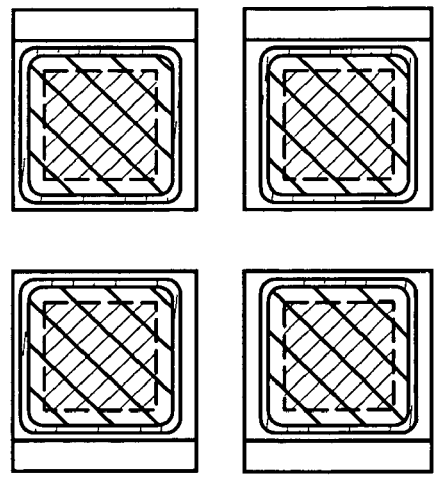
Figure 12A:
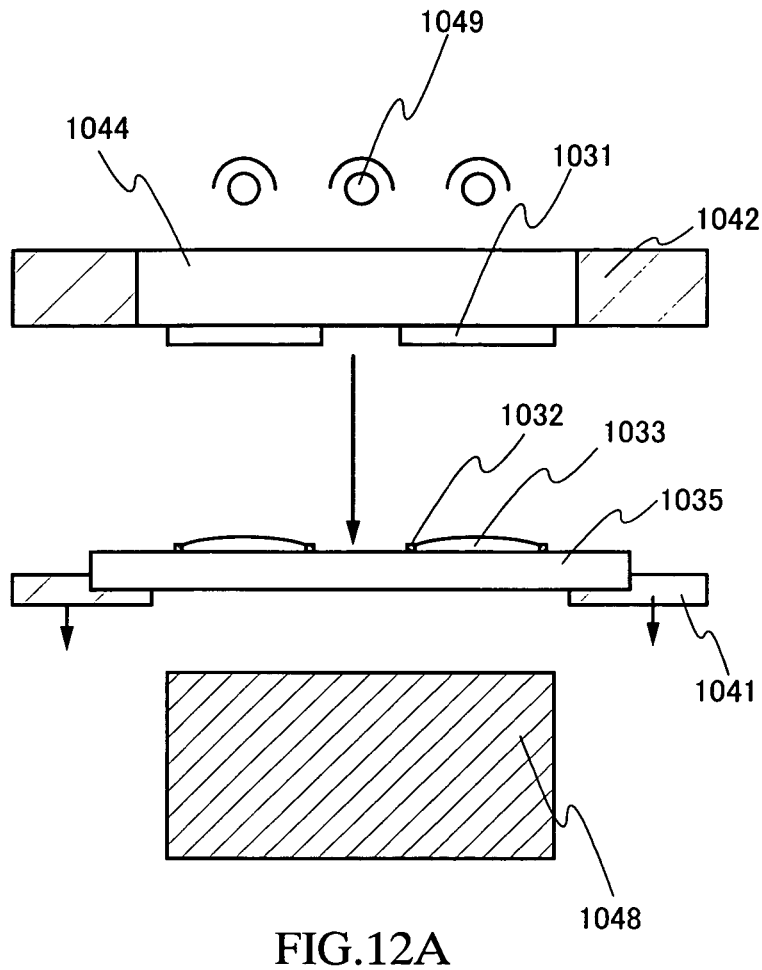
FIG. 12 Drawings for showing steps of manufacturing a liquid crystal display device by a liquid crystal dropping method according to the present invention.
Figure 12B:
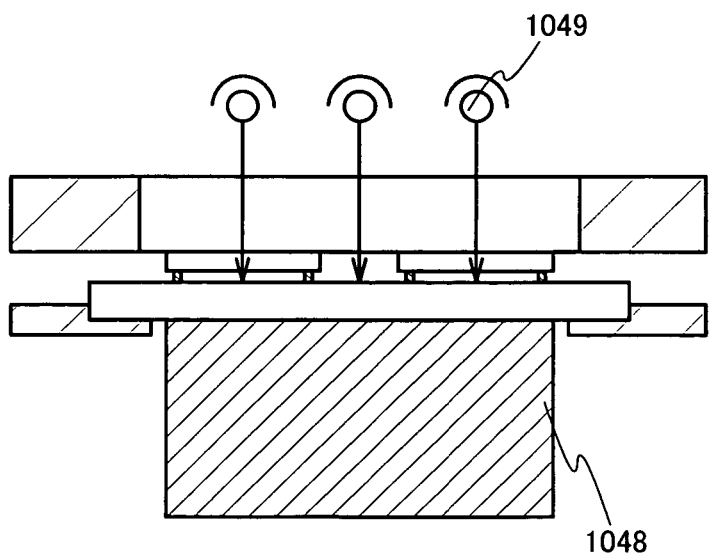
Figure 14A:
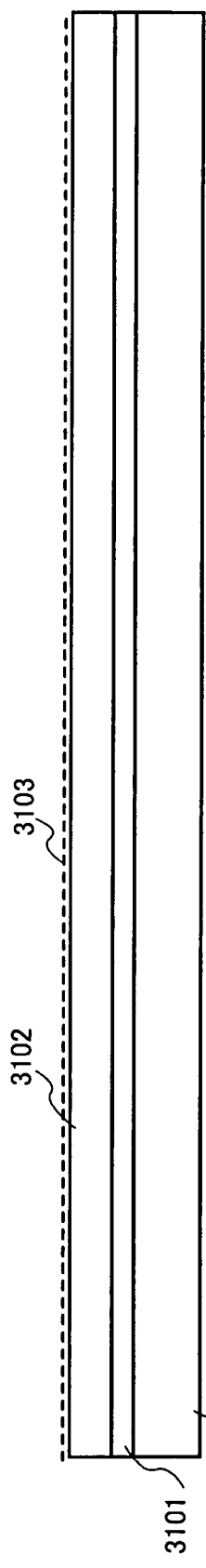
FIG. 14 Drawings for showing steps of manufacturing a CPU according to the present invention.
Figure 14B:
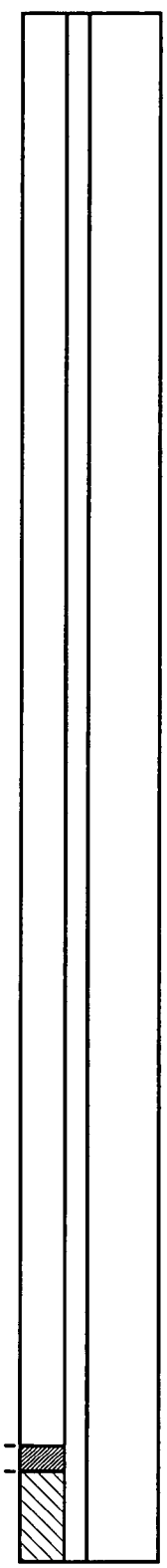
Figure 14C:
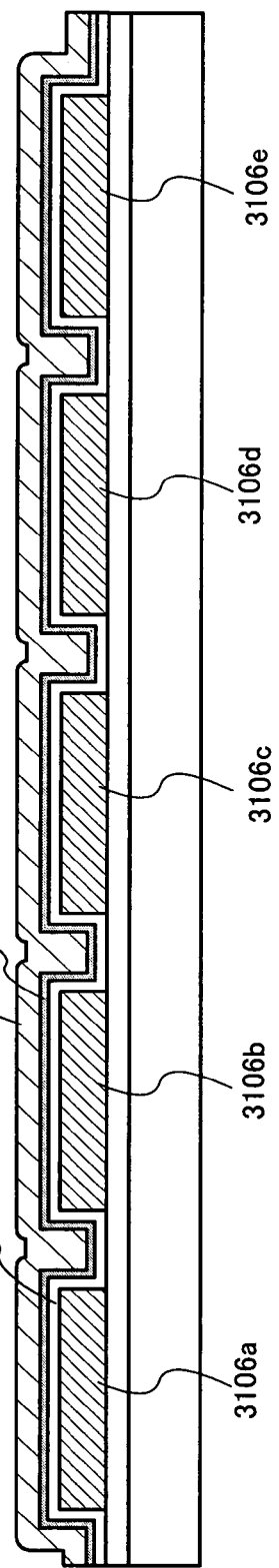
Figure 15A:
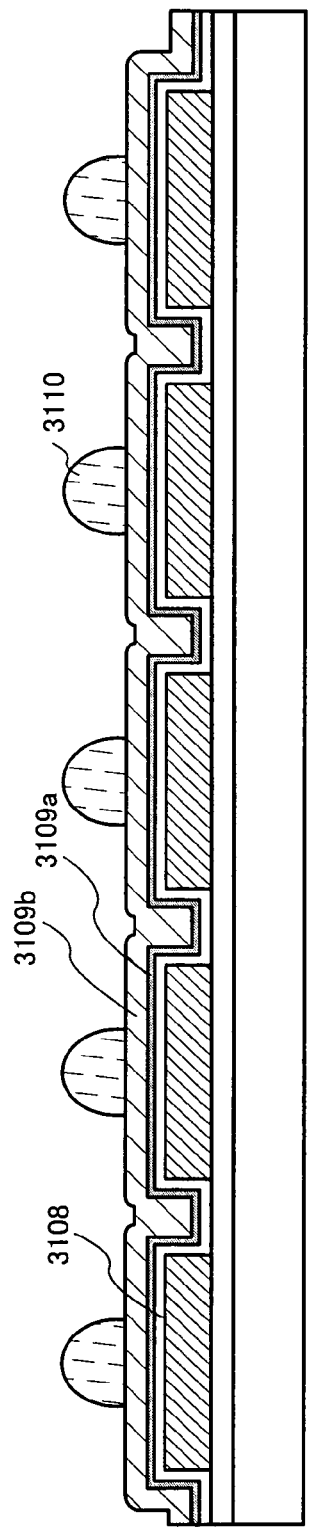
FIG. 15 Drawings for showing steps of manufacturing a CPU according to the present invention.
Figure 15B:
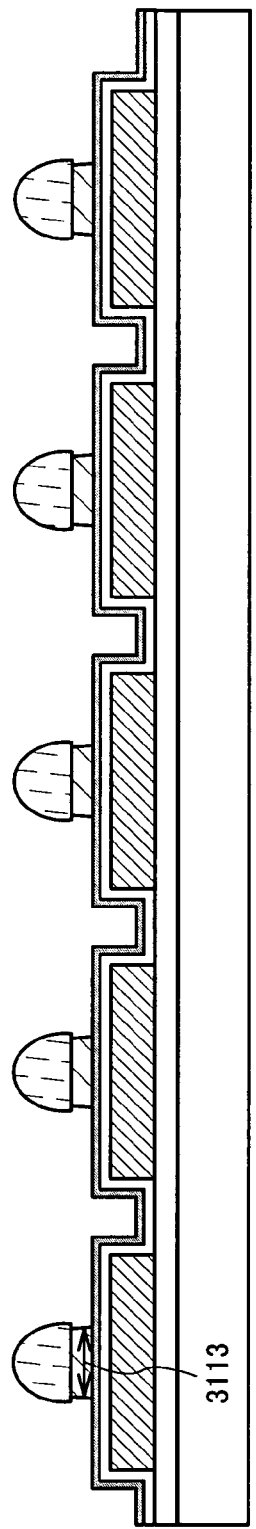
Figure 15C:
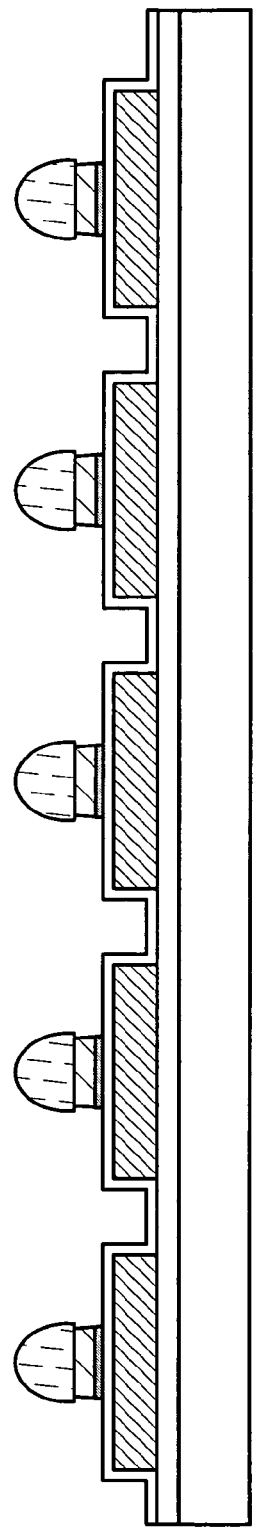
Figure 17A:
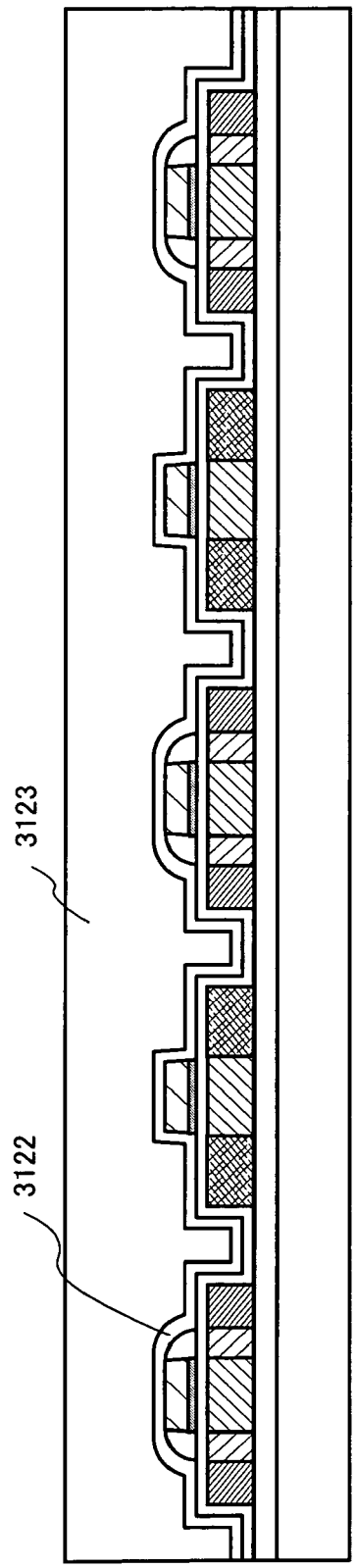
FIG. 17 Drawings for showing steps of manufacturing a CPU according to the present invention.
Figure 17B:
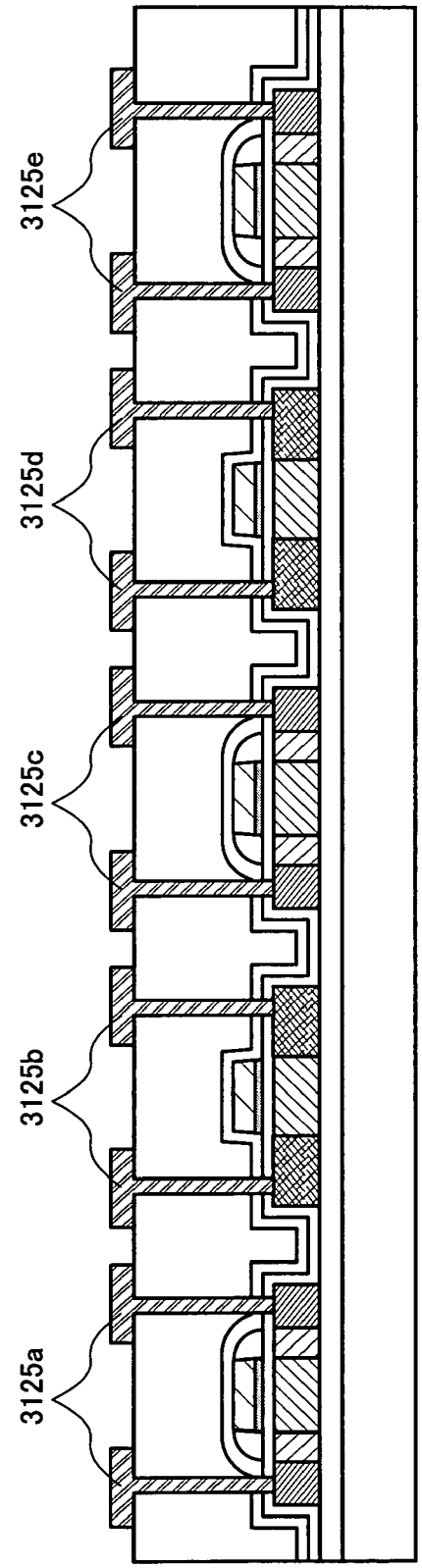
Figure 18:
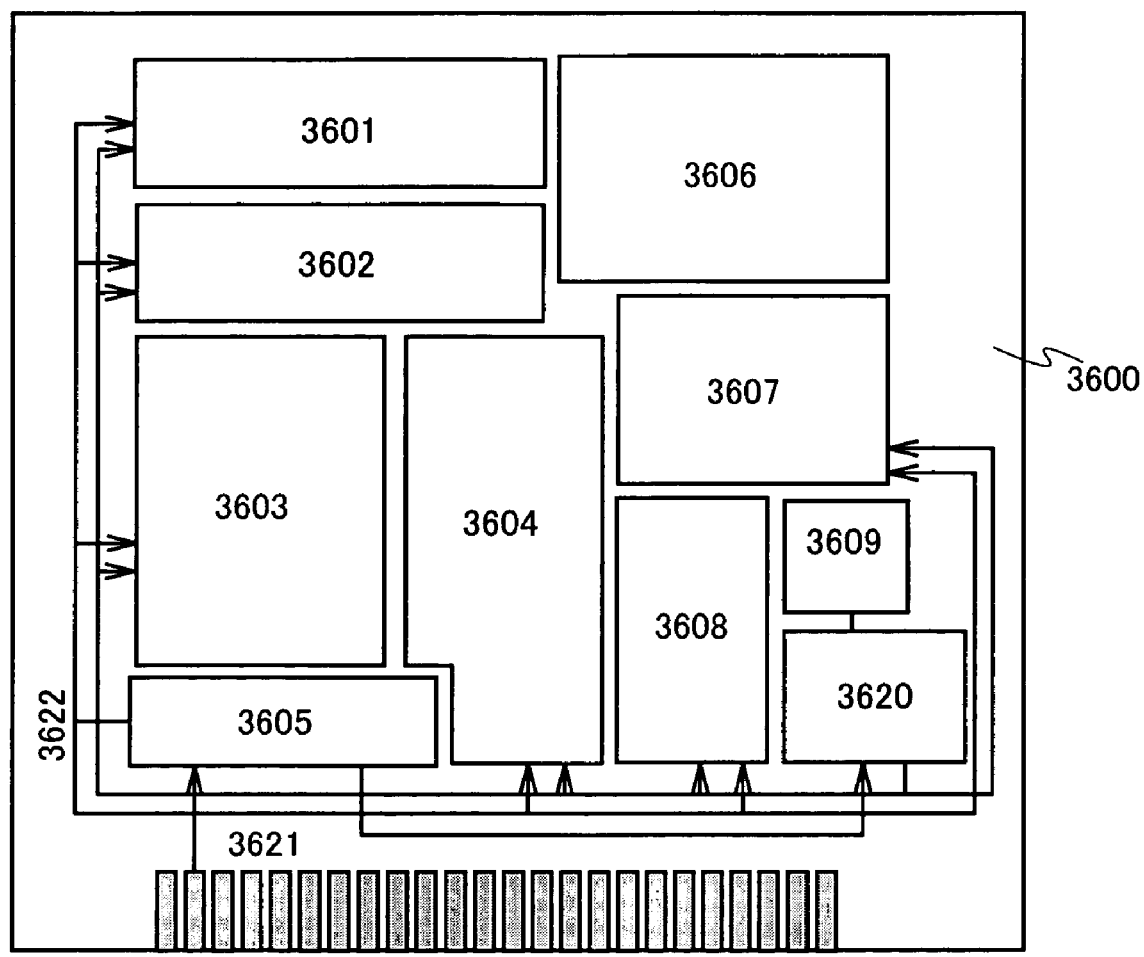
FIG. 18 A top view of a CPU according to the present invention.
Figure 20A:
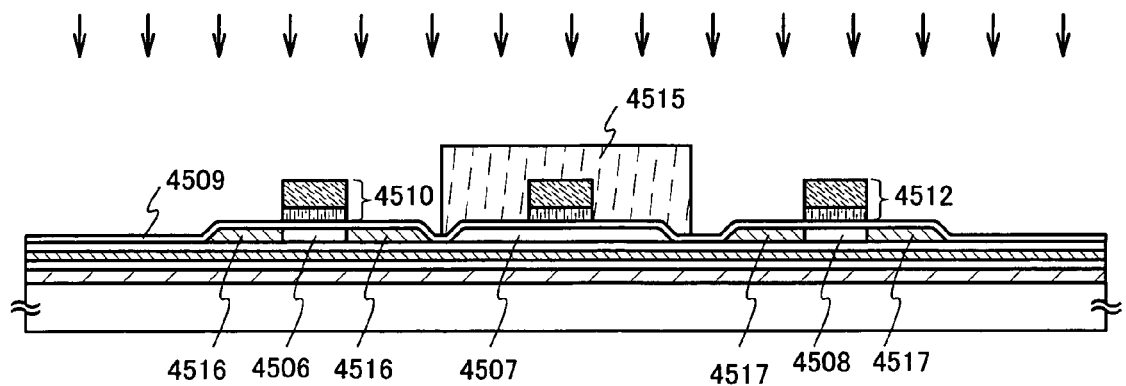
FIG. 20 Drawings for showing steps of manufacturing an ID chip according to the present invention.
Figure 20B:
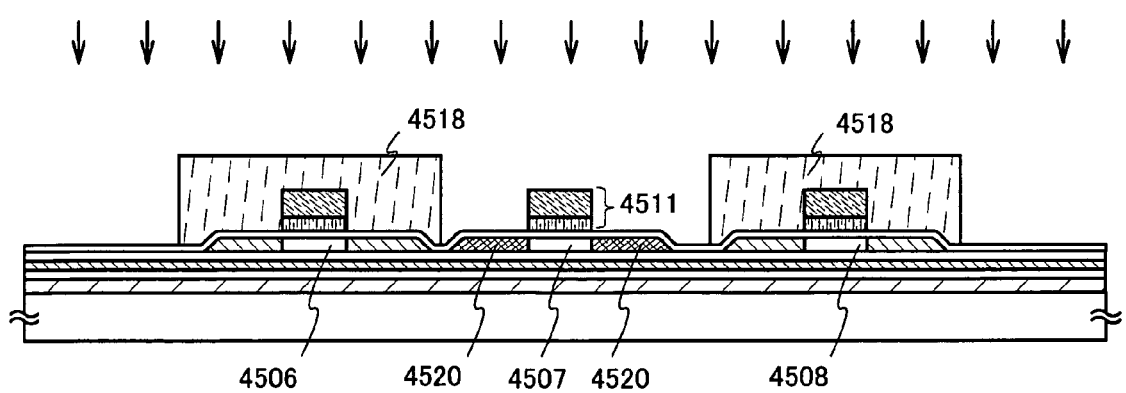
Figure 21A:
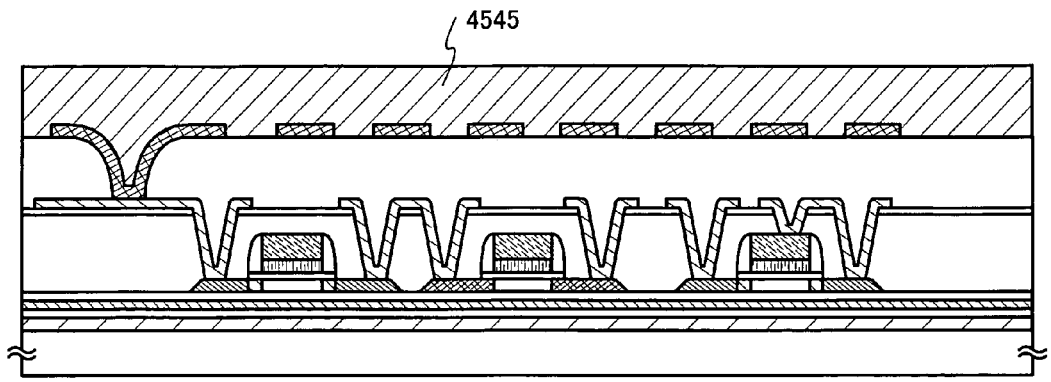
FIG. 21 Drawings for showing steps of manufacturing an ID chip according to the present invention.
Figure 21B:
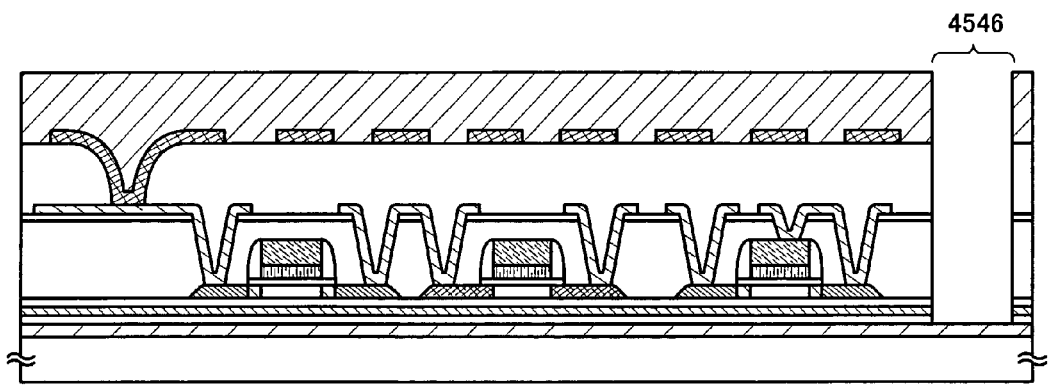
Figure 21C:
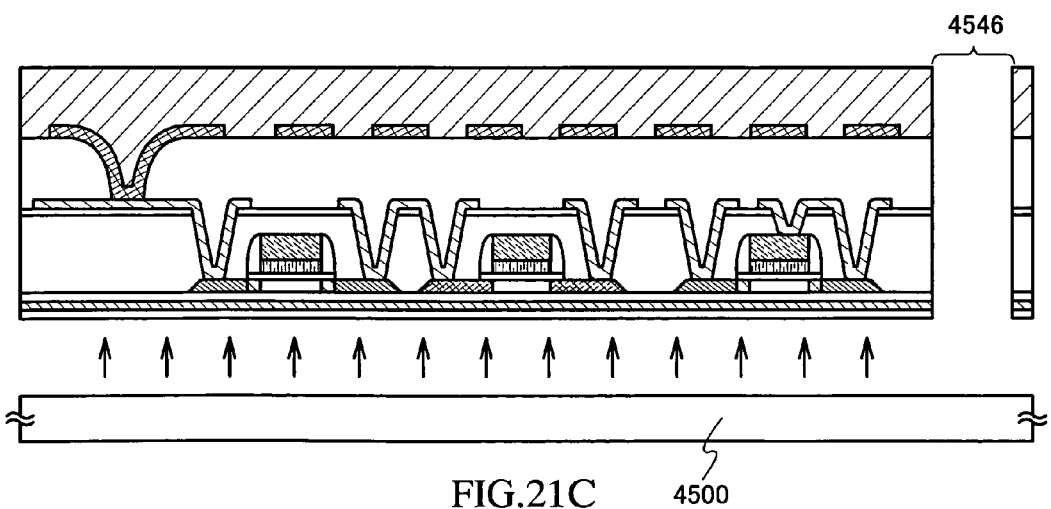
Figure 22A:
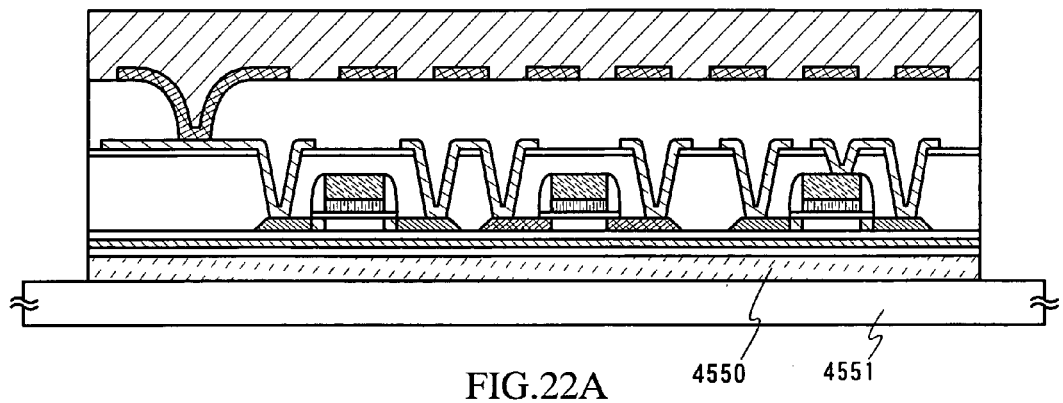
FIG. 22 Drawings for showing steps of manufacturing an ID chip according to the present invention.
Figure 22B:
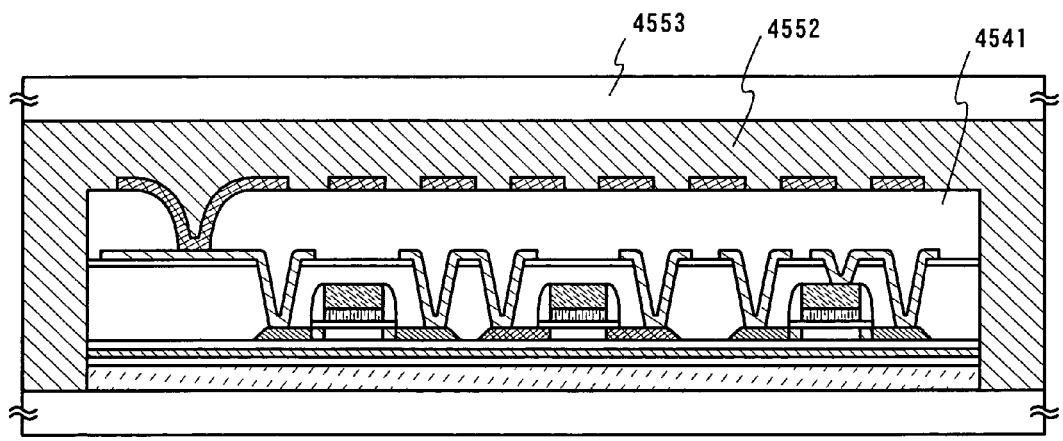
Figure 24A:
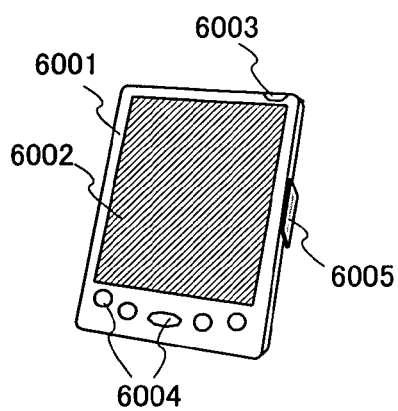
FIG. 24 Drawings for showing examples of electric appliances to which the present invention is applied.
Figure 24B:
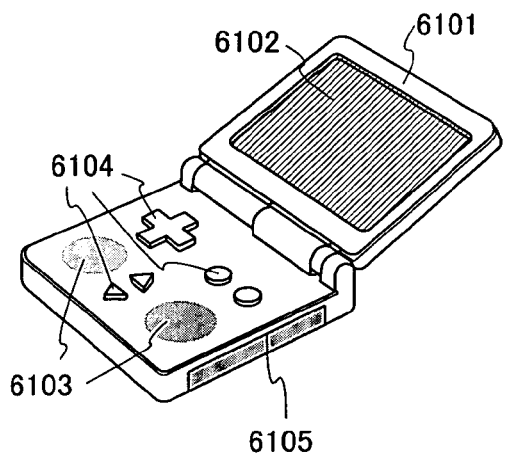
Figure 24C:
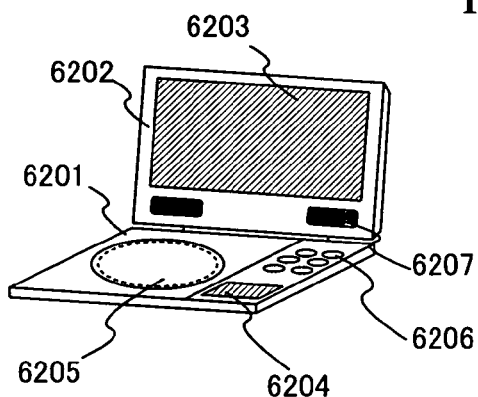
Figure 24D:
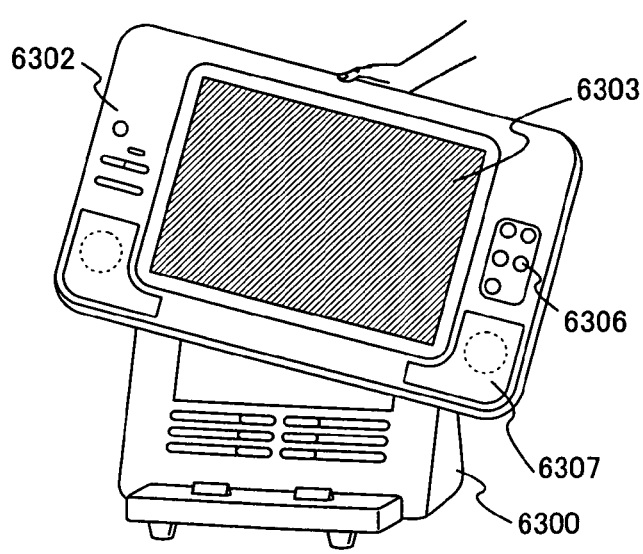
Figure 25:
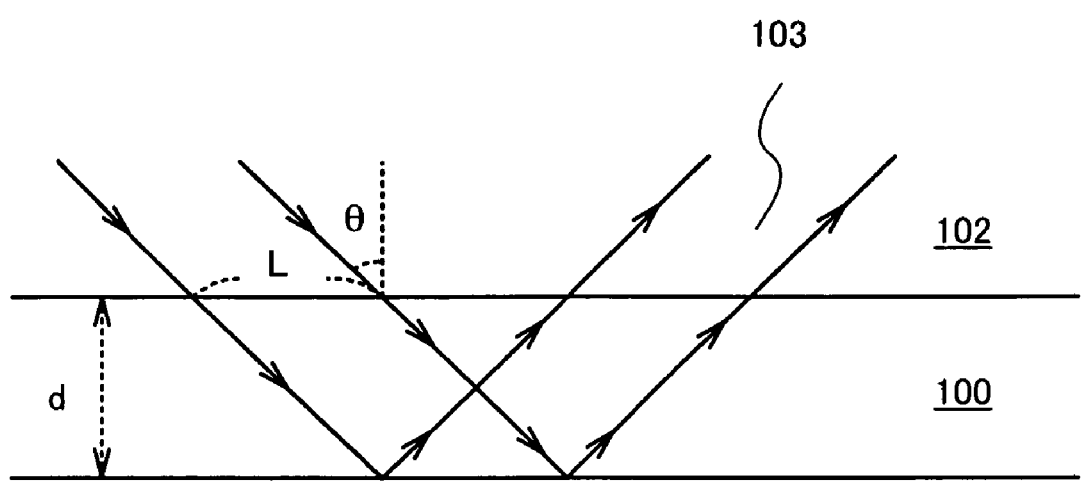
FIG. 25 A drawing for showing the relation among the incidence angle of a laser beam, the length of a linear laser beam in a minor-axis direction, and the thickness of a substrate according to the present invention.
Figure 26A:
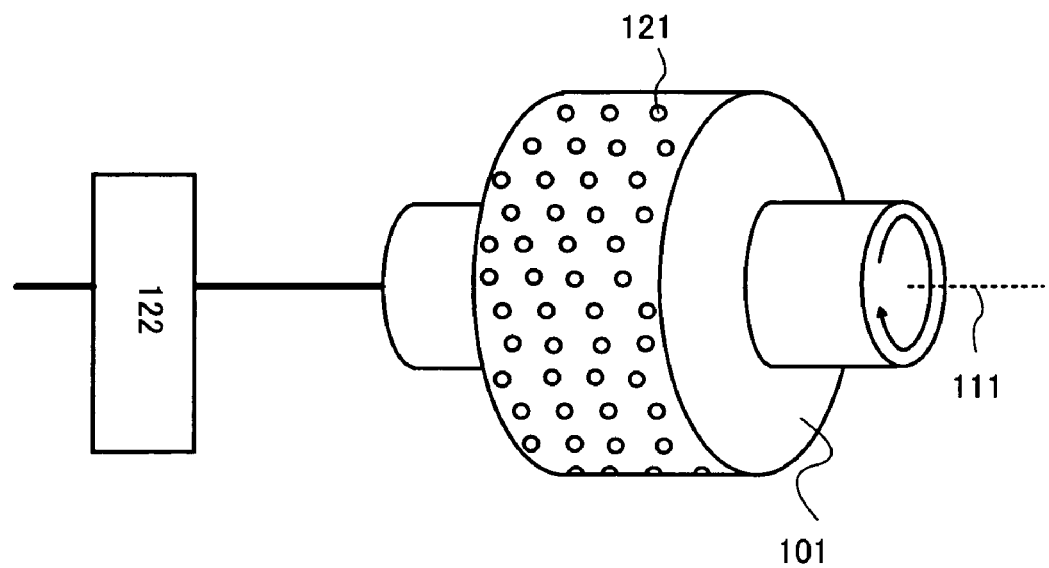
FIG. 26 Drawings for showing a laser process apparatus according to the present invention.
Figure 26B:
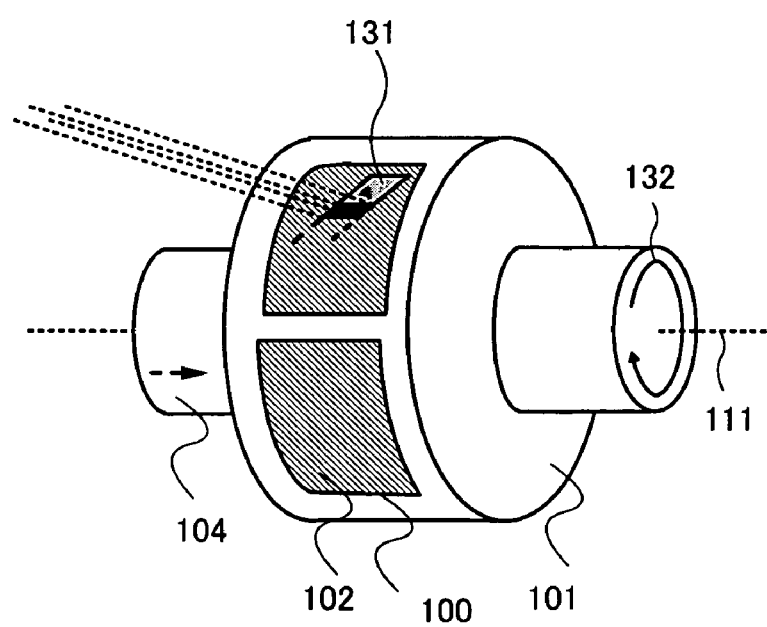
Figure 27:
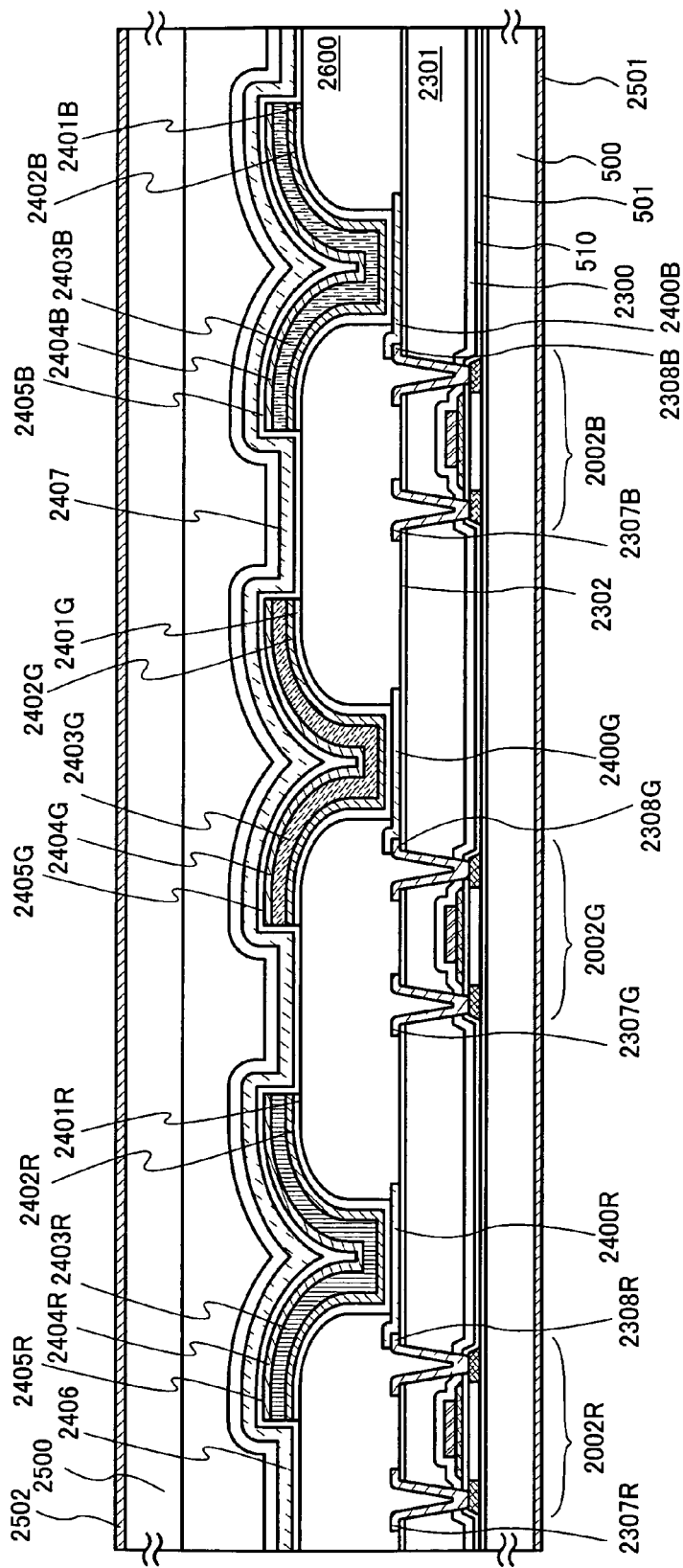
FIG. 27 A drawing for showing a step of manufacturing an EL display device according to the present invention.
Figure 28A:
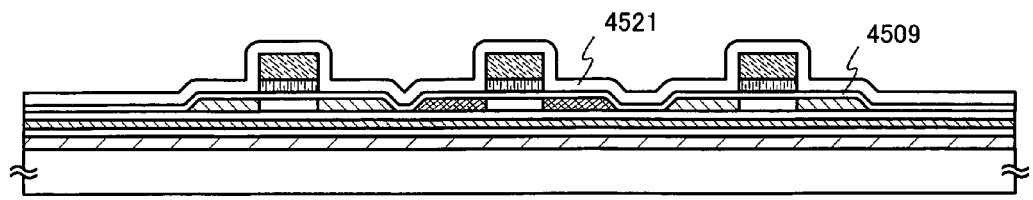
FIG. 28 Drawings for showing steps of manufacturing an ID chip according to the present invention.
Figure 28B:
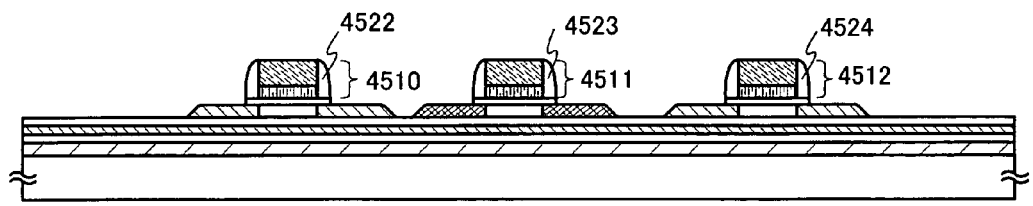
Figure 28C:
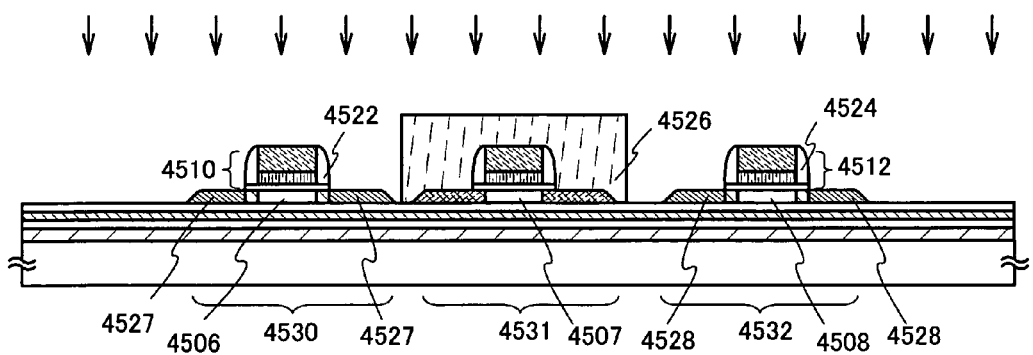
Figure 29A:
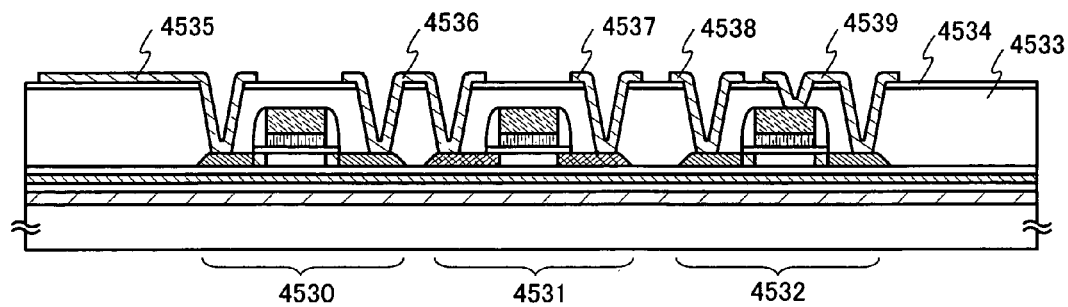
FIG. 29 Drawings for showing steps of manufacturing an ID chip according to the present invention.
Figure 29B:
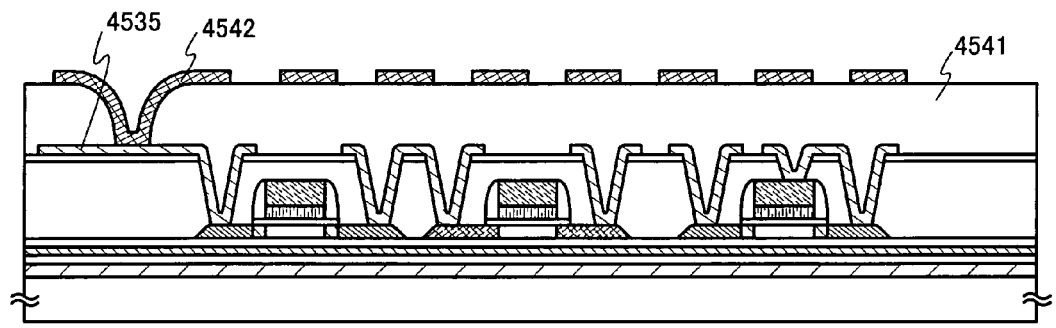
Figure 30A:
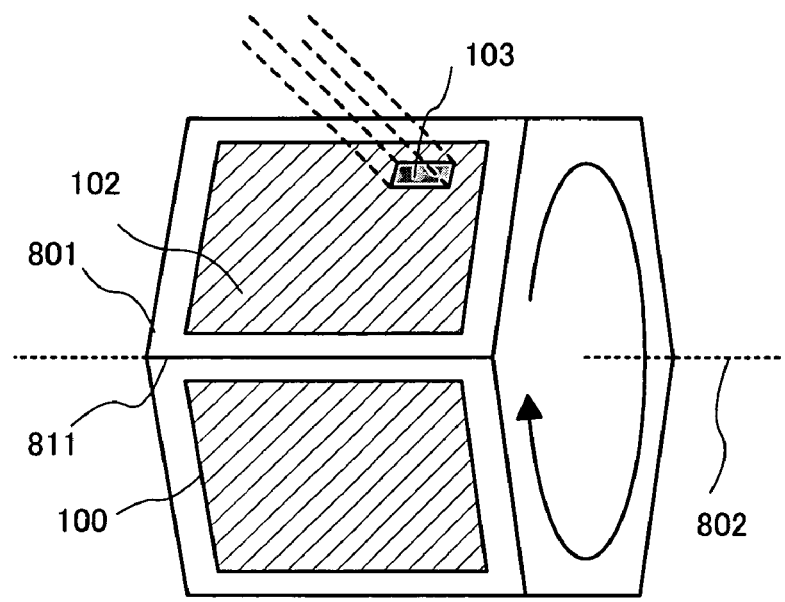
FIG. 30 Drawings for showing a laser process apparatus of the present invention.
Figure 30B:
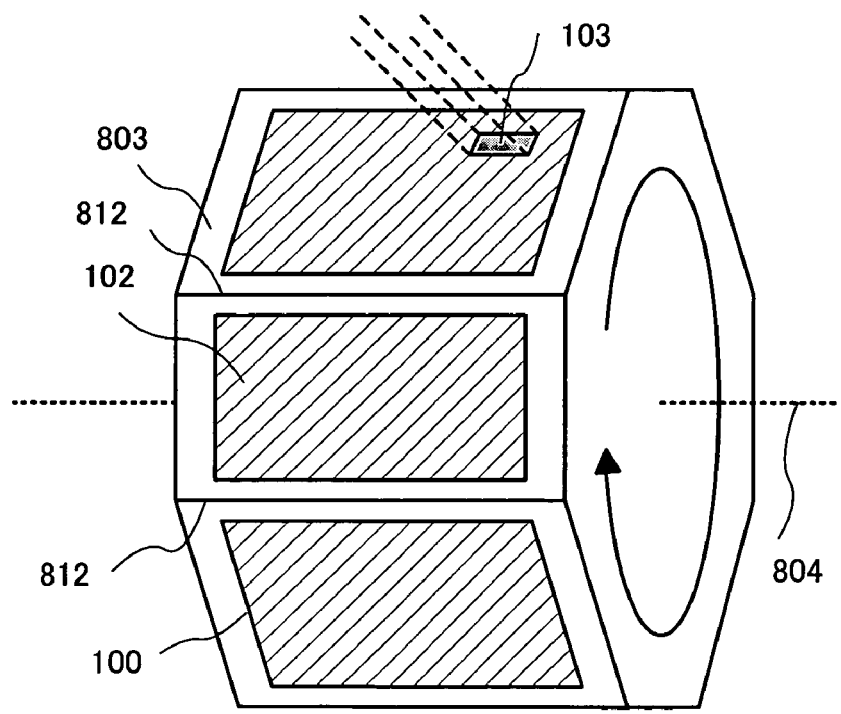

The invention claimed is:

1. A laser irradiation method comprising:
   fixing a substrate onto a curved surface of a rotator having a rotational axis;
   irradiating a surface of the substrate with a linear laser beam while rotating the rotator with the substrate fixed thereto; and
   moving a relative position between an irradiation position of the linear laser beam and the rotational axis of the rotator at each rotation of the rotator.

2. A laser irradiation method comprising:
   fixing a substrate onto a curved surface of a rotator having a rotational axis;
   irradiating a surface of the substrate with a linear laser beam while rotating the rotator with the substrate fixed thereto; and
   moving a relative position between an irradiation position of the linear laser beam and the rotational axis of the rotator while the rotator is rotated.

3. The laser irradiation method according to claim 1, wherein a plurality of the substrates are fixed to the curved surface of the rotator.

4. The laser irradiation method according to claim 1, wherein a continuous wave laser beam or a pulsed laser beam with a repetition rate of 10 MHz or more is shaped into the linear laser beam.

5. The laser irradiation method according to claim 1,
   wherein a continuous wave laser beam or a pulsed laser beam with a repetition rate of 80 MHz or more is shaped into the linear laser beam.

6. The laser irradiation method according to claim 4, wherein the continuous wave laser is any one of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, and a helium-cadmium laser.

7. The laser irradiation method according to claim 4, wherein the pulsed laser is any one of an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, and a gold vapor laser.

8. The laser irradiation method according to claim 1,
   wherein the substrate is a glass substrate or a substrate including synthetic resin.

9. A method for manufacturing a semiconductor device comprising:
   forming a semiconductor film over a substrate;
   fixing the substrate with the semiconductor film formed thereover to a curved surface of a rotator having a rotational axis; and
   irradiating the semiconductor film with a linear laser beam while rotating the rotator with the substrate fixed thereto.

10. A method for manufacturing a semiconductor device comprising:
    forming an amorphous semiconductor film over a substrate;
    fixing the substrate with the amorphous semiconductor film formed thereover to a curved surface of a rotator having a rotational axis; and
    crystallizing the amorphous semiconductor film to form a crystalline semiconductor film in such a way that the amorphous semiconductor film is irradiated with a linear laser beam while rotating the rotator with the substrate fixed thereto.

11. The method for manufacturing a semiconductor device according to claim 10, further comprising:
    forming an island-shaped semiconductor film by patterning the crystalline semiconductor film;
    introducing an impurity imparting one conductivity into the island-shaped semiconductor film;
    fixing the substrate to the rotator after introducing the impurity; and
    activating the impurity by irradiating with a linear laser beam while rotating the rotator with the substrate fixed thereto.

12. The method for manufacturing a semiconductor device according to claim 10,
    wherein a plurality of the substrates are fixed to the curved surface of the rotator.

13. The method for manufacturing a semiconductor device according to claim 10,
    wherein a continuous wave laser beam or a pulsed laser beam with a repetition rate of 10 MHz or more is shaped into the linear laser beam.

14. The method for manufacturing a semiconductor device according to claim 10,
    wherein a continuous wave laser beam or a pulsed laser beam with a repetition rate of 80 MHz or more is shaped into the linear laser beam.

15. The method for manufacturing a semiconductor device according to claim 13,
    wherein the continuous wave laser is any one of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, and a helium-cadmium laser.

16. The method for manufacturing a semiconductor device according to claim 13,
    wherein the pulsed laser is any one of an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, and a gold vapor laser.

17. The method for manufacturing a semiconductor device according to claim 9,
    wherein the substrate is a glass substrate or a substrate including synthetic resin.

18. The laser irradiation method according to claim 2,
    wherein a plurality of the substrates are fixed to the curved surface of the rotator.

19. The laser irradiation method according to claim 2,
    wherein a continuous wave laser beam or a pulsed laser beam with a repetition rate of 10 MHz or more is shaped into the linear laser beam.

20. The laser irradiation method according to claim 2,
    wherein a continuous wave laser beam or a pulsed laser beam with a repetition rate of 80 MHz or more is shaped into the linear laser beam.

21. The laser irradiation method according to claim 19,
    wherein the continuous wave laser is any one of an Ar laser, a Kr laser, a $CO_2$ laser, a YAG laser, a $YVO_4$ laser, a YLF laser, a YAlO$_3$ laser, a GdVO$_4$ laser, a Y$_2$O$_3$ laser, a ruby laser, an alexandrite laser, a Ti:sapphire laser, and a helium-cadmium laser.

22. The laser irradiation method according to claim 19, wherein the pulsed laser is any one of an Ar laser, a Kr laser, an excimer laser, a CO$_2$ laser, a YAG laser, a Y$_2$O$_3$ laser, a YVO$_4$ laser, a YLF laser, a YAlO$_3$ laser, a GdVO$_4$ laser, a glass laser, a ruby laser, an alexandrite laser, a Ti:sapphire laser, a copper vapor laser, and a gold vapor laser.

23. The laser irradiation method according to claim 2, wherein the substrate is a glass substrate or a substrate including synthetic resin.

24. The method for manufacturing a semiconductor device according to claim 10,
wherein a plurality of the substrates are fixed to the curved surface of the rotator.

25. The method for manufacturing a semiconductor device according to claim 10,
wherein a continuous wave laser beam or a pulsed laser beam with a repetition rate of 10 MHz or more is shaped into the linear laser beam.

26. The method for manufacturing a semiconductor device according to claim 10,
wherein a continuous wave laser beam or a pulsed laser beam with a repetition rate of 80 MHz or more is shaped into the linear laser beam.

27. The method for manufacturing a semiconductor device according to claim 25,
wherein the continuous wave laser is any one of an Ar laser, a Kr laser, a CO$_2$ laser, a YAG laser, a YVO$_4$ laser, a YLF laser, a YAlO$_3$ laser, a GdVO$_4$ laser, a Y$_2$O$_3$ laser, a ruby laser, an alexandrite laser, a Ti:sapphire laser, and a helium-cadmium laser.

28. The method for manufacturing a semiconductor device according to claim 25,
wherein the pulsed laser is any one of an Ar laser, a Kr laser, an excimer laser, a CO$_2$ laser, a YAG laser, a Y$_2$O$_3$ laser, a YVO$_4$ laser, a YLF laser, a YAlO$_3$ laser, a GdVO$_4$ laser, a glass laser, a ruby laser, an alexandrite laser, a Ti:sapphire laser, a copper vapor laser, and a gold vapor laser.

29. The method for manufacturing a semiconductor device according to claim 10,
wherein the substrate is a glass substrate or a substrate including synthetic resin.

* * * * *